United States Patent
Morris et al.

(10) Patent No.: US 11,521,543 B2
(45) Date of Patent: Dec. 6, 2022

(54) MACRO-PIXEL DISPLAY BACKPLANE

(71) Applicant: Meta Platforms Technologies, LLC, Menlo Park, CA (US)

(72) Inventors: Daniel Henry Morris, Palo Alto, CA (US); Michael Yee, Kirkland, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 17/129,554

(22) Filed: Dec. 21, 2020

(65) Prior Publication Data
US 2021/0201769 A1 Jul. 1, 2021

Related U.S. Application Data

(60) Provisional application No. 62/954,358, filed on Dec. 27, 2019.

(51) Int. Cl.
*G09G 3/32* (2016.01)
*H01L 27/15* (2006.01)

(52) U.S. Cl.
CPC .......... *G09G 3/32* (2013.01); *H01L 27/156* (2013.01); *G09G 2300/0857* (2013.01);
(Continued)

(58) Field of Classification Search
CPC ......... G09G 3/3266; G09G 2300/0861; G09G 2300/0819; G09G 2300/0426;
(Continued)

(56) References Cited

U.S. PATENT DOCUMENTS 10,804,207 B1* 10/2020 Goward ............... H01L 33/62
2011/0267362 A1 11/2011 Handschy et al.
(Continued)

FOREIGN PATENT DOCUMENTS

WO 2021134001 A1 7/2021

OTHER PUBLICATIONS

PCT Application No. PCT/US2020/066992, "Partial International Search Report and Provisional Opinion", dated Mar. 23, 2021, 31 pages.
(Continued)

*Primary Examiner* — Nitin Patel
*Assistant Examiner* — Amen W Bogale
(74) *Attorney, Agent, or Firm* — Weaver Austin Villeneuve & Sampson LLP

(57) ABSTRACT

A micro-light emitting diode (micro-LED) display backplane includes a plurality of macro-pixels. Each macro-pixel includes: a contiguous two-dimensional (2-D) array of bitcells storing display data bits for driving a set of micro-LEDs of a 2-D array of micro-LEDs; and drive circuits configured to generate, based on the display data bits stored in the contiguous 2-D array of bitcells, pulse-width modulated (PWM) drive signals for driving the set of micro-LEDs of the 2-D array of micro-LEDs. In one example, the plurality of macro-pixels is grouped into a plurality of sub-arrays, where each sub-array of the plurality of sub-arrays includes a set of macro-pixels and a local periphery circuit next to the set of macro-pixels. The local periphery circuit includes, for example, a buffer, a repeater, a clock gating circuit for gating an input clock signal to the sub-array, and/or a sub-array decoder for selecting the sub-array.

39 Claims, 33 Drawing Sheets

(52) U.S. Cl.
CPC ............... *G09G 2310/0291* (2013.01); *G09G 2320/0276* (2013.01); *G09G 2320/0285* (2013.01); *G09G 2320/0673* (2013.01)

(58) Field of Classification Search
CPC ... G09G 2300/0465; G09G 2300/0852; G09G 2300/0804; G09G 2310/021; G09G 2310/0262; G09G 2310/0218; G09G 2330/021
See application file for complete search history.

(56) References Cited

U.S. PATENT DOCUMENTS

| | | | | |
|---|---|---|---|---|
| 2017/0025399 | A1* | 1/2017 | Takeya | H01L 33/38 |
| 2018/0197471 | A1* | 7/2018 | Rotzoll | H01L 25/0753 |
| 2018/0211582 | A1* | 7/2018 | Sakariya | G09G 3/2088 |
| 2018/0240409 | A1* | 8/2018 | Li | G09G 3/3283 |
| 2021/0065614 | A1* | 3/2021 | Kim | G09G 3/32 |
| 2021/0166618 | A1* | 6/2021 | Baumheinrich | G09G 3/2081 |
| 2021/0251066 | A1* | 8/2021 | Bonne | H05B 47/18 |
| 2021/0256898 | A1* | 8/2021 | Kim | G09G 3/2014 |
| 2022/0102583 | A1* | 3/2022 | Baumheinrich | H01L 27/156 |

OTHER PUBLICATIONS

PCT Application No. PCT/US2019/046517, "International Search Report and Written Opinion", dated May 17, 2021, 31 pages.
Mauck, et al., "A Design for Test Techniques for Parametric Analysis of SRAM: On-Die Low Yield Analysis", ITC International Test Conference, 2004, pp. 105-113, 0-7803-8580-2/04.

\* cited by examiner

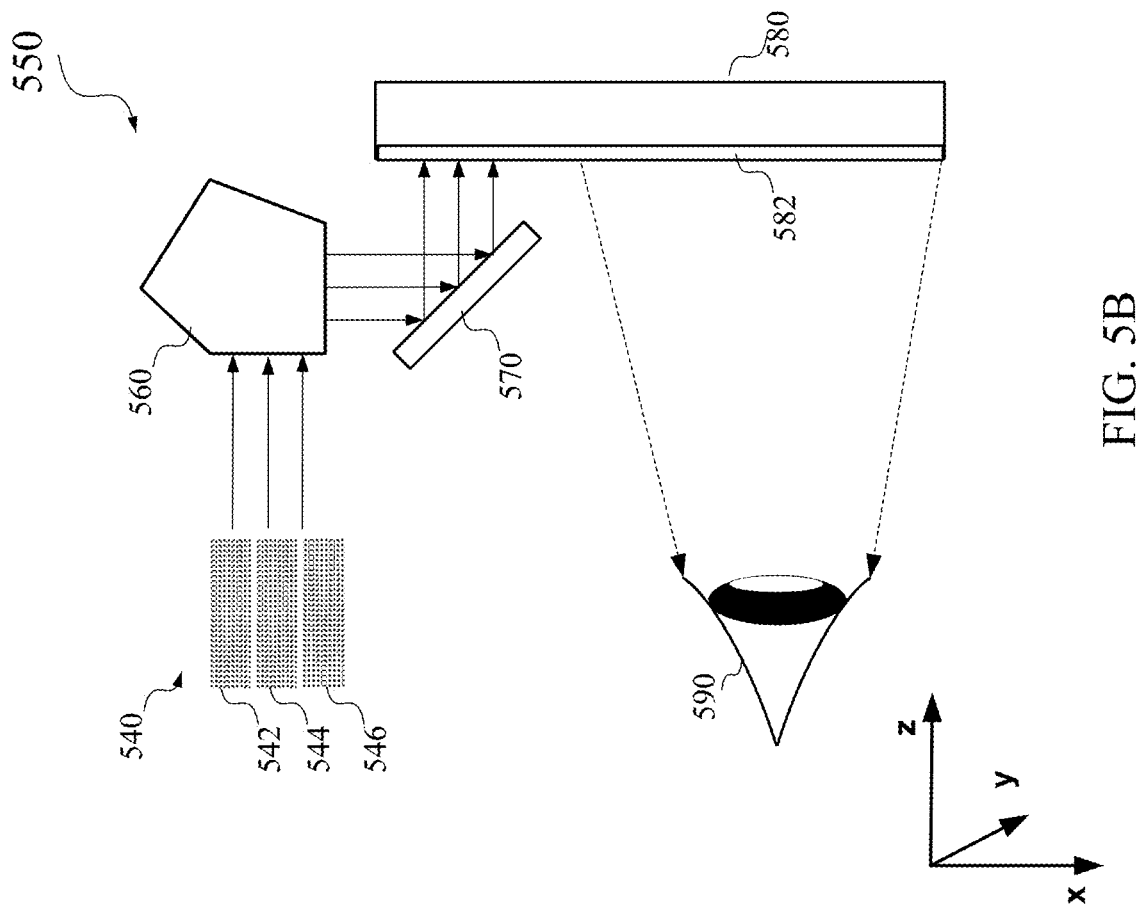
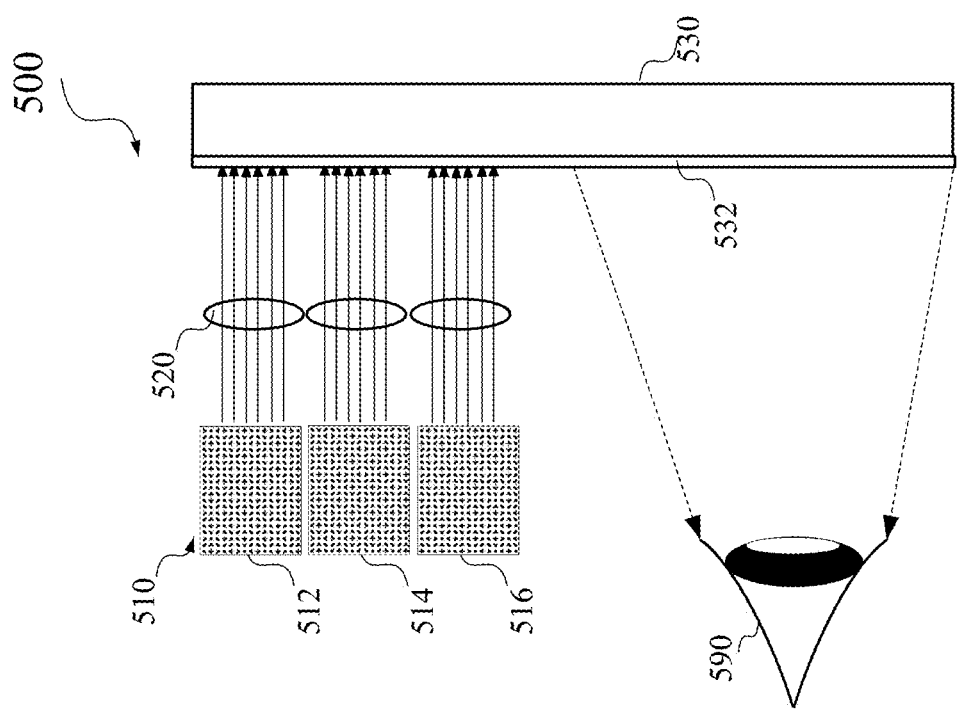
FIG. 5B
FIG. 5A

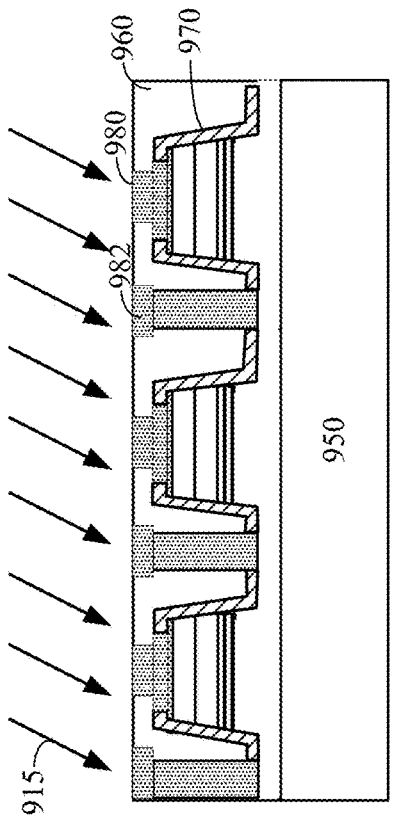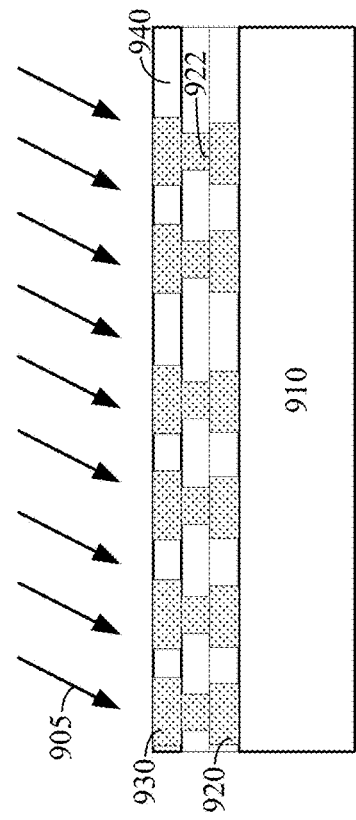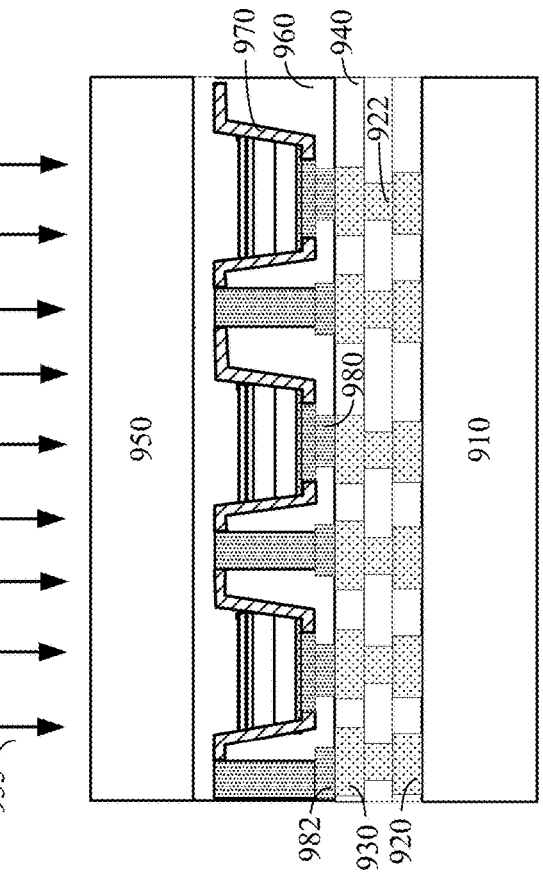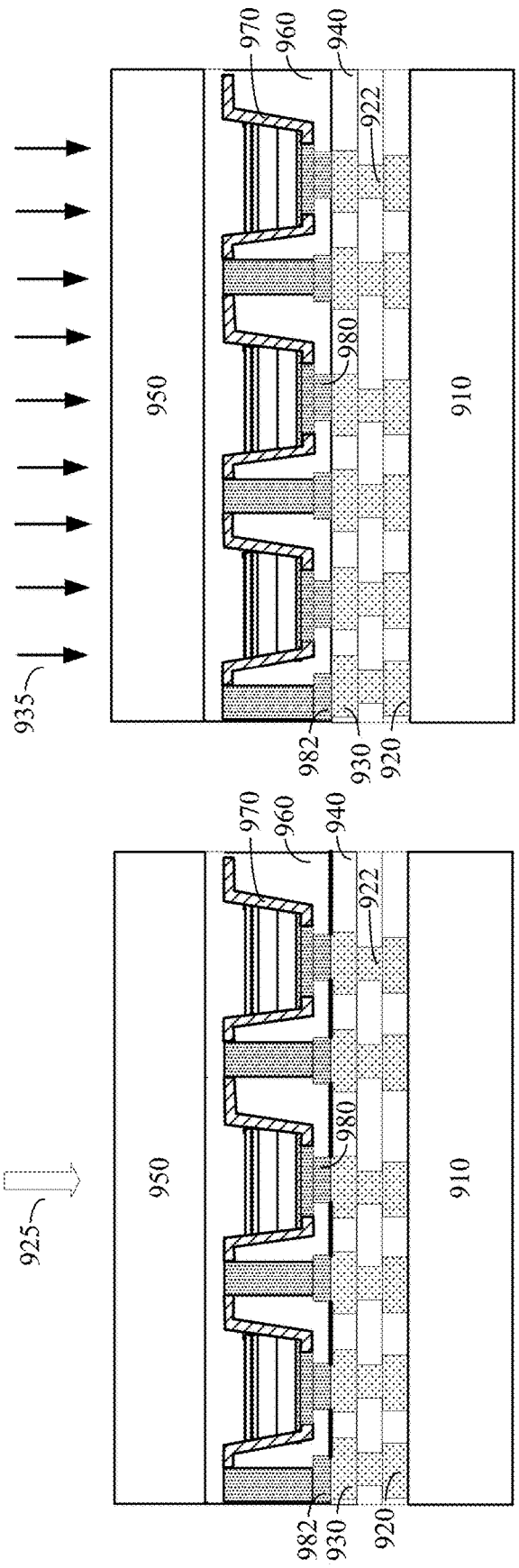

MACRO-PIXEL DISPLAY BACKPLANE

CROSS-REFERENCE TO RELATED APPLICATION

This patent application claims benefit of and priority to U.S. Provisional Patent Application Ser. No. 62/954,358, filed Dec. 27, 2019, entitled "Macro-Pixel Display Backplane," which is assigned to the assignee hereof and is hereby incorporated by reference in its entirety for all purposes.

BACKGROUND

An artificial reality system, such as a head-mounted display (HMD) or heads-up display (HUD) system, generally includes a near-eye display system in the form of a headset or a pair of glasses. The artificial reality system may be configured to present content to a user via an electronic or optic display within, for example, about 10 to 20 mm in front of the user's eyes. The near-eye display system may display virtual objects or combine images of real objects with virtual objects, as in virtual reality (VR), augmented reality (AR), or mixed reality (MR) applications. For example, in an AR system, a user may view images of virtual objects (e.g., computer-generated images (CGIs)) and the surrounding environment, for example, by seeing through transparent display glasses or lenses or by viewing displayed images of the surrounding environment captured by a camera. The near-eye display system may include one or more light sources that are driven to output light at various luminance levels to display the images.

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("µLEDs") based on III-V semiconductors, such as alloys of AlN, GaN, InN, AlGaInP, other quaternary phosphide compositions, and the like, have begun to be developed for various display applications due to their small size (e.g., with a linear dimension less than 100 µm, less than 50 µm, less than 10 µm, less than 5 µm, or less than 2 µm), high packing density (and hence higher resolution), and high brightness. For example, micro-LEDs that emit light of different colors (e.g., red, green, and blue) can be used to form the sub-pixels of a display system, such as a near-eye display system.

SUMMARY

This disclosure relates generally to display systems. More specifically, this disclosure relates to circuits for driving LED-based display panels. According to certain embodiments, a display device may include a two-dimensional (2-D) array of micro-light emitting diodes (micro-LEDs) in a display area, and a micro-LED driver backplane aligned with and bonded to the 2-D array of micro-LEDs. The micro-LED driver backplane may include a 2-D array of sub-arrays. Each sub-array of the 2-D array of sub-arrays may include drive circuits configured to generate pulse-width modulated (PWM) drive signals to drive a set of micro-LEDs of the 2-D array of micro-LEDs, and a local periphery circuit for controlling the drive circuits. The local periphery circuit is within the display area and may include, for example, at least one of a buffer, a repeater, a clock gating circuit for gating an input clock signal to the sub-array, or a sub-array decoder for selecting the sub-array. A pitch of the 2-D array of micro-LEDs may be equal to or less than, for example, about 2 µm.

In some embodiments of the display device, each sub-array of the 2-D array of sub-arrays may include an array of macro-pixels. Each macro-pixel of the array of macro-pixels may include a contiguous 2-D array of bitcells storing display data bits for driving a subset of micro-LEDs of the set of micro-LEDs. In some embodiments, each bitcell of the contiguous 2-D array of bitcells may include a six-transistor (6T) static random access memory (SRAM) cell that includes a world line, two bit lines, and two internal state storage nodes for storing a respective display data bit of the display data bits. Each bitcell of the contiguous 2-D array of bitcells may be configured to read the respective display data bit of the display data bits from the bitcell through the two bit lines.

In some embodiments, each macro-pixel of the array of macro-pixels may also include a respective current driver for each micro-LED in the subset of micro-LEDs and configured to provide a drive current to the micro-LED; a comparator configured to compare, for each micro-LED in the subset of micro-LEDs, the display data bits for driving the micro-LED with a counter value; and a respective PWM latch for each micro-LED in the subset of micro-LEDs. The respective PWM latch may be configured to generate, based on an output for the micro-LED generated by the comparator, a PWM control signal for modulating the drive current of the respective current driver for the micro-LED to generate a respective PWM drive signal of the PWM drive signals. The respective current drivers for two or more micro-LEDs in the subset of micro-LEDs may be arranged contiguously in a region of the macro-pixel that is separated from regions of the macro-pixel for other circuits by a transition region. The respective current drivers for the subset of micro-LEDs may be connected to the subset of micro-LEDs in the 2-D array of micro-LEDs by an interconnect layer that includes re-distribution routing interconnects. In some embodiments, the respective PWM latches for two or more micro-LEDs in the subset of micro-LEDs may be arranged contiguously in a region of the macro-pixel. In some embodiments, the comparator may be configured to read and compare the display data bits for driving a first micro-LED of the subset of micro-LEDs in a first time window, and read and compare the display data bits for driving a second micro-LED of the subset of micro-LEDs in a second time window.

In some embodiments, each macro-pixel of the array of macro-pixels may include a respective design-for-test (DFT) circuit for each micro-LED in the subset of micro-LEDs. In some embodiments, each macro-pixel of the array of macro-pixels may include a respective input/output circuit configured to read display data bits stored in each row or column of the contiguous 2-D array of bitcells. In some embodiments, the contiguous 2-D array of bitcells may include at least 6 bitcells for each micro-LED of the subset of micro-LEDs. The subset of micro-LEDs may include, for example, 8 or more micro-LEDs.

In some embodiments, a plurality of sub-arrays in the 2-D array of sub-arrays may be included in a slice of the micro-LED driver backplane, the slice comprising a slice periphery circuit for controlling the plurality of sub-arrays. The slice periphery circuit may include at least one of a counter or a look-up table for gamma correction.

In some embodiments, the micro-LED driver backplane may include a periphery circuit outside of the 2-D array of sub-arrays. The periphery circuit may include at least one of a counter or a look-up table for gamma correction. The look-up table may store display data codes and corresponding counter values. The corresponding counter value for at least one display data code in the look-up table may be different from an ideal counter value determined for the at least one display data code based on a gamma value. The repeater may be configured to replicate a control signal generated by the periphery circuit and for controlling the drive circuits of the sub-array. The periphery circuit may be configurable to send a control signal to the clock gating circuit for gating the input clock signal to the sub-array to disable the drive circuits configured to generate the PWM drive signals.

According to some embodiments, a micro-light emitting diode (micro-LED) display backplane may include a plurality of macro-pixels. Each macro-pixel of the plurality of macro-pixels may include a contiguous two-dimensional (2-D) array of bitcells storing display data bits for driving a set of micro-LEDs of a 2-D array of micro-LEDs, and drive circuits configured to generate, based on the display data bits stored in the contiguous 2-D array of bitcells, pulse-width modulated (PWM) drive signals for driving the set of micro-LEDs of the 2-D array of micro-LEDs.

In some embodiments, each bitcell of the contiguous 2-D array of bitcells may include a six-transistor (6T) static random access memory (SRAM) cell that includes a world line, two bit lines, and two internal state storage nodes for storing a respective display data bit of the display data bits. Each bitcell of the contiguous 2-D array of bitcells may be configured to read the respective display data bit of the display data bits from the bitcell through the two bit lines.

In some embodiments, each macro-pixel of the plurality of macro-pixels may include a respective current driver for each micro-LED in the set of micro-LEDs and configured to provide a drive current to the micro-LED; a comparator configured to compare, for each micro-LED in the set of micro-LEDs, the display data bits for driving the micro-LED with a counter value; and a respective PWM latch for each micro-LED in the set of micro-LEDs. The respective PWM latch may be configured to generate, based on an output for the micro-LED generated by the comparator, a PWM control signal for modulating the drive current of the respective current driver for the micro-LED to generate a respective PWM drive signal of the PWM drive signals. The respective current drivers for two or more micro-LEDs in the set of micro-LEDs may be arranged contiguously in a region of the macro-pixel separated from regions of the macro-pixel for other circuits by a transition region. In some embodiments, the respective current driver for each micro-LED in the set of micro-LEDs may include a thick gate-oxide transistor with a channel length greater than about 400 nm. The drive currents of the respective current drivers of the plurality of macro-pixels may be characterized by a standard deviation less than about 20 nA. The respective PWM latches for two or more micro-LEDs in the set of micro-LEDs may be arranged contiguously in a region of the macro-pixel. The comparator may be configured to read and compare the display data bits for driving a first micro-LED of the set of micro-LEDs in a first time window, and read and compare the display data bits for driving a second micro-LED of the set of micro-LEDs in a second time window.

In some embodiments, each macro-pixel of the plurality of macro-pixels may include a respective design-for-test (DFT) circuit for each micro-LED in the set of micro-LEDs.

In some embodiments, each macro-pixel of the plurality of macro-pixels may include a respective input/output circuit configured to read display data bits stored in each row or column of the contiguous 2-D array of bitcells. The contiguous 2-D array of bitcells may include, for example, at least 6 bitcells for each micro-LED of the set of micro-LEDs. The set of micro-LEDs may include, for example, 8 or more micro-LEDs. A pitch of the set of micro-LEDs may be equal to or less than, for example, about 2 µm.

In some embodiments, the plurality of macro-pixels may be grouped into a plurality of sub-arrays, where each sub-array of the plurality of sub-arrays may include a set of macro-pixels and a local periphery circuit next to the set of macro-pixels. The local periphery circuit may include, for example, at least one of a buffer, a repeater, a clock gating circuit for gating an input clock signal to the sub-array, or a sub-array decoder for selecting the sub-array. The repeater may be configured to replicate a control signal for controlling the drive circuits of the set of macro-pixels in the sub-array. In some embodiments, the plurality of sub-arrays may be grouped into a plurality of slices, where each slice of the plurality of slices may include a set of sub-arrays and a slice periphery circuit next to the set of sub-arrays. The slice periphery circuit may include at least one of a counter or a look-up table for gamma correction, where the look-up table may store display data codes and corresponding counter values. In some embodiments, the corresponding counter value for at least one display data code in the look-up table may be different from an ideal counter value determined for the at least one display data code based on a gamma value. In some embodiments, the slice periphery circuit may include a calibration table for calibrating the drive circuits of the macro-pixels in the slice.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 5A illustrates an example of a near-eye display device including a waveguide display according to certain embodiments.

FIG. 5B illustrates an example of a near-eye display device including a waveguide display according to certain embodiments.

FIGS. 9A-9D illustrates an example of a method of hybrid bonding for arrays of LEDs according to certain embodiments.

Figure 1:
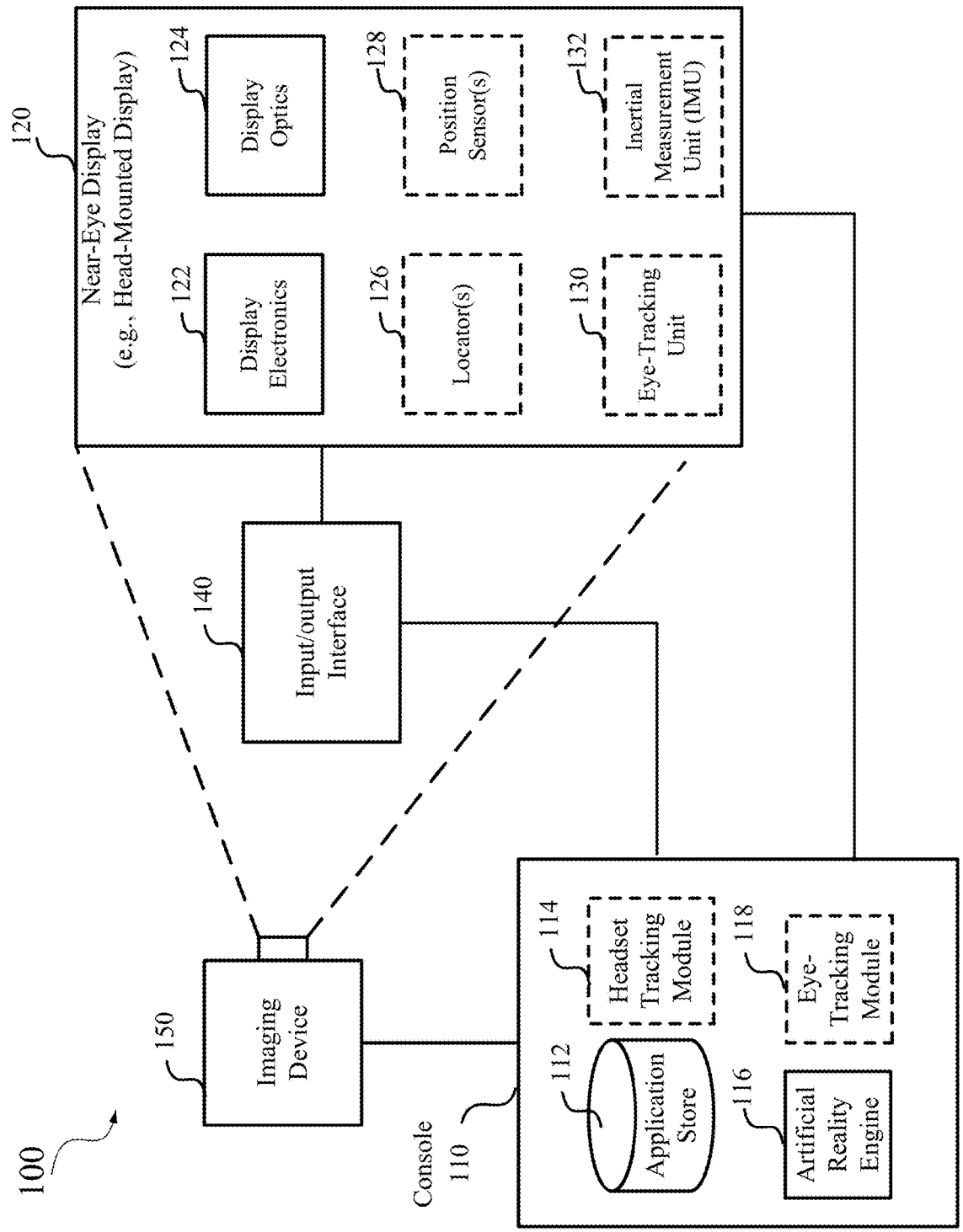
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to display systems. More specifically, and without limitation, disclosed herein are techniques for controlling operations of light emitting diodes (LEDs) in an LED-based display panel. Techniques disclosed herein can be used to improve display quality, reduce power consumption, improve manufacturability and testability, and improve uniformity in near-eye display systems, such as virtual reality (VR), augmented reality (AR), or mixed reality (MR) display systems. Various inventive embodiments are described herein, including devices, systems, modules, circuits, dies, wafers, packages, methods, materials, and the like.

In some LED-based displays, one or more two-dimensional (2-D) arrays of micro-LEDs ("µLEDs") may be used to display color images. Each 2-D array of micro-LEDs may include thousands or millions of micro-LEDs that can emit light of a same color (e.g., red, green, or blue) at desired intensities to generate an image, where each micro-LED may form a part of a color pixel and may (in combination with the corresponding driver circuit) be referred to herein as a pixel. Each 2-D array of micro-LEDs may be controlled by pixel array driving circuits such that the micro-LEDs may emit light at the desired intensities. The 2-D array of micro-LEDs may be fabricated on a III-V semiconductor substrate, while the pixel array driving circuits may be fabricated on a silicon substrate. To facilitate bonding and electrically connecting the 2-D array of micro-LEDs with the pixel array driving circuits and to avoid long interconnects, the pixel array driving circuits may need to have a pixel pitch matching the pixel pitch of the 2-D array of micro-LEDs, which may be, for example, less than about 20 µm, less than about 10 µm, less than about 5 µm, or less than about 2 µm.

The pixel array driving circuits may upload display data to the local memory at each pixel and generate pulse-width modulation (PWM) signals based on the display data to modulate the brightness of micro-LEDs. The pixel array driving circuits may include, for example, bitcells (such as local static random-access memory (SRAM) cells) to store the display data (e.g., intensity data), digital circuits to generate the PWM signals; and analog circuits to interface with the high-voltage micro-LEDs and control the current of the micro-LEDs using the PWM signals. The pixel array driving circuits may be controlled by pixel array periphery circuits that load the image data to the bitcells, sequence the logic, and generate counter values to generate a respective pulse-width modulated analog current for each micro-LED.

The bit depth (e.g., the number of bits) of the intensity data for each pixel may affect the number of intensity levels of the light emitted by the pixel. It is generally desirable that the bit depth is greater than, for example, 6, in order to display images with sufficient number of brightness variations. However, the capacity and the density of bitcells in the local memory (e.g., SRAM) may be constrained by the design of the pixel circuits and the process technology (e.g., certain physical design rules). In some display driver architectures, the pixels may be arranged homogeneously in a 2-D array, where each pixel may have its own bitcells, comparator, PWM latch circuit, and analog driver, and thus is referred to herein as a unit pixel. Transition regions and/or spacing may be needed between different types of devices (e.g., SRAM cells, digital logic, analog circuits, high voltage circuits, etc.) in each unit pixel and between unit pixels. Thus, a large portion of the 2-D array of unit pixels may be used as the transition regions or the spacing between the different types of devices. Therefore, the number of bitcells in the local memory that can fit in each unit pixel may be limited. For example, in embodiments where each pixel has its own pixel driving circuits, a 2-um unit pixel may be able to accommodate about 6 physical bitcell, and a 1.8-um unit pixel may be able to accommodate about 4 physical bitcells, in a 28 nm CMOS technology. Optimizing the layout design may help to reduce the transition regions, but may not minimize the transition regions as desired in order to make more space for additional circuits (e.g., more bitcells) because transition regions are still needed between different types of device.

In some LED-based displays, the perceived bit depth may be increased beyond the number of physical bitcells in each unit pixel using various techniques. In one example, the perceived bit depth may be increased (e.g., by about 1.5 effective bits) by modifying the PWM timing according to a non-linear power-law. In another example, temporal dithering may be used to increase the perceived bit depth. However, the power consumption of temporal dithering may be much higher because the backplane and some parts of the display subsystem may be operated at a much higher (e.g., 2 times, 4 times, or higher) sub-frame rate in order to implement the temporal dithering.

In addition, to achieve a good display quality, the pixel array driving circuits and the pixel array periphery circuits may need to meet certain circuit specifications. For example, the pixel array driving circuits may need to deliver low-variation analog drive current to avoid brightness variations. However, due to the variability of the LED drive transistors (e.g., caused by the random dopant fluctuation and the small size of each LED drive transistor), the drive current and therefore the brightness may vary significantly. The brightness variation may be visible and may need to be counteracted by calibration using some bits of the intensity data, and thus may reduce the effective bit depth of the intensity data.

Moreover, in displays where each unit pixel has its own pixel driving circuit, the yield may be low and the pixel array driving circuits may not be robust due to, for example, the large arrays of unit pixels and the customer-designed non-standard SRAM circuits that are not already supported by mature, conventional foundry processes. For example, in a large array of unit pixels, the bit lines for some unit pixels (e.g., unit pixels in the middle of the array) may be very long, such as longer than 1 mm, and thus may have a high resistance, inductance, and/or capacitance. The high bit line resistance may form a voltage divider with bitcell access transistors, which may reduce the signal level at the bitcell, and thus may reduce the write noise margin and prevent the write to bitcells in large arrays of unit-pixels. To improve the write noise margin, a higher VDD or wider (e.g., 2 times or more wider) interconnection wires may need to be used. However, these solutions may increase the power consumption, and/or may be difficult for the device layout (to route wider traces) in devices having fine pitch pixels. In addition, the long wires may have high inductance and capacitance, and thus may increase the time delay and reduce the bandwidth of the circuits (thereby increasing the rise/fall times of the signals), and thus may also reduce the timing margin of the circuits.

Furthermore, to facilitate the circuit design and the manufacturing process development, the pixel array driving circuits may need to include some design-for-test (DFT) circuits for debug and test. For example, in process debug, external electrical measurement instruments may need to be connected to the pixel array driving circuits in situ, and current-voltage (I-V) characteristics of devices and components in the circuits may need to be measured to find root causes of design or manufacturing defects. The DFT circuits may also be used for volume production test by electrically controlling and observing internal signals in digital logic, SRAM, analog devices, and other circuit components.

Thus, in micro-LED displays where each unit pixel has its own pixel driving circuit, it can be very difficult to achieve the desired bit depth (e.g., 6 bits), low drive current and brightness variation, high noise margin, low power consumption, high yield using conventional foundry processes, and DFT functionality described above, due to the limited available real estate for the pixel array driving circuits that need to drive thousands or millions of micro-LEDs having small pitches.

According to certain embodiments, a macro-pixel architecture may be used to fit more bitcells and circuits with other functionality in the same available area for the array of micro-LEDs. The macro-pixel architecture may enable the sharing of some circuits among pixels and reduce some transition areas, such that a bit depth of 6 or more (e.g., 8 or 9) for each pixel in an array of pixels with a small pitch (e.g., 2 μm, such as about 1.8 μm) may be possible, additional logic functionality may be included, and the circuits can be made more robust and manufacturable (e.g., with standard SRAM cells, wider interconnects, and low analog circuit mismatch). In the macro-pixel architecture disclosed herein, some circuits (e.g., comparators) may be shared among multiple adjacent pixels (e.g., by time-division multiplexing). In addition, bitcells (e.g., memory such as SRAM cells), digital logic, and high-voltage LED drive transistors may each be grouped together in contiguous layout regions to reduce the transition regions that may otherwise be needed because abutting different types of circuits would need transition regions and spacing according to the design and process rules. Cluster the same type of circuits in contiguous layouts can minimize the "transition regions" between different types of circuits and leave more space for other circuits or components.

According to one example disclosed herein, a macro-pixel may include 8 or more pixels, such as 12 pixels. The macro-pixel may include bitcells (e.g., SRAM cells) organized in a contiguous 2-D array that includes 12 words with 6 bits per word. The contiguous 2-D array of bitcells may include standard foundry SRAM cells, rather than custom designed bitcells as in the unit-pixel design, and thus may be more reliably manufactured at foundries. The input-output (I/O) circuits for the contiguous 2-D array of bitcells may perform similar functions as the SRAM periphery circuits in standard foundry SRAM arrays. The macro-pixel may also include other types of circuits (e.g., digital logic, analog circuits, high-voltage circuits, etc.) that are also arranged in contiguous arrays based on the types of the circuits, thereby reducing the transition regions between different types of circuits and leaving more space for additional circuits and functionality. In addition, the comparator logic that compares the pixel values from the SRAM to a counter value may be shared by the 12 pixels through time-division multiplexing to further reduce the silicon area used. A PWM latch circuit for each pixel may be set or cleared based on the comparator output, which may be generated based on the state of a PWM signal with respect to the counter value. The output of the PWM latch circuit may control an analog circuit (e.g., a micro-LED driver or current mirror) including a thick-oxide transistor to provide a constant current to the micro-LED for different durations to produce light of different intensities.

Due to the extra space available as a result of the circuit sharing and transition region reduction, a DFT circuit may be included in the pixel array driving circuits to gain observability to, for example, the PWM latch state, the current mirror and/or micro-LED I-V characteristics, and the like. The high area efficiency of the macro-pixel may also enable more design flexibility, such as the use of standard bitcells and design rules described above, thereby increasing manufacture portability and enabling the flexibility of selecting manufacture partners based on other technical or business capabilities.

Furthermore, with the macro-pixel architecture, peripheral logic circuits that drive signals for sequencing and feeding data to the macro-pixels may be located in both the exterior of the pixel array and within the pixel array. Repeaters or buffers may also be added in the pixel array to improve the signal integrity. The periphery logic circuits and the repeaters within the pixel array may help to solve some challenges associated with the unit-pixel array architecture. For example, as described above, signals broadcasted over a large (e.g., millimeter scale) pixel array may suffer from large attenuation or time delay due to large wire resistance and capacitance, which may affect the timing and noise margins and cause errors, reliability, or other performance issues. These challenges may be at least partially solved in the macro-pixel architecture that makes space for repeaters within the pixel array. In the macro-pixel architecture, the macro-pixels may be arranged according to a hierarchy that include multiple levels, where local periphery circuits and/or repeaters may be included in the different hierarchical levels. For example, the macro-pixels may be grouped into sub-arrays, the sub-arrays may be grouped into slices, and the slices may form the 2-D pixel array. Each slice, each sub-array, and/or each macro-pixel may include some local periphery circuits and/or repeaters to enable the efficient and electrically robust movement of data in the SRAM and PWM logic. As such, the signal level and the timing (e.g., rising/falling edges) of the signals from the periphery circuits may be recovered at the macro-pixels, thereby improving the timing and noise margins, such as the write time margin of the bitcells.

In addition, the local periphery circuits at various hierarchical levels may include power-saving features to control the pixel array at various granularities, such as at the macro-pixel level, at the sub-array level, or at the slice level. In AR/VR display systems, some displayed images can have a low fill factor, for example, only in regions where user's eyes are gazing, without significantly affecting the user experience. Therefore, based on the gazing direction of the user's eyes determined through eye-tracking, only a portion of a display panel may need to have a high-quality image, and thus only the PWM signals for that portion of the display panel may be computed. Therefore, image data and PWM signals may not be needed for the regions outside of the gazing regions of the user's eyes. In some implementations, regions outside of the gazing regions of the user's eyes may be turned off or may be kept at a low illumination intensity, for example, by gating the clock for the regions outside of the gazing regions, thereby reducing the total power consumption of the display panel. In the macro-pixel architecture disclosed herein, clocking gating may be performed at the slice, sub-array, or macro-pixel level, such that pixels outside of regions of interest can be clock-gated for low-power low-fill-factor workloads, thereby reducing the power consumption of the display panel.

The macro-pixel architecture disclosed herein is also robust in the "rolling update" mode and is compatible with the power-law transformations (e.g., gamma correction). The analog circuits, such as the LED drive transistors, may also be upsized due to the extra space freed by the macro-pixel architecture. The upsized analog circuits may have reduced variation (e.g., the variation of the driving current of the LED drive transistors) due to, for example, the average of random dopant variation in a larger area.

Therefore, the macro-pixel architecture disclosed herein may accommodate more bitcells for each pixel to improve display quality without incurring the temporal dithering power overhead. The macro-pixel architecture can also reduce the variation of micro-LED drive current for more uniform brightness, improve design margins for SRAM cells and other circuits vulnerable to reduce signal level and timing margins, incorporate new test and debug features, enable local clock gating with fine granularity for low-power low-fill-factor AR image display, and avoid stringent process design rules to improve foundry portability. Thus, the macro-pixel architecture can have improved quality, power efficiency, and robustness. The macro-pixel architecture can achieve these benefits by reorganizing pixels and array functions to maximize contiguous layout of the same type of circuits and minimize hardware duplication.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "μLED" refers to an LED that has a chip where a linear dimension of the chip is less than about 200 μm, such as less than 100 μm, less than 50 μm, less than 20 μm, less than 10 μm, or smaller. For example, the linear dimension of a micro-LED may be as small as 6 μm, 5 μm, 4 μm, 2 μm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
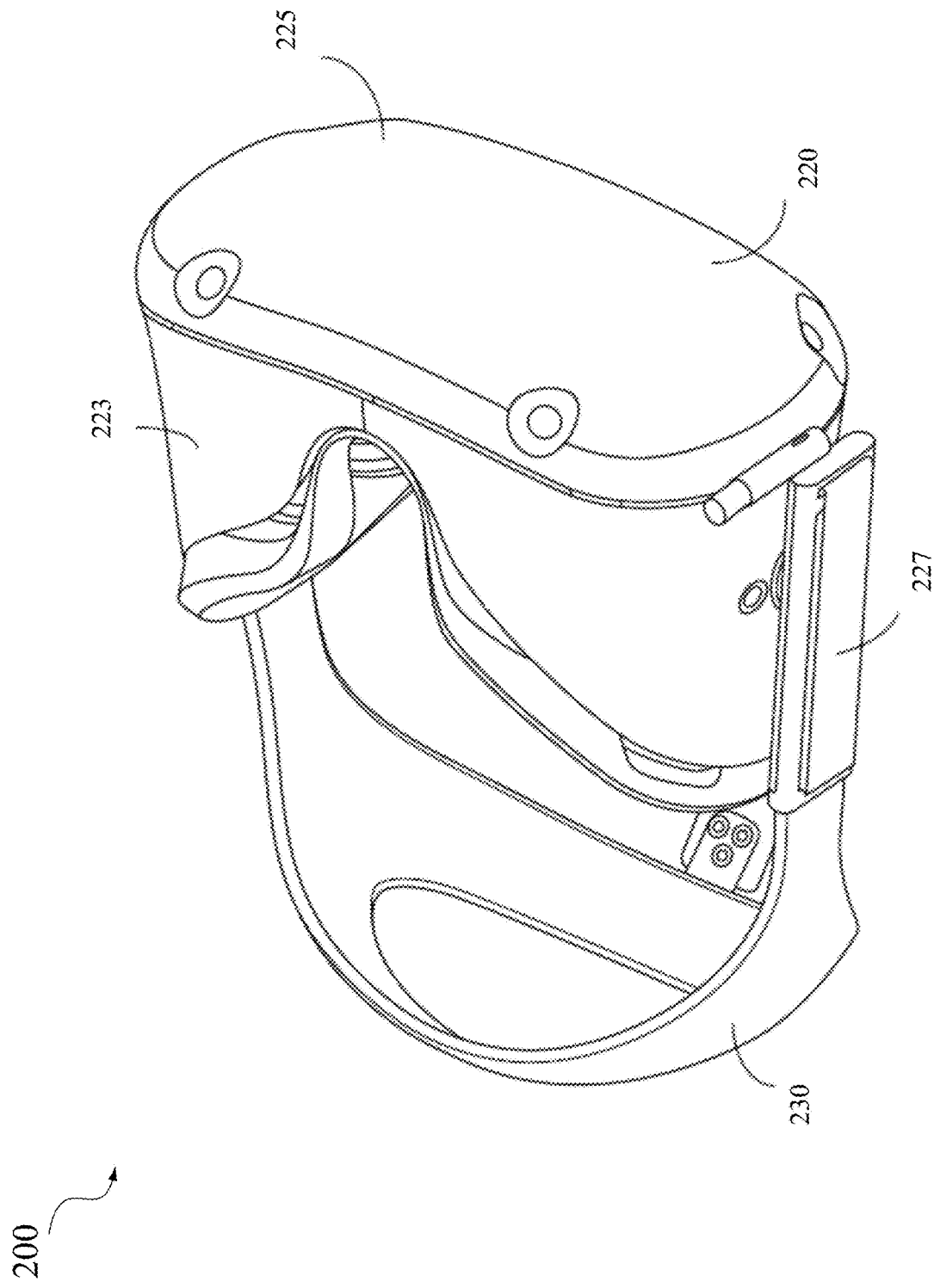
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
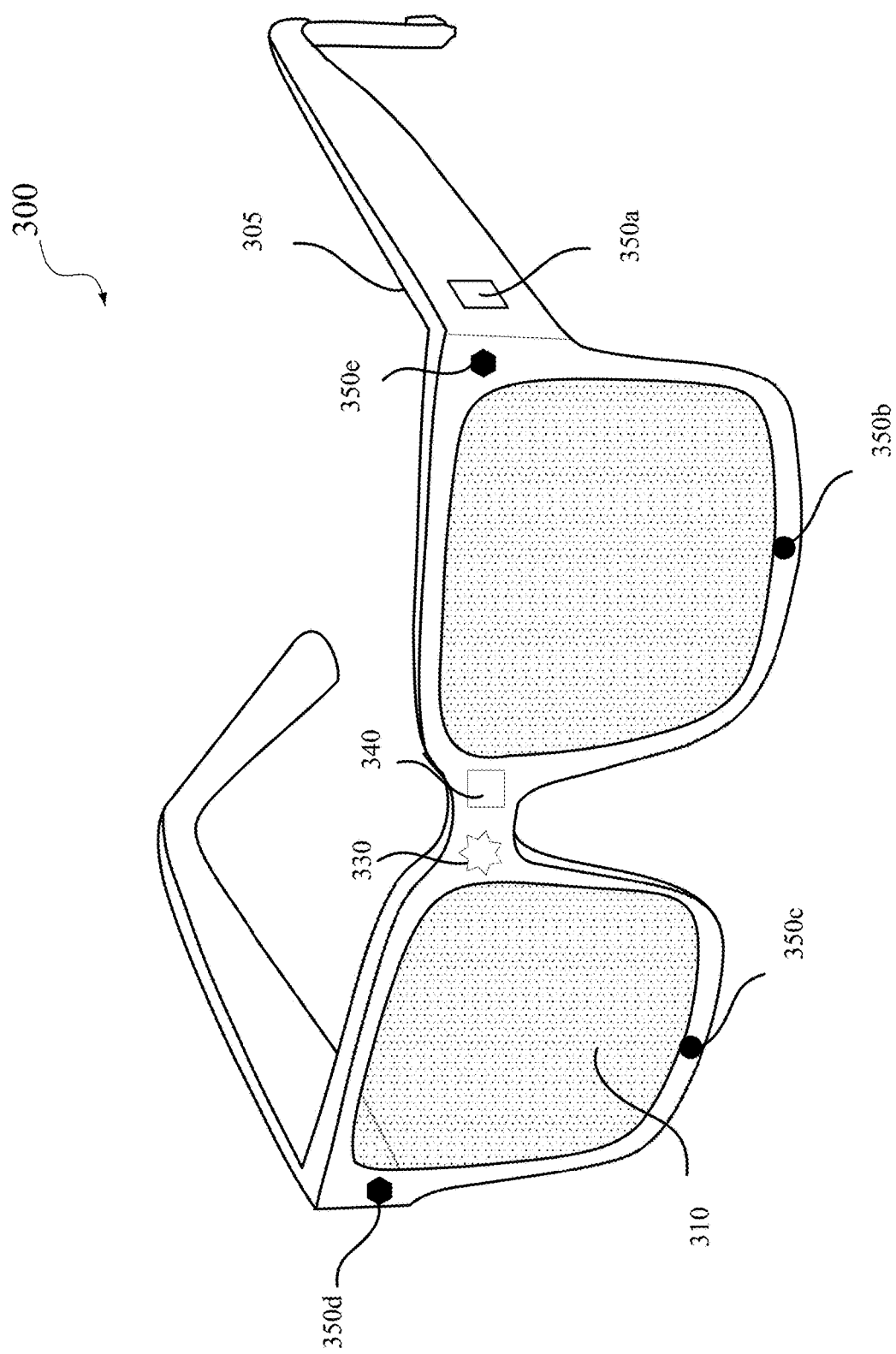
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
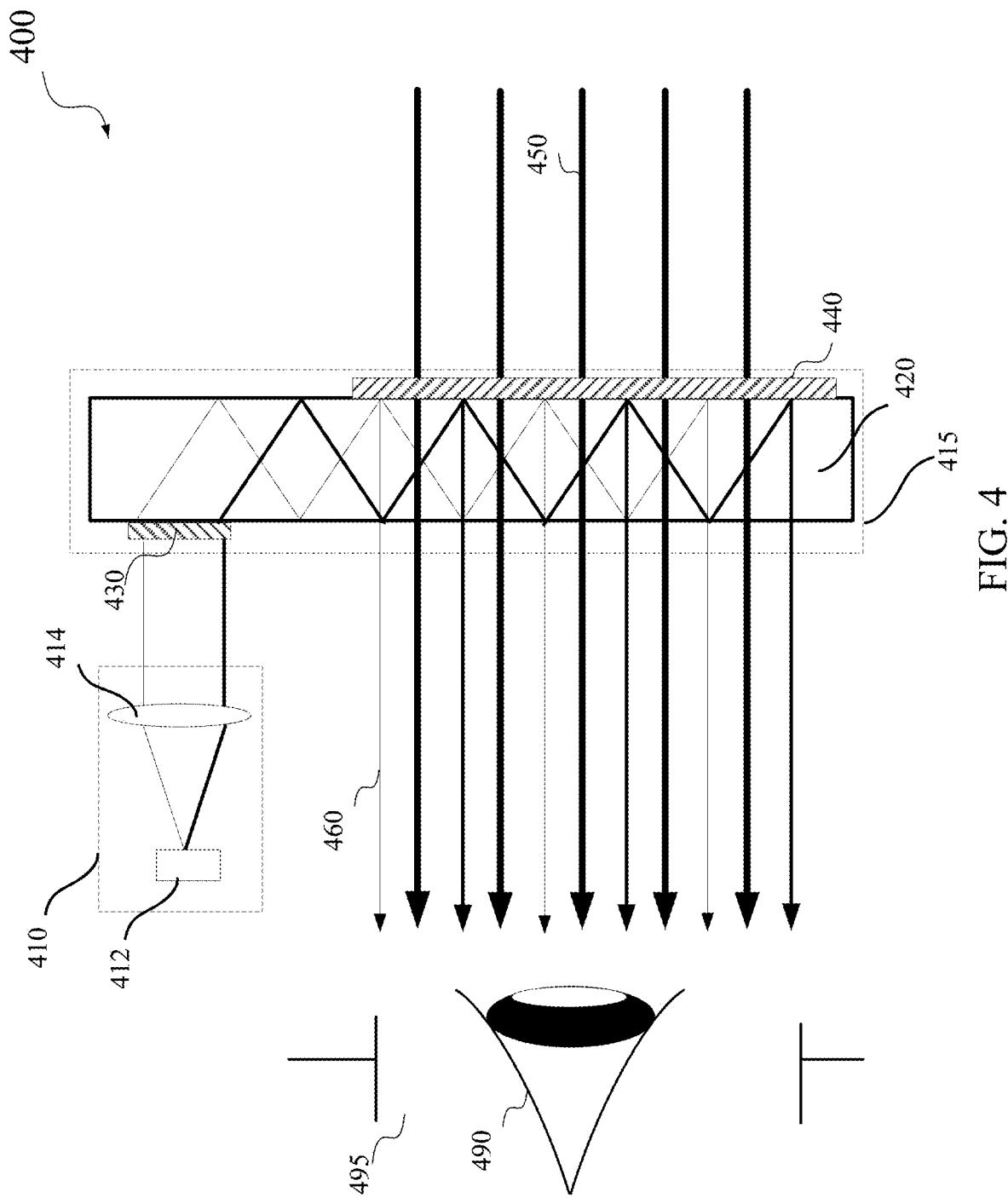
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 µm (e.g., about 1.2 µm) and the pitch may be less than 2 µm (e.g., about 1.5 µm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 µm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
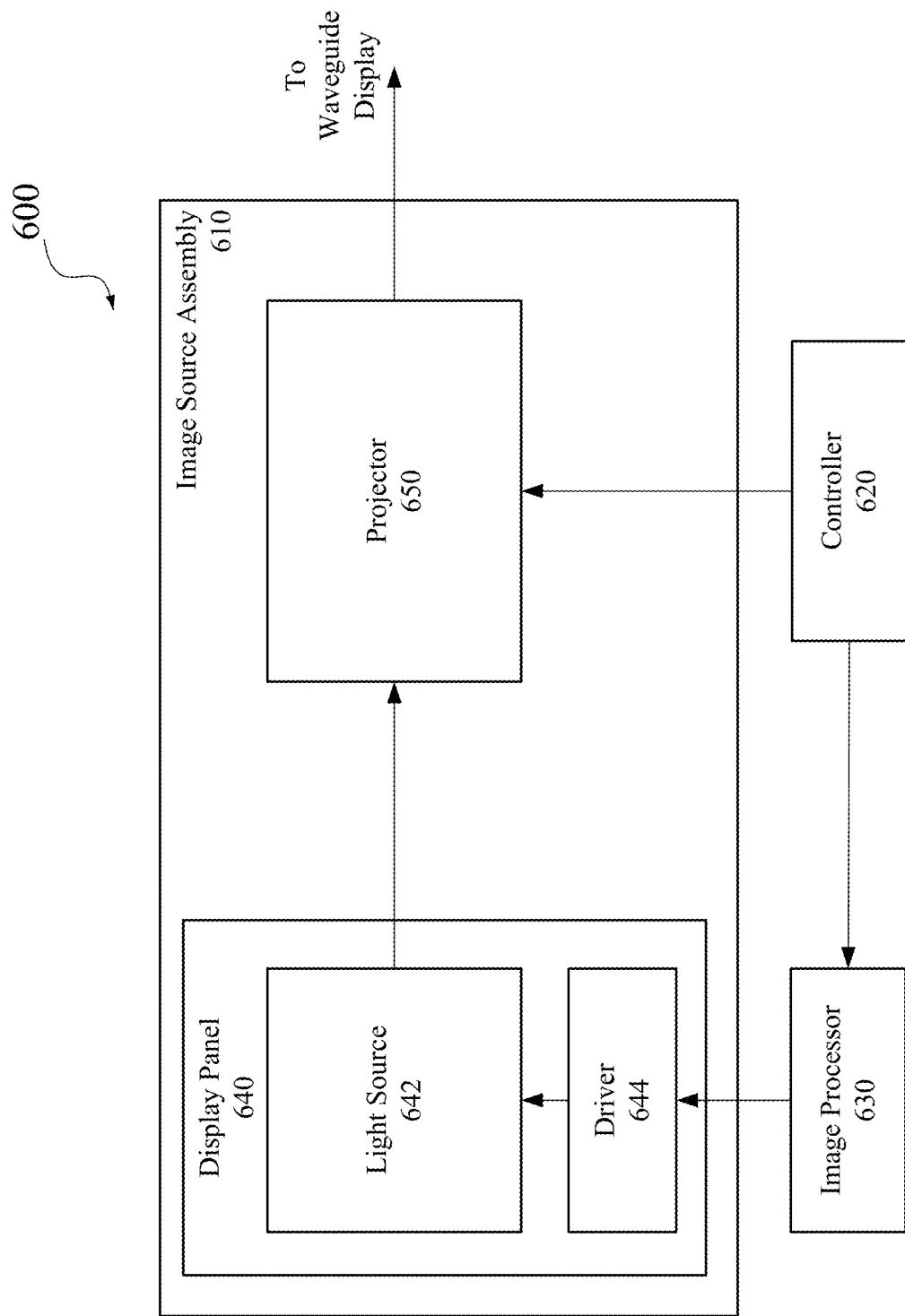
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 7A:
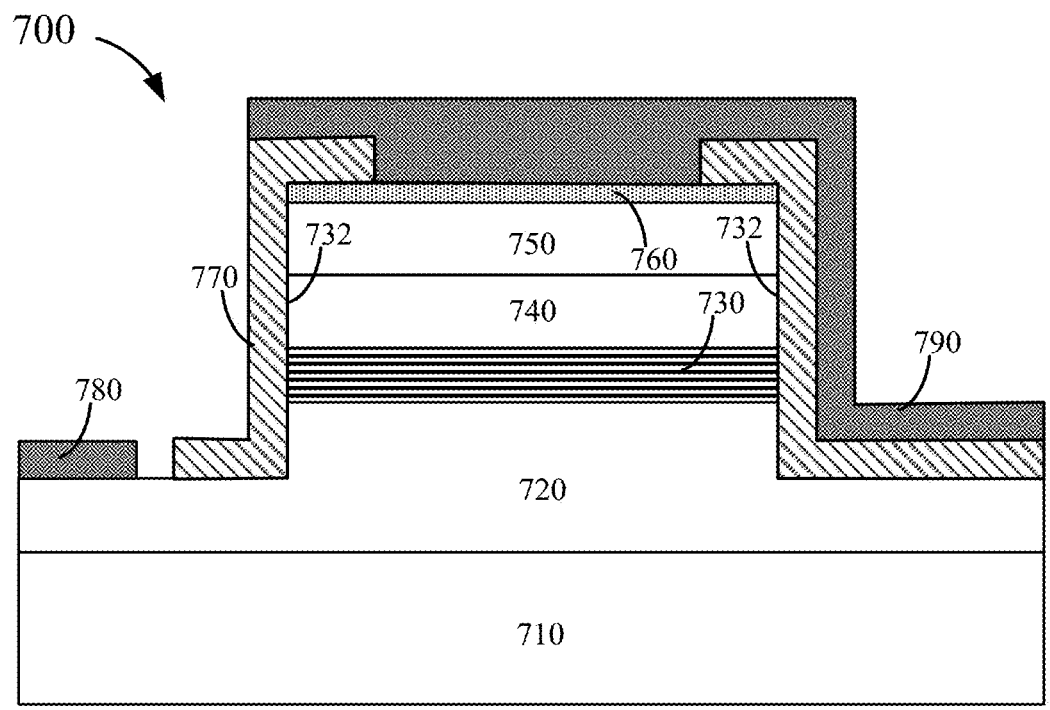
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
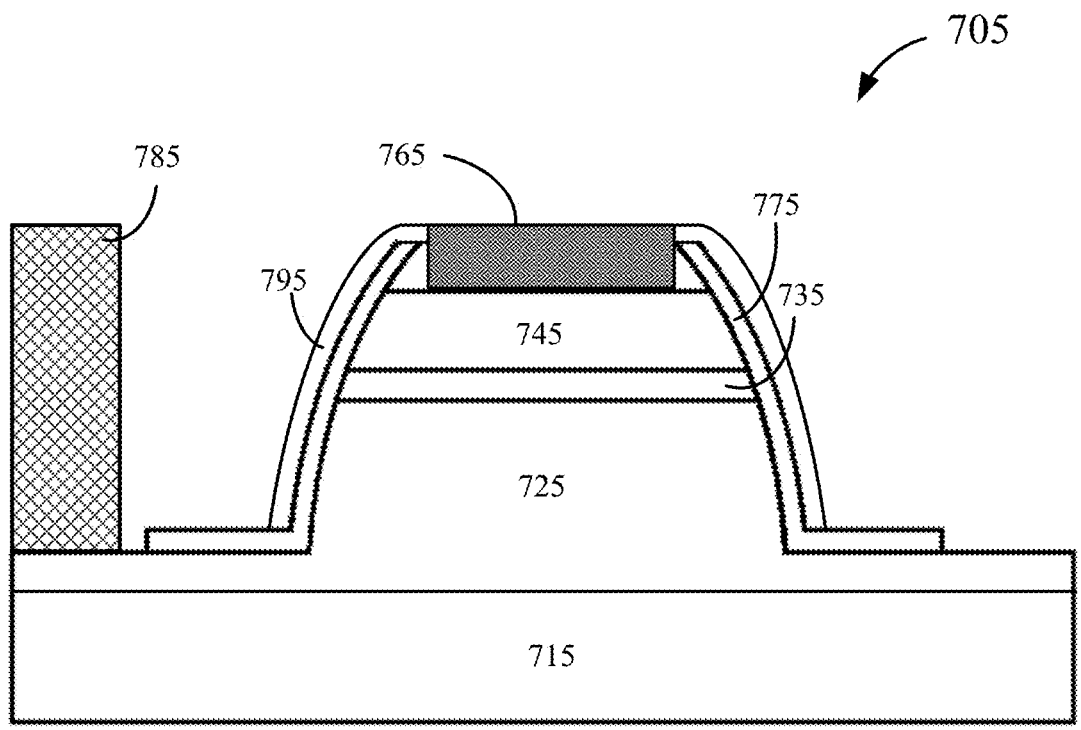
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or $SiN_x$) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

One or two-dimensional arrays of the LEDs described above may be manufactured on a wafer to form light sources (e.g., light source 642). Driver circuits (e.g., driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

Figures 8A, 8B:
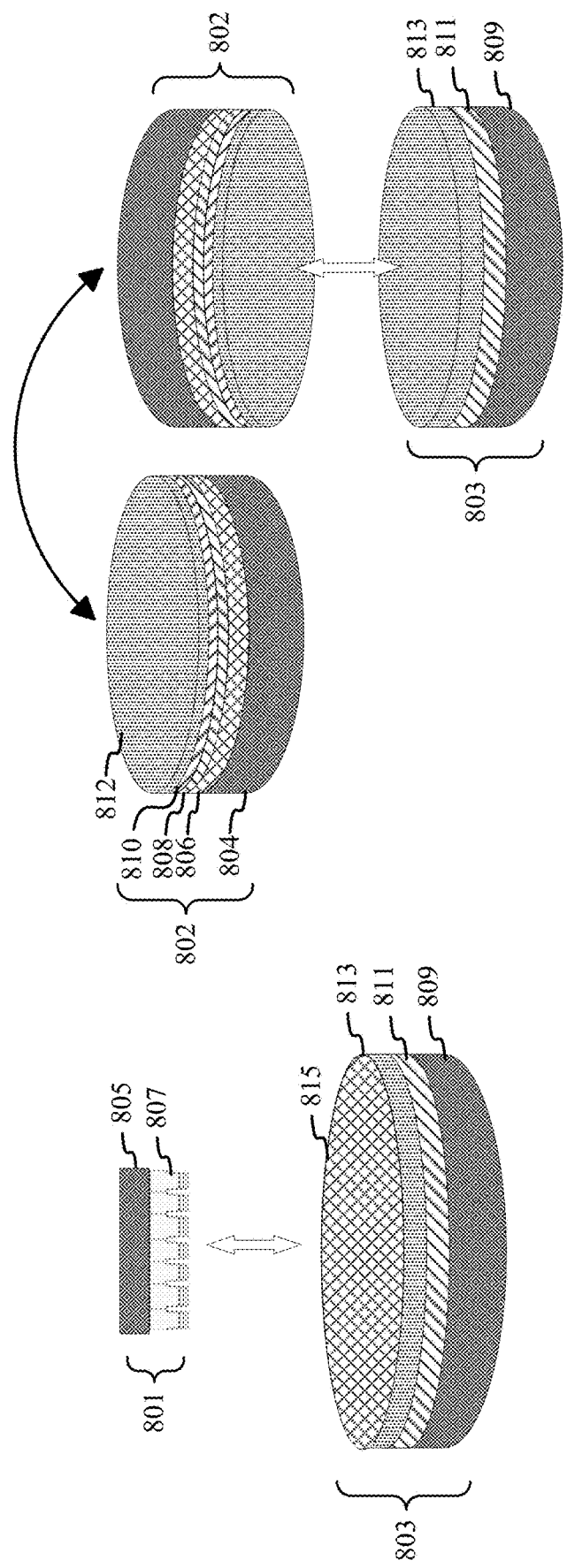
FIG. 8A illustrates an example of a method of die-to-wafer bonding for arrays of LEDs according to certain embodiments.
FIG. 8B illustrates an example of a method of wafer-to-wafer bonding for arrays of LEDs according to certain embodiments.

FIG. 8A illustrates an example of a method of die-to-wafer bonding for arrays of LEDs according to certain embodiments. In the example shown in FIG. 8A, an LED array 801 may include a plurality of LEDs 807 on a carrier substrate 805. Carrier substrate 805 may include various materials, such as GaAs, InP, GaN, AlN, sapphire, SiC, Si, or the like. LEDs 807 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 803 may include a base layer 809 having passive or active integrated circuits (e.g., driver circuits 811) fabricated thereon. Base layer 809 may include, for example, a silicon wafer. Driver circuits 811 may be used to control the operations of LEDs 807. For example, the driver circuit for each LED 807 may include a 2T1C pixel structure that has two transistors and one capacitor. Wafer 803 may also include a bonding layer 813. Bonding layer 813 may include various materials, such as a metal, an oxide, a dielectric, CuSn, AuTi, and the like. In some embodiments, a patterned layer 815 may be formed on a surface of bonding layer 813, where patterned layer 815 may include a metallic grid made of a conductive material, such as Cu, Ag, Au, Al, or the like.

LED array 801 may be bonded to wafer 803 via bonding layer 813 or patterned layer 815. For example, patterned layer 815 may include metal pads or bumps made of various materials, such as CuSn, AuSn, or nanoporous Au, that may be used to align LEDs 807 of LED array 801 with corresponding driver circuits 811 on wafer 803. In one example, LED array 801 may be brought toward wafer 803 until LEDs 807 come into contact with respective metal pads or bumps corresponding to driver circuits 811. Some or all of LEDs 807 may be aligned with driver circuits 811, and may then be bonded to wafer 803 via patterned layer 815 by various bonding techniques, such as metal-to-metal bonding. After LEDs 807 have been bonded to wafer 803, carrier substrate 805 may be removed from LEDs 807.

FIG. 8B illustrates an example of a method of wafer-to-wafer bonding for arrays of LEDs according to certain embodiments. As shown in FIG. 8B, a first wafer 802 may include a substrate 804, a first semiconductor layer 806, active layers 808, and a second semiconductor layer 810. Substrate 804 may include various materials, such as GaAs, InP, GaN, AlN, sapphire, SiC, Si, or the like. First semiconductor layer 806, active layers 808, and second semiconductor layer 810 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 806 may be an n-type layer, and second semiconductor layer 810 may be a p-type layer. For example, first semiconductor layer 806 may be an n-doped GaN layer (e.g., doped with Si or Ge), and second semiconductor layer 810 may be a p-doped GaN layer (e.g., doped with Mg, Ca, Zn, or Be). Active layers 808 may include, for example, one or more GaN layers, one or more InGaN layers, one or more AlInGaP layers, and the like, which may form one or more heterostructures, such as one or more quantum wells or MQWs.

In some embodiments, first wafer 802 may also include a bonding layer. Bonding layer 812 may include various materials, such as a metal, an oxide, a dielectric, CuSn, AuTi, or the like. In one example, bonding layer 812 may include p-contacts and/or n-contacts (not shown). In some embodiments, other layers may also be included on first wafer 802, such as a buffer layer between substrate 804 and first semiconductor layer 806. The buffer layer may include various materials, such as polycrystalline GaN or AlN. In some embodiments, a contact layer may be between second semiconductor layer 810 and bonding layer 812. The contact layer may include any suitable material for providing an electrical contact to second semiconductor layer 810 and/or first semiconductor layer 806.

First wafer 802 may be bonded to wafer 803 that includes driver circuits 811 and bonding layer 813 as described above, via bonding layer 813 and/or bonding layer 812. Bonding layer 812 and bonding layer 813 may be made of the same material or different materials. Bonding layer 813 and bonding layer 812 may be substantially flat. First wafer 802 may be bonded to wafer 803 by various methods, such as metal-to-metal bonding, eutectic bonding, metal oxide bonding, anodic bonding, thermo-compression bonding, ultraviolet (UV) bonding, and/or fusion bonding.

As shown in FIG. 8B, first wafer 802 may be bonded to wafer 803 with the p-side (e.g., second semiconductor layer 810) of first wafer 802 facing down (i.e., toward wafer 803). After bonding, substrate 804 may be removed from first wafer 802, and first wafer 802 may then be processed from the n-side. The processing may include, for example, the formation of certain mesa shapes for individual LEDs, as well as the formation of optical components corresponding to the individual LEDs.

FIGS. 9A-9D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 9A shows a substrate 910 with passive or active circuits 920 manufactured thereon. As described above with respect to FIGS. 8A-8B, substrate 910 may include, for example, a silicon wafer. Circuits 920 may include driver circuits for the arrays of LEDs. A bonding layer may include dielectric regions 940 and contact pads 930 connected to circuits 920 through electrical interconnects 922. Contact pads 930 may include, for example, Cu, Ag, Au, Al, W, Mo, Ni, Ti, Pt, Pd, or the like. Dielectric materials in dielectric regions 940 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 905. The activated surface may be atomically clean and may be reactive for formation of direct bonds between wafers when they are brought into contact, for example, at room temperature.

FIG. 9B illustrates a wafer 950 including an array of micro-LEDs 970 fabricated thereon as described above with respect to, for example, FIGS. 7A-8B. Wafer 950 may be a carrier wafer and may include, for example, GaAs, InP, GaN, AlN, sapphire, SiC, Si, or the like. Micro-LEDs 970 may include an n-type layer, an active region, and a p-type layer epitaxially grown on wafer 950. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 980 and n-contacts 982 may be formed in a dielectric material layer 960 deposited on the mesa structures and may make electrical contacts with the p-type layer and the n-type layers, respectively. Dielectric materials in dielectric material layer 960 may include, for example, SiCN, SiO$_2$, SiN, Al$_2$O$_3$, HfO$_2$, ZrO$_2$, Ta$_2$O$_5$, or the like. P-contacts 980 and n-contacts 982 may include, for example, Cu, Ag, Au, Al, W, Mo, Ni, Ti, Pt, Pd, or the like. The top surfaces of p-contacts 980, n-contacts 982, and dielectric material layer 960 may form a bonding layer. The bonding layer may be planarized and polished using, for example, chemical mechanical polishing, where the polishing may cause dishing in p-contacts 980 and n-contacts 982. The bonding layer may then be cleaned and activated by, for example, an ion (e.g., plasma) or fast atom (e.g., Ar) beam 915. The activated surface may be atomically clean and reactive for formation of direct bonds between wafers when they are brought into contact, for example, at room temperature.

FIG. 9C illustrates a room temperature bonding process for bonding the dielectric materials in the bonding layers. For example, after the bonding layer that includes dielectric regions 940 and contact pads 930 and the bonding layer that includes p-contacts 980, n-contacts 982, and dielectric material layer 960 are surface activated, wafer 950 and micro-LEDs 970 may be turned upside down and brought into contact with substrate 910 and the circuits formed thereon. In some embodiments, compression pressure 925 may be applied to substrate 910 and wafer 950 such that the bonding layers are pressed against each other. Due to the surface activation and the dishing in the contacts, dielectric regions 940 and dielectric material layer 960 may be in direct contact because of the surface attractive force, and may react and form chemical bonds between them because the surface atoms may have dangling bonds and may be in unstable energy states after the activation. Thus, the dielectric materials in dielectric regions 940 and dielectric material layer 960 may be bonded together with or without heat treatment or pressure.

FIG. 9D illustrates an annealing process for bonding the contacts in the bonding layers after bonding the dielectric materials in the bonding layers. For example, contact pads 930 and p-contacts 980 or n-contacts 982 may be bonded together by annealing at, for example, about 200-400° C. or higher. During the annealing process, heat 935 may cause the contacts to expand more than the dielectric materials (due to different coefficients of thermal expansion), and thus may close the dishing gaps between the contacts such that contact pads 930 and p-contacts 980 or n-contacts 982 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 10:
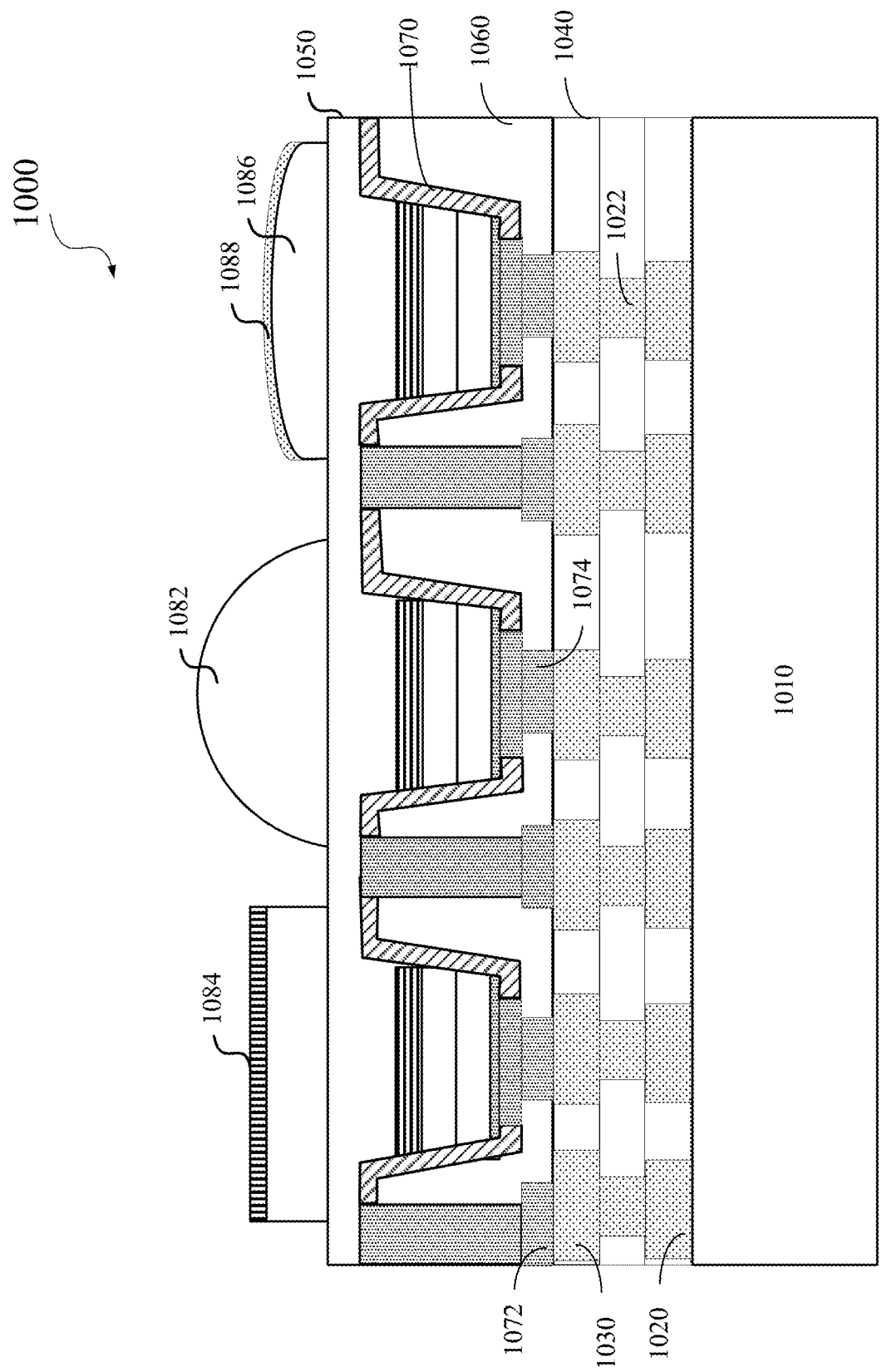
FIG. 10 illustrates an example of an LED array with secondary optical components fabricated thereon according to certain embodiments.

FIG. 10 illustrates an example of an LED array 1000 with secondary optical components fabricated thereon according to certain embodiments. LED array 1000 may be made by bonding an LED chip or wafer with a silicon wafer including electrical circuits fabricated thereon, using any suitable bonding techniques described above with respect to, for example, FIGS. 8A-9D. In the example shown in FIG. 10, LED array 1000 may be bonded using a wafer-to-wafer hybrid bonding technique as described above with respect to FIG. 9A-9D. LED array 1000 may include a substrate 1010, which may be, for example, a silicon wafer. Integrated circuits 1020, such as LED driver circuits, may be fabricated on substrate 1010. Integrated circuits 1020 may be connected to p-contacts 1074 and n-contacts 1072 of micro-LEDs 1070 through interconnects 1022 and contact pads 1030, where contact pads 1030 may form metallic bonds with p-contacts 1074 and n-contacts 1072. Dielectric layer 1040 on substrate 1010 may be bonded to dielectric layer 1060 through fusion bonding.

The substrate (not shown) of the LED chip or wafer may be thinned or may be removed to expose the n-type layer 1050 of micro-LEDs 1070. Various secondary optical components, such as a spherical micro-lens 1082, a grating 1084, a micro-lens 1086, an antireflection layer 1088, and the like, may be formed in or on top of n-type layer 1050. For example, spherical micro-lens arrays may be etched in the semiconductor materials of micro-LEDs 1070 using a grayscale mask and a photoresist with a linear response to exposure light, or using an etch mask formed by thermal reflowing of a patterned photoresist layer. The secondary optical components may also be etched in a dielectric layer deposited on n-type layer 1050 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, SiO$_2$, SiN, Al$_2$O$_3$, HfO$_2$, ZrO$_2$, Ta$_2$O$_5$, or the like. In some embodiments, a micro-LED 1070 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 10 to show some examples of secondary optical components that can be formed on micro-LEDs 1070, which does not necessary imply that different secondary optical components are used simultaneously for every LED array.

Figure 11:
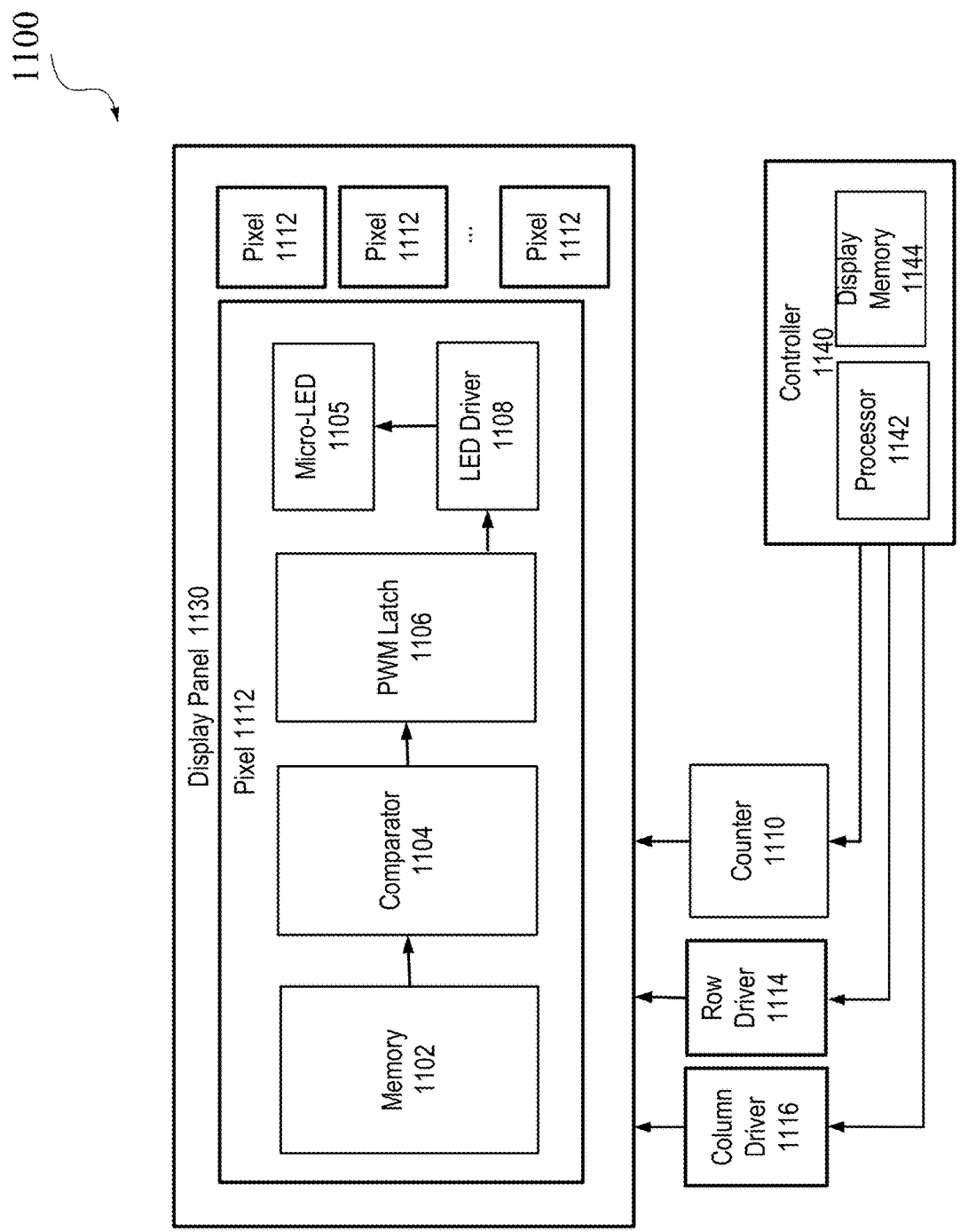
FIG. 11 is a simplified block diagram of an example of a display device according to certain embodiments.

FIG. 11 is a simplified block diagram of an example of a display device 1100 according to certain embodiments. Display device 1100 may include a display panel 1130 that includes an array (e.g., a 2-D array) of pixels 1112. Display panel 1130 may be an example of display panel 640. FIG. 11 illustrates the block diagram of one pixel 1112, which may be similar to other pixels 1112 in the array of pixels. Pixels 1112 may be an example of light source 642 and part of driver 644. The various functional components of each pixel 1112 may generate digital PWM signals using digital comparison to control a micro-LED. Pixel 1112 may include a micro-LED 1105, which may emit light at an intensity level that is controlled by the PWM signals. The circuits that control micro-LED 1105 in pixel 1112 may be an example of a portion of driver circuits 644 and may include a memory device 1102, a comparator 1104, a PWM latch circuit 1106, and a LED driver circuit 1108. Memory device 1102 may be a part of pixel 1112 or may be outside of pixel 1112. Memory device 1102 may include, for example, SRAM cells, and may store the intensity data for pixel 1112. Memory device 1102 may be connected to comparator 1104, which may be connected to PWM latch circuit 1106. PWM latch circuit 1106 may be connected to LED driver circuit 1108 to control LED driver circuit 1108 to provide a pulse width modulation to a drive current that may be an approximately constant current. LED driver circuit 1108 may drive micro-LED 1105 with the drive current for different periods of time based on the PWM signals to emit different amounts of light during a PWM frame (also referred to as a PWM cycle). In general, the longer micro-LED 1105 is driven at the current level within a PWM cycle, the brighter micro-LED 1105 may be perceived by an observer.

Display device 1100 may include also a row driver 1114, a column driver 1116, and a counter 1110. In some embodiments, row driver 1114, column driver 1116, and counter 1110 may be parts of the periphery circuits of display panel 1130. Row driver 1114 and column driver 1116 may be connected to pixels 1112. For example, row driver 1114 may be connected to memory device 1102, comparator 1104, and PWM latch circuit 1106. Column driver 1116 may be connected to memory device 1102. Display device 1100 may further include a controller 1140, which may include a processor 1142 and a display memory device 1144. Controller 1140 may be connected to row driver 1114 and column driver 1116 to control the operations of row driver 1114 and column driver 1116. For example, processor 1142 of controller 1140 may provide control signals to row driver 1114 and column driver 1116 to operate pixels 1112. Counter 1100 may be coupled to display memory device 1144, which may store, for example, calibration data and/or a gamma correction look-up table (LUT).

Memory device 1102 may include digital data storage cells, such as cells of SRAM or some other types of memory. For example, memory device 1102 may include multiple memory cells for storing the display data (e.g., intensity data) for pixel 1112. Each cell in memory device 1102 may be connected to row driver 1114 via a word line (WL) and may be connected to column driver 1116 via a bit line (BL) and an inverse bit line (BL). Memory device 1102 may receive WL signals from row driver 1114 for memory word selection, and may receive, from column driver 1116, control words in the form of data bits for writing to the selected memory cells. The bit values of data bits D define the intensity level of the pixel for a PWM frame. The number of data bits (or bitcells) in a control word may vary. In one example, each control word in memory device 1102 may include 3 bitcells storing a 3-bit value representing one of eight levels of brightness (e.g., 000, 001, 010, 011, 100, 101, 110, and 111). In another example, each control word in the memory device 1102 may include 8 bitcells storing an 8-bit value representing one of 256 levels of brightness. Additional details regarding memory device 1102 are described below in connection with, for example, FIGS. 12A and 12B.

Counter 1110 may be used to generate counter values (e.g., a clock cycle count) based on a clock signal. The counter value of counter 1110 may be compared with the value of a control word from memory device 1102 by comparator 1104 to generate a comparison result. For example, the comparison result may be generated based on the exclusive OR (XOR) of each data bit in the control word and the corresponding bit of the counter value. Comparator 1104 may include a dynamic comparison node that switches between a high and low level according to the comparison results, and may output the comparison results to PWM latch circuit 1106 to generate PWM signals. Alternatively, comparator 1104 may include a statically driven comparison node that switches between a high and low level according to the comparison results, and may output the comparison results to PWM latch circuit 1106 to generate PWM signals.

LED driver circuit 1108 may include one or more LED drive transistors. One of the one or more LED drive transistors may have a source or drain terminal connected to micro-LED 1105. One of the one or more LED drive transistors may include a gate terminal connected to PWM latch circuit 1106 to receive the PWM signal for modulating the current flowing through the source and drain terminals of the driving transistor into micro-LED 1105.

Figures 12A, 12B:
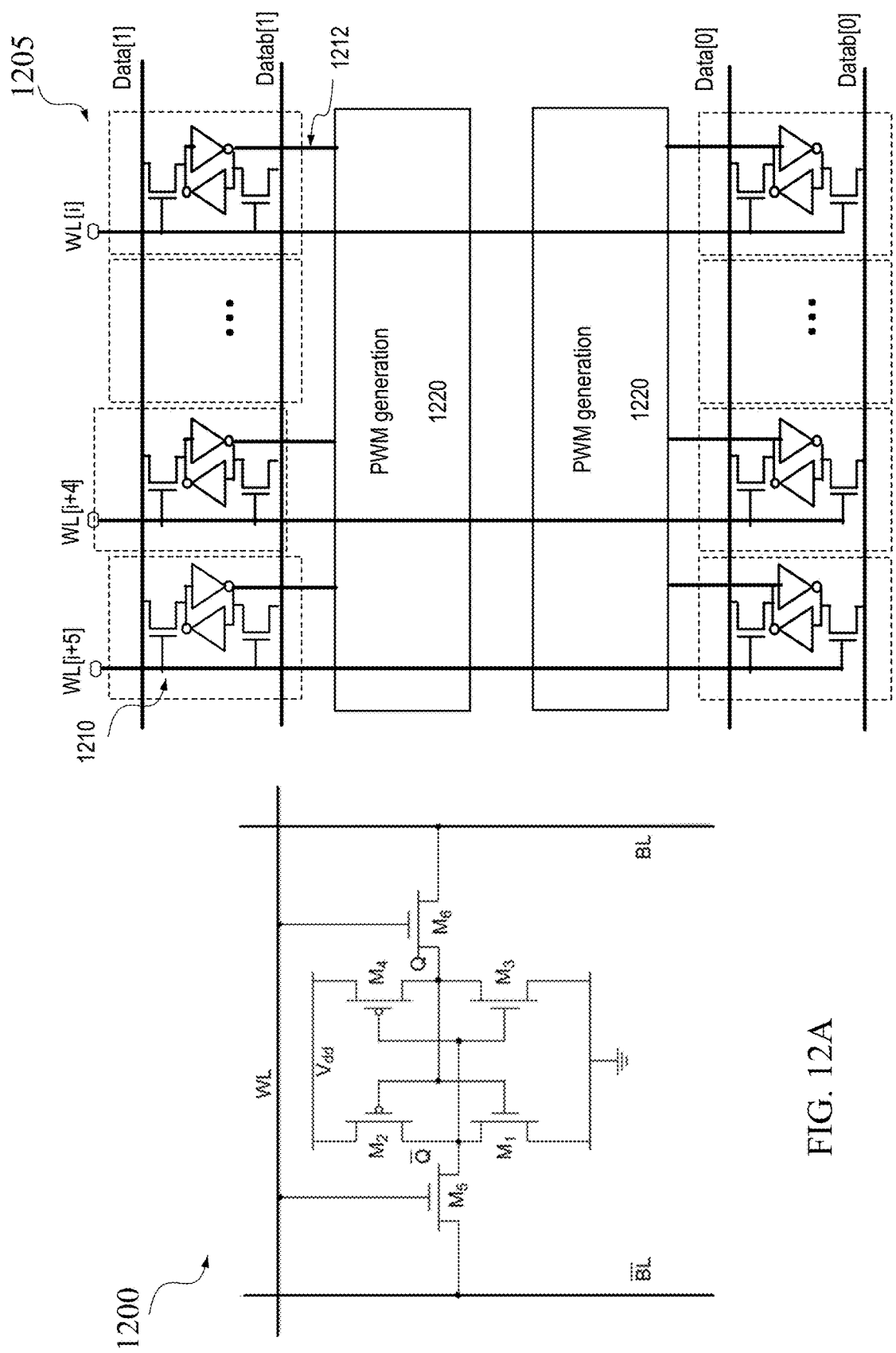
FIG. 12A illustrates an example of a static random access memory (SRAM) cell that may be used as a bitcell for storing intensity data.
FIG. 12B is a simplified block diagram of a part of an example of a display panel including an array of unit pixels and custom SRAM bitcells.

FIG. 12A illustrates an example of an SRAM cell 1200 that may be used as a bitcell for storing intensity data. SRAM can retain its stored information as long as power is supplied, which is different from dynamic RAM (DRAM) where periodic refreshes are needed, or non-volatile memory where no power is needed for data retention. SRAM can be randomly accessed such that each cell in the array can be read or written in any order, no matter which cell was last accessed. SRAM cell 1200 shown in FIG. 12A is a 6-transistor SRAM cell that can store one bit of data. SRAM cell 1200 includes two CMOS inverters formed by MOSFETs M1/M2 and M3/M4, respectively. The output of each of the two inverters is fed to the other inverter as the input to the other inverter to form a feedback loop. The feedback loop may stabilize the inverters to their respective states.

Access transistors M5 and M6, the word line WL, and the bit lines BL and $\overline{BL}$ are used to read from and write to SRAM cell 1200. In the standby mode, the word line WL is low, and thus access transistors M5 and M6 are turned off. The two inverters are in complementary states. When p-channel MOSFET M2 of the left inverter is turned on, the output of the left inverter is high, and thus p-channel MOSFET M4 of the right inverter is turned off, and the output of the right inverter is low to turn on p-channel MOSFET M2 of the left inverter.

To write a data bit into SRAM cell 1200, the data bit may be driven on bit line BL and the inverse data bit may be driven on the inverse bit line $\overline{BL}$. Access transistors M5 and M6 may then be turned on by setting the word line WL to high. Since the drivers of the bit lines may be much stronger that MOSFETs M1-M4, the bit lines may overpower the inverter transistors to impose new data in SRAM cell 1200. To overpower the feedback loop formed by the two inverters, access transistor M5 may need to be stronger than P-channel MOSFET M2 of the left inverter, and/or access transistor M6 may need to be stronger than P-channel MOSFET M4 of the right inverter. As soon as the data bit is stored in the inverters, access transistors M5 and M6 may be turned off by setting the word line WL to a low level, and the states of the two inverters are be preserved by the feedback loop.

To read the stored data bit from SRAM cell 1200, bit line BL and inverse bit line $\overline{BL}$ may be pre-charged to a high level. The word line WL may then be set to a high level to turn on access transistors M5 and M6. Bit line BL or inverse bit line $\overline{BL}$ may be pulled down to a low level, depending on the data bit stored in SRAM cell 1200. For example, if a "1" is store in SRAM cell 1200, $\overline{Q}$ may be at a low level and inverse bit line $\overline{BL}$ may be pulled to the low level, while Q may be at a higher level and thus bit line BL may remain at a high level.

FIG. 12B is a simplified block diagram of a part of an example of a display panel 1205 including an array of unit pixels and custom SRAM bitcells 1210. Display panel 1205 may include a 2-D array of unit pixels, such as pixels 1112 described above with respect to FIG. 11, where each unit pixel may include bitcells for storing a control word for the unit pixel and a PWM generation circuit 1220 for generating PWM signals. PWM generation circuit 1220 may include, for example, a comparator and a PWM latch circuit as described above. The control word for each pixel may include multiple bitcells (only two are shown in FIG. 12B) that may be selected by a word line WL.

As shown in FIG. 12B, SRAM bitcells 1210 are not standard 6-transistor SRAM cells that are accessed using the bit lines for reading and writing as described above with respect to FIG. 12A. Instead, SRAM bitcell 1210 may be modified such that an internal storage node of each custom SRAM bitcell 1210 may be connected to PWM generation circuits 1220 by an additional interconnect 1212 for reading custom SRAM bitcell 1210 to generate the PWM signals, while the write to custom SRAM bitcell 1210 may still be performed through the bit lines.

Figure 13A:
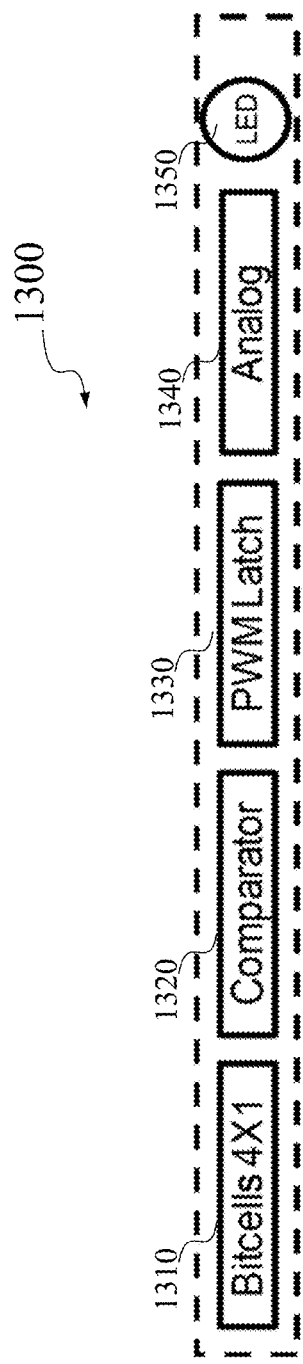
FIG. 13A illustrates an example of a unit pixel in an example of display panel.

FIG. 13A illustrates an example of a unit pixel 1300 in an example of display panel, such as display panel 1130 or 1205. Unit pixel 1300 may be similar to pixel 1112 described above with respect to FIG. 11, and may include bitcells 1310, a comparator 1320, a PWM latch circuit 1330, an analog driver circuit 1340, and a micro-LED 1350. In the illustrated example, bitcells 1310 include 4 bitcells and thus unit pixel 1300 has a bit depth of 4 and may emit light in 16 different intensity levels. Bitcells 1310 may include custom SRAM bitcells, such as custom SRAM bitcells 1210 described above. Comparator 1320 may be similar to comparator 1104 described above, and PWM latch circuit 1330 may be similar to PWM latch circuit 1106. Outputs of PWM latch circuit 1330 may be the PWM signals that include pulses of desired widths. Analog driver circuit 1340 may include, for example, a current source and one or more LED drive transistors, where an LED drive transistor may be controlled by the PWM signals to connect or disconnect micro-LED 1350 from the current source. Unit pixel 1300 may have a linear dimension of a few micrometers, such as about 2 µm.

Figure 13B:
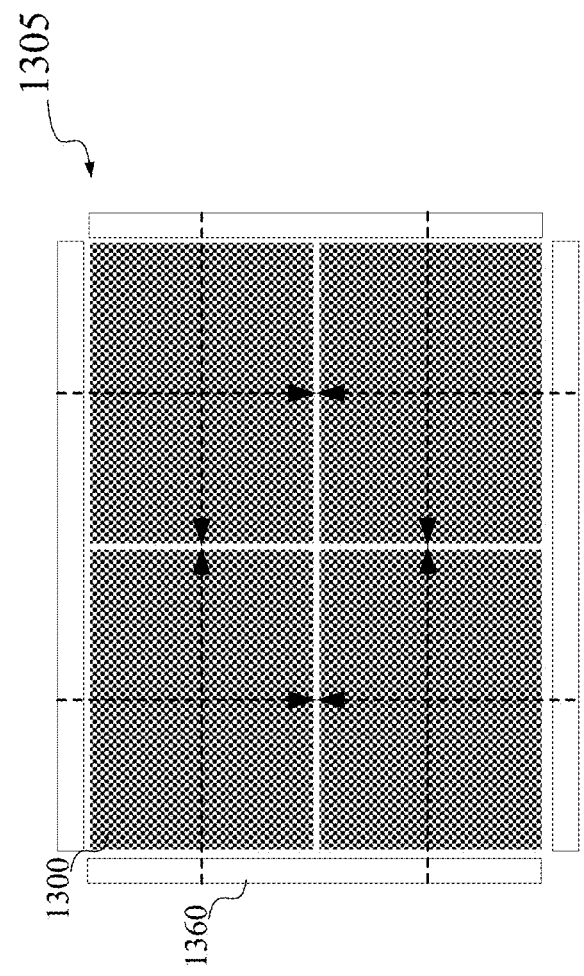
FIG. 13B illustrates an example of a display panel including a two-dimensional array of unit pixels.

FIG. 13B illustrates an example of a display panel 1305 including a two-dimensional array of unit pixels 1300. In display panel 1305, unit pixels 1300 described above may be arranged in a 2-D array that has thousands or millions of unit pixels 1300 and has linear dimensions about a few millimeters, such as approximately 4 mm×3 mm. Display panel 1305 may also include periphery circuits 1360 at the outer edges of the 2-D array of unit pixels 1300. Periphery circuits 1360 may include, for example, column drivers, row drivers, counters, and the like. As described above, the column drivers and row drivers may be used to select the unit pixels, write the control word into the bitcells of the unit pixels, and read data bits from the bitcells. Since the 2-D array of unit pixels 1300 may have a linear dimension of a few millimeters, control signals that are generated by periphery circuits 1360 for unit pixels 1300 in the middle of the 2-D array of unit pixels, such as the word lines and the bit lines signals for the bitcells and the counter data bits, may need to travel a long distance, such as up to a half of the length or width of the 2-D array, before reaching the unit pixels.

Figure 14:
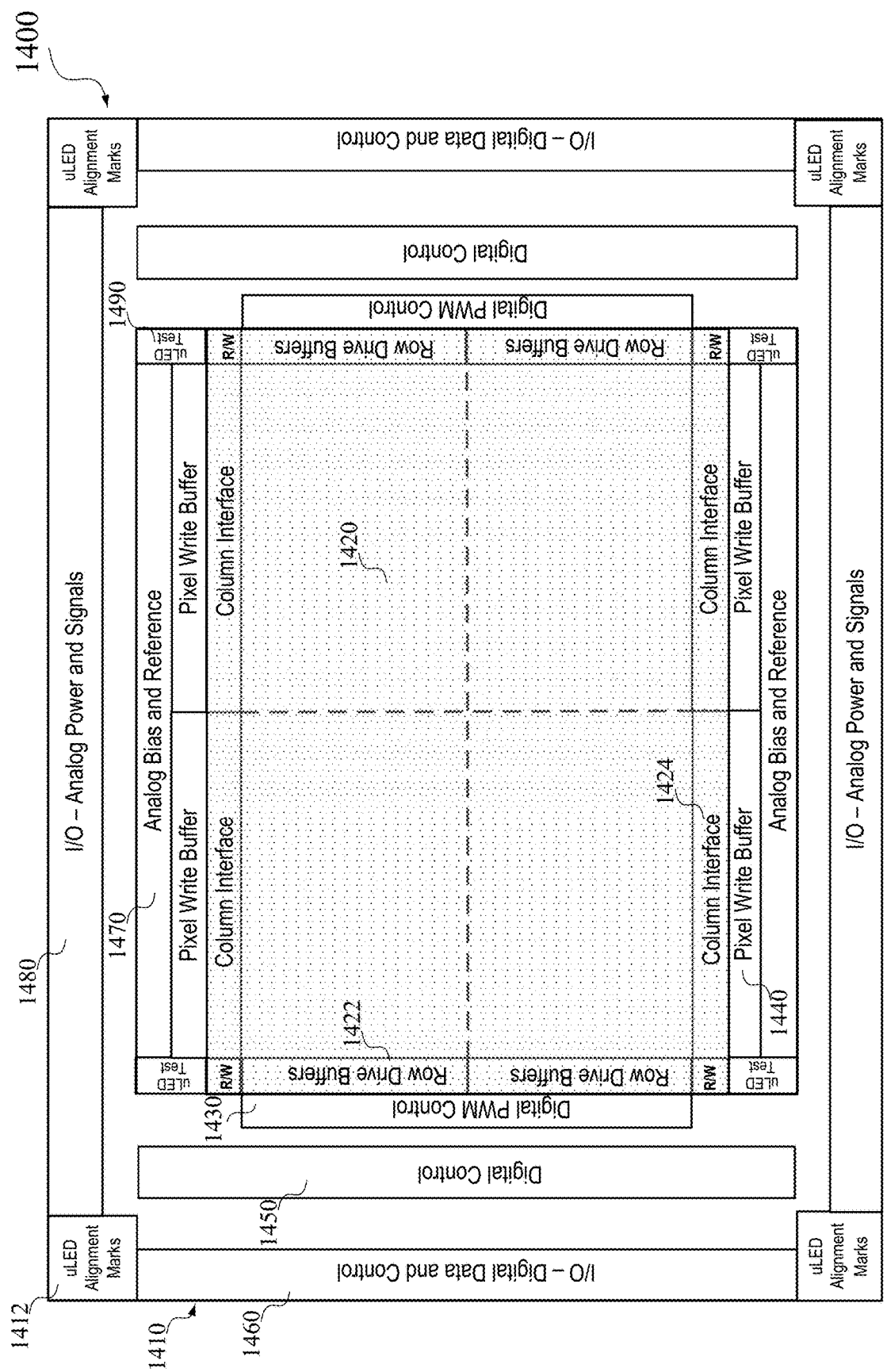
FIG. 14 illustrates an example of a floor plan of the driver circuits of an example of a micro-LED display panel.

FIG. 14 illustrates an example of a floor plan of the driver circuits of an example of a micro-LED display panel 1400. Micro-LED display panel 1400 may be an example of display panel 1305. In the illustrated example, micro-LED display panel 1400 may include a micro-LED device (not shown) that include a 2-D array of micro-LEDs that has a small pitch, such as less than about 5 µm or less than about 2 µm. Micro-LED display panel 1400 may also include a silicon backplane device 1410 that includes drive circuits for controlling the operations of the micro-LED device. Silicon backplane device 1410 and the micro-LED device may be bonded together in the die level or a wafer level as described above, for example, using micro-LED alignment marks 1412 on silicon backplane device 1410, such that the anodes and cathodes of the micro-LEDs of micro-LED device may be connected to circuits on silicon backplane device 1410. In some embodiments, at least a part of silicon backplane device 1410 may be implemented in a thin-film transistor (TFT) layer. Silicon backplane device 1410 may include a 2-D pixel array 1420. 2-D pixel array 1420 may include unit pixel drive circuits for individual unit pixels that are arranged in a two-dimensional array as described above.

Silicon backplane device 1410 may include various periphery circuits for controlling the operations of 2-D pixel array 1420. The periphery circuits may include, for example, digital PWM control circuits 1430, pixel write buffers 1440, other digital control circuits 1450, I/O circuits 1460 for digital data and control, analog bias and reference circuits 1470, I/O circuits 1480 for analog power and signals, micro-LED test circuits 1490, and the like. Silicon backplane device 1410 may also include row drive buffers 1422 and column interface 1424 at the periphery of 2-D pixel array 1420.

As described above, 2-D pixel array 1420 may have a linear dimension of a few millimeters, such as about 3 or 4 mm. Therefore, control signals that are generated by the periphery circuits outside of 2-D pixel array 1420 for unit pixels in the middle of 2-D pixel array 1420, such as the word lines and the bit lines signals for the bitcells, PWM control signals, counter data bits, clock signals, and the like, may need to travel a long distance before reaching the target unit pixels. To reduce the length of these interconnects, row drivers may be arranged on opposite sides of 2-D pixel array 1420, such that one half of the unit pixels may be controlled by row drivers on one side and the other half of the unit pixels may be controlled by row drivers on the other side. Similarly, column drivers may be arranged on opposite sides of 2-D pixel array 1420, such that one half of the unit pixels may be controlled by column drivers on one side and the other half of the unit pixels may be controlled by column drivers on the other side. Buffers may also be used to increase the drive strength. Thus, 2-D pixel array 1420 may include four quadrants, where each quadrant may be driven by a set of column and row drivers.

In the examples shown in FIGS. 12B-14, unit pixels are arranged homogeneously in a 2-D array and each unit pixel has its own bitcells, comparator, PWM latch circuit, and analog driver. Transition regions and/or spacing may be needed between different types of devices in each unit pixels and between unit pixels, such as between the SRAM cells, digital logic, analog circuit, high voltage circuits, and the like. Thus, a large portion of the 2-D array of unit pixels may be used as the transition regions or the spacing between different types of devices. As described above, the array of micro-LEDs may have a pitch of only a few micrometers. Therefore, there may only be enough room to include a small number of (e.g., about 4) bitcells in each unit pixel. As described above, it is generally desirable that the bit depth is greater than, for example, 6, in order to display images with sufficient number of brightness variations. There may be some techniques to increase the effective perceived bit depth beyond the number of physical bitcells in each unit pixel.

Figure 15A:
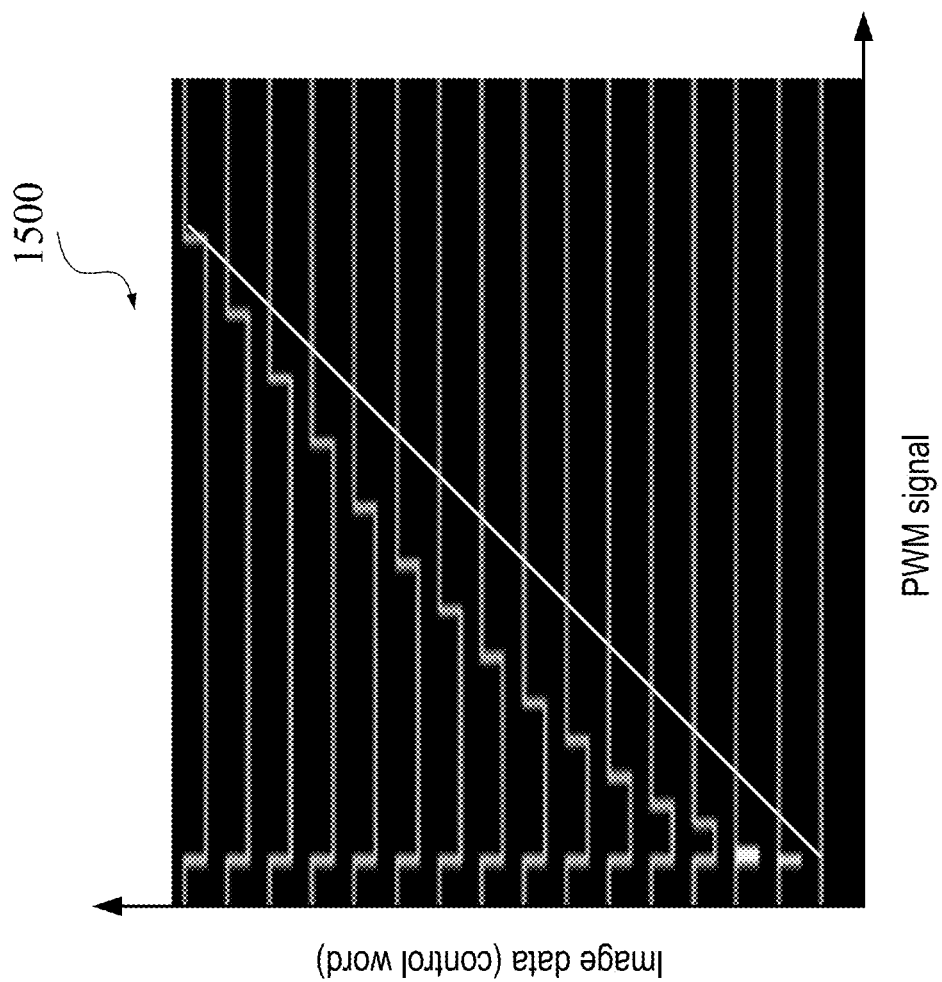
FIG. 15A illustrates an example of improving perceived bit depth by modifying pulse-width modulation timing based on a non-linear power-law transformation according to certain embodiments.

FIG. 15A include a chart 1500 illustrating an example of improving perceived bit depth by modifying PWM timing based on a non-linear power-law transformation according to certain embodiments. Human eyes may response to light nonlinearly. The perceived brightness B may be a nonlinear function of the luminance L of a light beam according to $B=L^{1/\gamma}$, where $\gamma$ (gamma) may be greater than 1, such as between about 1.5 and 3 (e.g., around 2). Therefore, as the luminance L increases, more and more additional light may be needed to create a perceptible difference in brightness. In other words, when the luminance is low, a small change in the luminance may cause a large change in the perceived brightness; however, when the luminance is high, a large change in the luminance may only cause a small change in the perceived brightness. Thus, if the control word representing the intensity level or brightness of a unit pixel is linearly transformed into the ON time or the pulse width, the perceived brightness of the emitted light by human eyes may not correspond to the control word or the desired brightness, and some changes in the luminance at the high luminance levels may not be noticed by human eyes. Due to the sensitivity of human eyes at low luminance levels, the perceived bit depth may be effectively increased if increasing the value of the control word by one may cause the luminance of the emitted light to increase by a smaller amount when the luminance level is low, while increasing the value of the control word by one may cause the luminance of the emitted light to increase by a larger amount when the luminance level is high.

In the example illustrated in FIG. 15A, the unit pixel may have 4 bitcells and thus a physical bit depth of 4, which may correspond to 16 different control word values 0-15. When the control word value is small, increasing the control word value by 1 may cause a small change in the pulse width or the ON time (and thus the luminance), which may still cause the perceived brightness to be increased by a large amount due to the sensitivity of human eyes at low luminance levels. When the control word value is large, increasing the control word value by 1 may cause a large change in the pulse width or the ON time (and thus the luminance) in order to cause a noticeable change in the perceived brightness. In this way, the perceived bit depth may be higher than the physical bit depth, for example, by about 1.5 bits. Thus, a unit pixel with 4 bitcells may have a perceived bit depth of about 5.5 bits.

Increasing the perceived bit depth using the non-linear gamma-law transformation may need some additional circuits, such as a circuit to determine the pulse width modulation based on the control word and the non-linear power law, or a look-up table to store the relationship between the control word value and the pulse width.

Figure 15B:
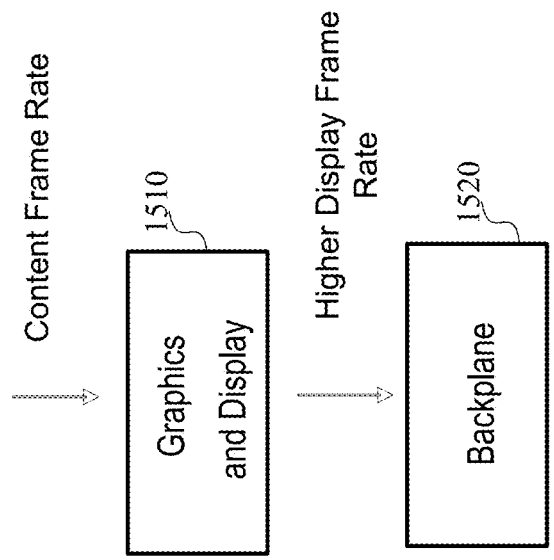
FIG. 15B illustrates an example of improving the perceived bit depth using temporal dithering according to certain embodiments.

FIG. 15B illustrates an example of improving the perceived bit depth using temporal dithering according to certain embodiments. Temporal dithering (also known as frame rate control) may be achieved by increasing the frame rate of the display and cycling between images of different intensity levels within each original content frame period to simulate an intermediate intensity level and thus effectively increase the bit depth. For example, video data with a certain content frame rate may be processed by a graphic and display processing unit 1510 that creates sub-frames based on the original content frames. The sub-frames may include image frames that have different intensity levels and need to be cycled through during an original content frame period. The new sub-frames may then be displayed by a backplane driver 1520 at a higher frame rate to simulate intensity levels that are different from the intensity levels of the sub-frames. In this way, many different color levels can be produced by including more sub-frames in an original content frame period. However, increasing the perceived bit depth using temporal dithering may significantly increase the power consumption due to the increased frame rate that may be two times, three times, four times, or higher.

As described above, since the 2-D array of unit pixels in a display panel may have a linear dimension of a few millimeters, control signals that are generated by periphery circuits for unit pixels in the middle of the 2-D array of unit pixels, such as the word lines and the bit lines signals for the bitcells and the counter data bits, may need to travel a long distance before reaching the target unit pixels. The long wires for these signals may have high resistances and high capacitances (loading), and thus may have high losses and long RC time delays for the signals. The long wires may also have large inductance values and hence low bandwidths, and thus may increase the rise and/or fall time of the signals, which may affect the time margin of the device.

Figure 16A:
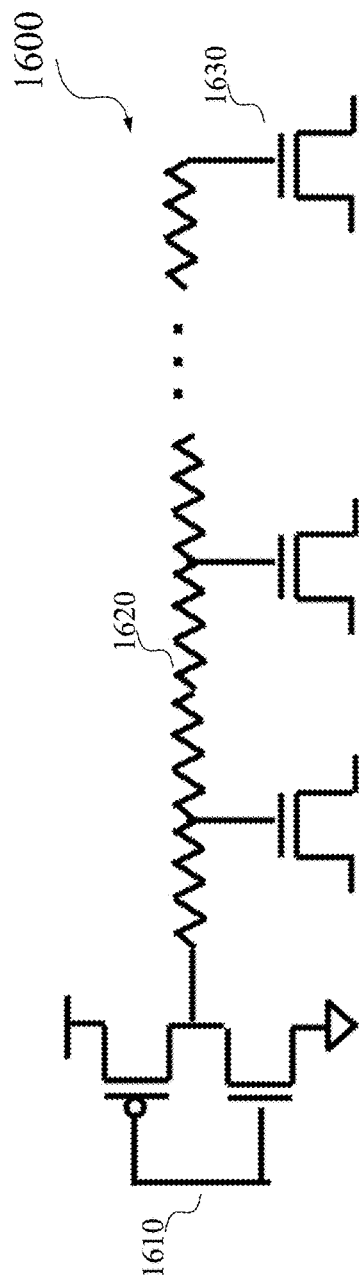
FIG. 16A illustrates a simplified model of a drive circuit in an example of micro-LED display panel shown in FIG. 14.

FIG. 16A illustrates a simplified model 1600 of a drive circuit in an example of micro-LED display panel shown in FIG. 14. In the illustrated example, a driver 1610 (e.g., an inverter) may drive a long interconnect wire 1620. A plurality of load devices 1630 (e.g., transistors, gates, or the like) may be coupled to interconnect wire 1620 at different distances from driver 1610.

Figure 16B:
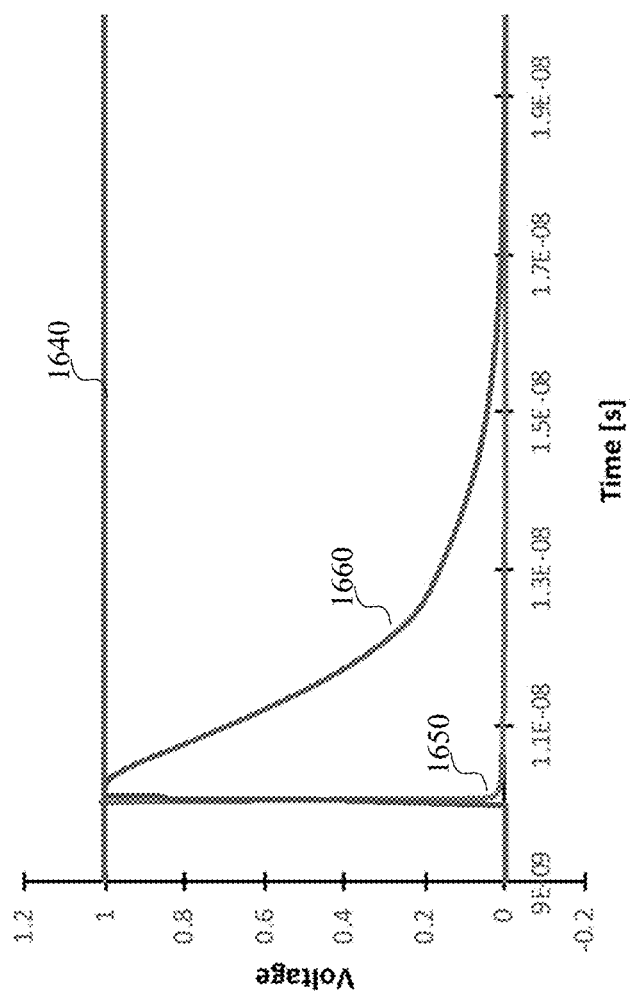
FIG. 16B illustrates an example of a simulated waveform at the end of the driver circuit shown in FIG. 16A.

FIG. 16B illustrates an example of a simulated waveform at the end of the driver circuit shown in FIG. 16A. In FIG. 16B, a curve 1640 shows the input signal (e.g., a rising edge) to driver 1610 (e.g., an inverter). A curve 1650 shows the output signal (e.g., a falling edge) of driver 1610. Because an inverter is used as an example of driver 1610, the output signal may be the opposite of the input signal. A curve 1660 shows the drive signal received by the last load device 1630 on interconnect wire 1620. Because no buffers or repeaters are used on interconnect wire 1620, when the output signal of driver 1610 reach the last load device 1630, the falling time may become much longer as shown by curve 1660.

Figure 17B:
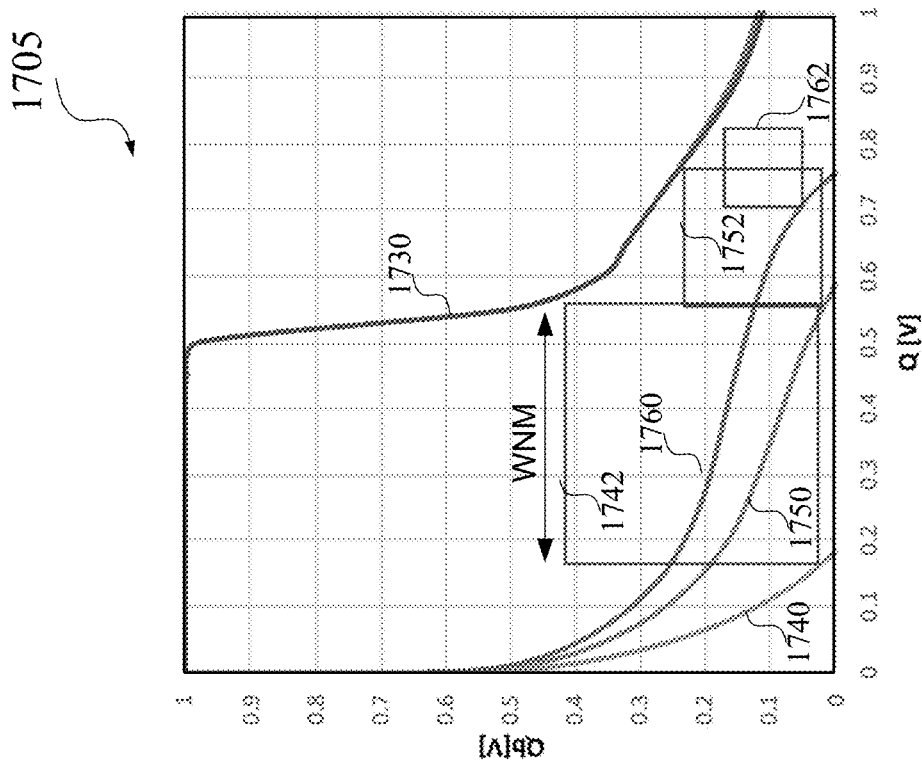
FIG. 17B illustrates examples of simulated write noise margins of bitcell with different bit line wire resistances.
Figure 17A:
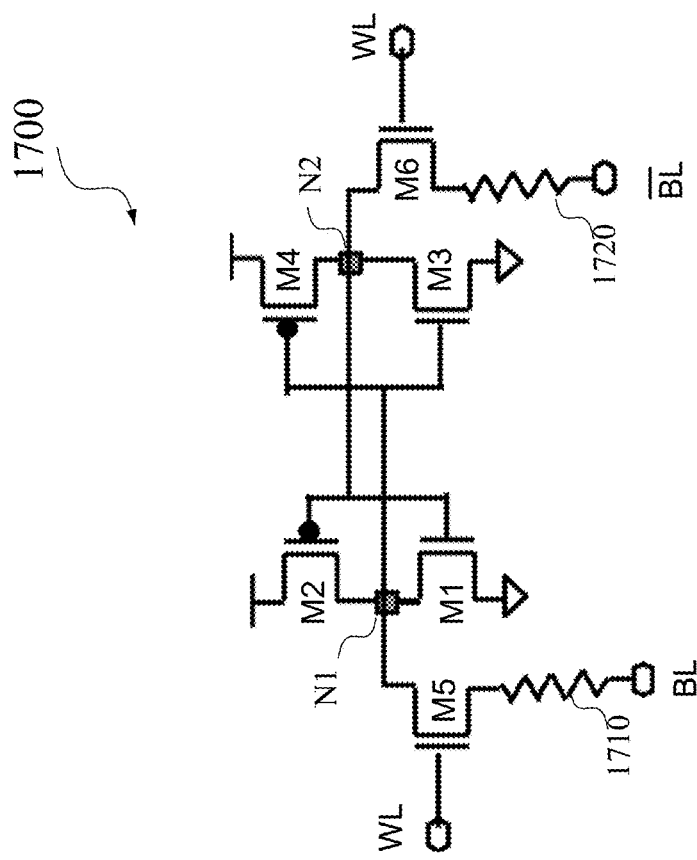
FIG. 17A illustrates a simplified model of a bitcell with long bit lines.

FIG. 17A illustrates a simplified model of a bitcell 1700 with long bit lines 1710 and 1720. Bitcell 1700 may be similar to the 6-transistor SRAM cell 1200 or 1210 described above. In the illustrated example, bit line BL 1710 and inverse bit line $\overline{BL}$ 1720 may have a length of about 1.5 mm. As described with respect to FIG. 12A, during the write operation, a new value may be forced into the SRAM cell to break the cell stability if the new value is different from the stored value. For example, an internal node N1 may be at a low level and bit line BL 1710 may at a high level, while an internal node N2 may be at a high level and inverse bit line $\overline{BL}$ 1720 may be at a low level.

FIG. 17B includes a chart 1705 illustrating examples of simulated write noise margins (WNMs) of bitcell 1700 with different bit line wire resistances. In the simulations, bit line BL 1710 and inverse bit line $\overline{BL}$ 1720 may have a low resistance (e.g., a wider and/or shorter metal trace), a medium resistance (e.g., a metal trace with a medium width and/or length), and a high resistance (e.g., a narrow and/or long metal trace). The simulated read voltage transfer curves for the different resistances may be about the same as shown by read voltage transfer curves 1730. The simulated write voltage transfer curves for the low, medium, and high resistances may be shown by write voltage transfer curves 1740, 1750, and 1760, respectively. The write noise margin may be determined based on the side of the largest square between the read voltage transfer curve and the write voltage transfer curve of a same memory cell. Therefore, when the bit lines include wider and/or short metal traces and thus have low resistances, the largest square between a read voltage transfer curve 1730 and the corresponding write voltage transfer curve 1740 may be a square 1742, which shows a large write noise margin. When the bit lines include narrow and/or long metal traces and thus have high resistances, the largest square between a read voltage transfer curve 1730 and the corresponding write voltage transfer curve 1760 may be a square 1762, which shows a small write noise margin. When the bit lines include metal traces with medium width and/or length and thus have medium resistances, the largest square between a read voltage transfer curve 1730 and the corresponding write voltage transfer curve 1750 may be a square 1752, which shows a medium write noise margin. Thus, to achieve a sufficiently high write noise margin, the long bit line BL 1710 and inverse bit line $\overline{BL}$ 1720 may need to have a wider trace, which may use a larger routing area. Alternatively or additionally, the supply voltage VDD may be increased, for example, by about 300 mV or higher, to mitigate the noise margin reduction caused by the large resistance. However, increasing the VDD may cause the power consumption (approximately proportional to the square of VDD) to increase significantly.

In addition, in the examples of 2-D arrays of unit pixels shown in FIGS. 12B-14, each bit line may need to drive a few thousand of bitcells (e.g., >4,000 bitcells), and each word line may need to drive a few hundred of bitcells (e.g., close to about 1,000 bitcells). However, for SRAM, the foundry recommended maximum loading may be about 256 bitcells per bit line, and about 512 bitcells per word line.

Furthermore, due to the small size of the LED drive transistor and the variability of the LED drive transistor (e.g., caused by the random dopant fluctuation), the drive currents of the micro-LEDs and therefore the brightness of the micro-LEDs may also vary significantly.

Figure 18:
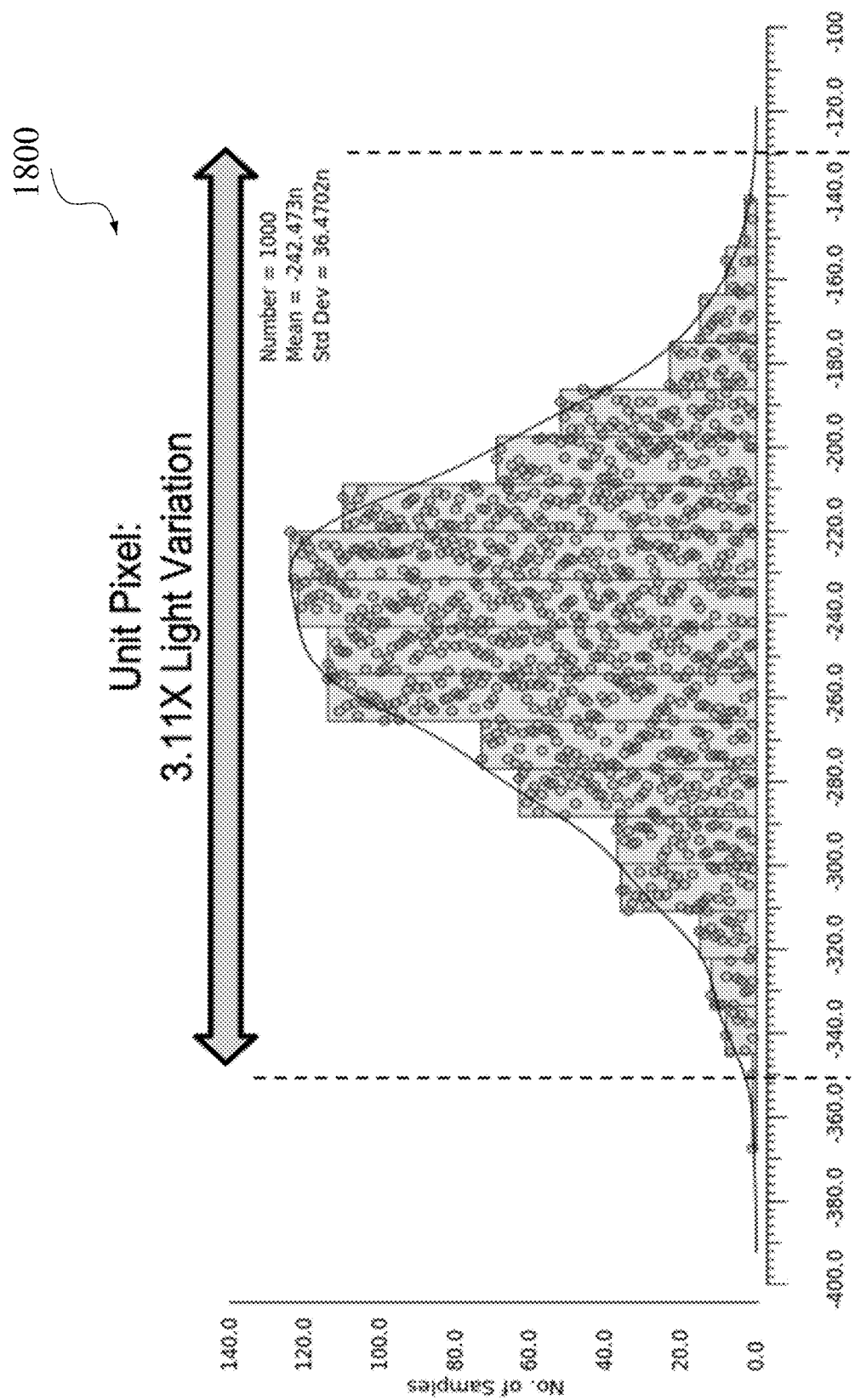
FIG. 18 illustrates an example of the distribution of the analog drive current of a CMOS driver due to the variation of the LED drive transistor.

FIG. 18 includes a chart 1800 illustrating an example of the distribution of the analog drive current of a CMOS driver due to the variation of the LED drive transistor. As illustrated in chart 1800, the target drive current may be about 240 nA. However, due to the random dopant fluctuation and small size of the LED drive transistor, the drive current may vary, from example, from about 130 nA to about 350 nA, with a sigma ($\delta$) of about 36 nA. Based on the expected typical light output for drive currents within ±3 sigma from the mean drive current, the drive current variation shown in chart 1800 may result in a brightness difference of about 3.11 times. The brightness variation may be visible to human eyes and may need to be counteracted by calibration using some bits of the intensity data, which may reduce the effective bit depth of the intensity data.

Thus, in architectures based on unit pixels (e.g., as shown in FIGS. 12B-14), due to the limited available real estate for the pixel array driving circuits that need to drive thousands or millions of micro-LEDs having small pitches, the bit depth may be limited, non-standard SRAM cells may need to be used, repeaters and other periphery circuits may not be dispersed within the 2-D array of unit pixels, the resistance and loss of the control signals may be large for some circuits in the 2-D array, the brightness of the micro-LEDs may have a large variation, and there may be no space for DFT circuits. Therefore, it may be difficult to achieve the desired bit depth (e.g., 6 bits), low drive current and brightness variation, high noise margin, low power consumption, high yield using conventional foundry processes, and DFT functionality, using the unit pixel architectures.

According to certain embodiments, a macro-pixel architecture may be used to fit more bitcells and circuits with other functionality in the same available area for the array of micro-LEDs. The macro-pixel architecture may enable the sharing of some circuits among pixels and reduce some transition areas, such that a bit depth of 6 or more (e.g., 8 or 9) for each pixel in an array of pixels with an average pitch of about 1.8 μm may be possible, additional logic functionality may be included, and the circuits can be made more robust and manufacturable (e.g., with standard SRAM cells, wider interconnects, and low analog circuit mismatch). In the macro-pixel architecture disclosed herein, some circuits (e.g., comparators) may be shared among multiple adjacent pixels (e.g., by time-division multiplexing). In addition, bitcells (e.g., memory such at SRAM cells), digital logic, and high-voltage LED drive transistors may each be grouped together in contiguous layout regions to reduce the transition regions that may otherwise be needed because abutting different types of circuits would need transition regions and spacing according to the design and process rules. Cluster the same type of circuits in contiguous layouts can minimize the "transition regions" between different types of circuits and leave more space for other circuits or components.

According to one example disclosed herein, a macro-pixel may include 8 or more pixels, such as 12 pixels. The macro-pixel may include bitcells (e.g., SRAM cells) organized in a contiguous 2-D array that includes 12 words with 6 bits per word. The contiguous 2-D array of bitcells may include standard foundry SRAM cells, rather than custom designed bitcells as in the unit-pixel design, and thus may be more reliably manufactured at foundries. The input-output (I/O) circuits for the contiguous 2-D array of bitcells may perform similar functions as the SRAM periphery circuits in standard foundry SRAM arrays. The macro-pixel may also include other types of circuits (e.g., digital logic, analog circuits, high-voltage circuits, etc.) that are also arranged in contiguous arrays based on the types of the circuits, thereby reducing the transition regions between different types of circuits and leaving more space for additional circuits and functionality. In addition, the comparator logic that compares the pixel values from the SRAM to a counter value may be shared by the 12 pixels through time-division multiplexing to further reduce the silicon area used. A PWM latch circuit for each pixel may be set or cleared based on the comparator output, which may be generated based on the state of a PWM signal with respect to the counter value. The output of the PWM latch circuit may control an analog circuit (e.g., a micro-LED driver or current mirror) including a thick-oxide transistor to provide a constant current to the micro-LED for different durations to produce light of different intensities. Due to the extra space available as a result of the circuit sharing and transition region reduction, a DFT circuit may be included in the pixel array driving circuits to gain observability to, for example, the PWM latch state, the current mirror and/or micro-LED I-V characteristics, and the like. The high area efficiency of the macro-pixel may also enable more design flexibility, such as the use of standard bitcells and design rules described above, thereby increasing manufacture portability and enabling the flexibility of selecting manufacture partners based on other technical or business capabilities.

Figure 19A:
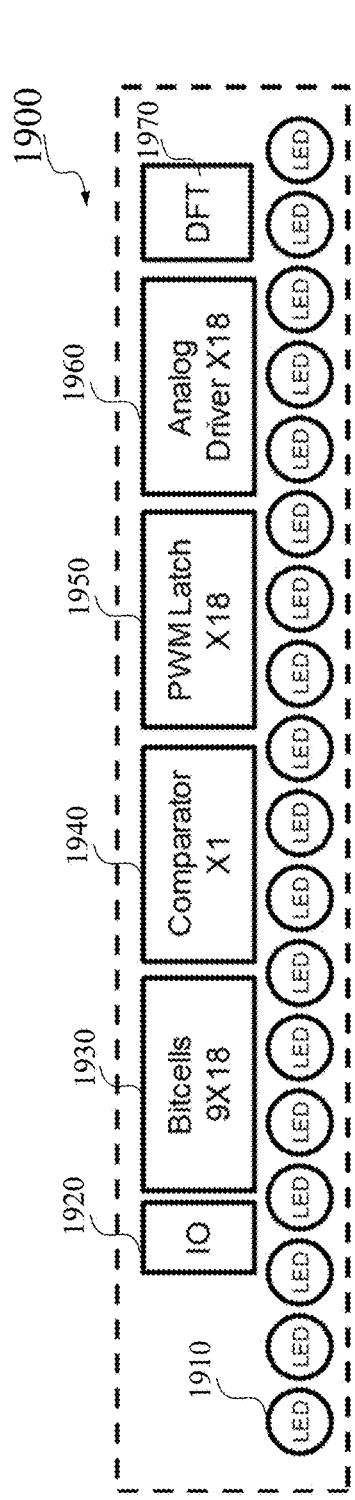
FIG. 19A illustrates an example of a macro-pixel in a display panel according to certain embodiments.

FIG. 19A illustrates an example of a macro-pixel 1900 in a display panel according to certain embodiments. In the illustrated example, macro-pixel 1900 may include 18 micro-LEDs 1910 and circuits for driving the 18 micro-LEDs 1910. The circuits for driving the 18 micro-LEDs 1910 may include an IO circuit 1920, 9 bitcells 1930 for each micro-LED 1910, a shared comparator 1940, a PWM latch circuit 1950 for each micro-LED 1910, an analog driver circuit 1960 for each micro-LED 1910, and a DFT circuit 1970. As described above, micro-LEDs 1910 and the driving circuits may be fabricated on different wafers and then bonded together through, for example, die-to-wafer or wafer-to-wafer bonding. In some embodiments, at least a portion of the driving circuits may be implemented using TFTs.

Even though macro-pixel 1900 shown in FIG. 19A includes 18 micro-LEDs 1910 and circuits for driving the 18 micro-LEDs 1910, the macro-pixel disclosed herein can include any number of micro-LEDs and the corresponding driving circuits. For example, a macro-pixel may include 8, 10, 12, 16, 18, or more micro-LEDs and the corresponding driving circuits. In addition, the bit depth for each micro-LED may be different from 9, such as 6 or 8. In some embodiments, a macro-pixel may not include DFT circuit 1970. In some embodiments, the macro-pixel may include some periphery circuits.

Bitcells 1930 in macro-pixel 1900 may include standard SRAM cells, such as 6T SRAM cells described above, and thus may be arranged into an array of SRAM cells as in other SRAM memory devices to optimize the floor plan and layout. Comparator 1940 may be similar to comparators 1104 and 1320 described above, but may be shared by all pixels in macro-pixel 1900, for example, through time-division multiplexing. In one example, comparator 1940 may compare a counter value with each read-out control word one at a time. PWM latch circuit 1950 may be similar to PWM latch circuits 1106 and 1330 described above. Analog driver circuits 1960 may be similar to LED driver circuit 1108 or analog driver circuits 1340 described above. DFT circuit 1970 may be used to measure, for example, current-voltage (I-V) characteristics of devices and components in the circuits, such as the digital logic, SRAM, analog devices, or other circuit components.

Because of the sharing of some circuits (e.g., the comparator) among the pixels, the size of the macro-pixel that include multiple pixels can be much smaller than the total size of the same number of unit pixels. Furthermore, the floor plan and layout of macro-pixel 1900 can be optimized by arranging circuits of the same type together as described in detail below to reduce transition regions between different types of circuits, thereby further reducing the silicon area used by the macro-pixel.

Figure 19B:
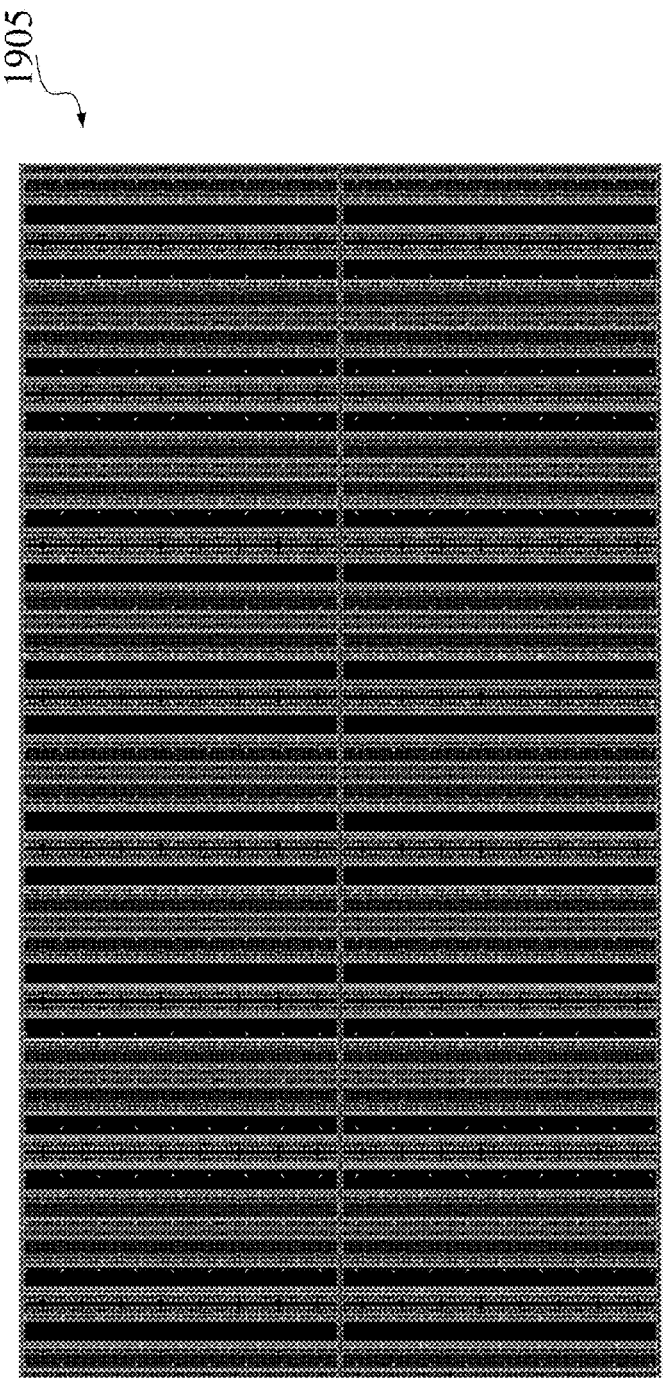
FIG. 19B illustrates an example of a floor plan of a display panel including macro-pixels according to certain embodiments.

FIG. 19B illustrates an example of a floor plan 1905 of a display panel including macro-pixels according to certain embodiments. In the illustrated example, macro-pixels 1900 described above may be arranged into a 2-D array to form the display backplane for the 2-D array of micro-LEDs. For example, macro-pixels 1900 may be arranged into a hierarchical structure that includes many slices, where each slice may include multiple subarrays, and each subarray may include multiple macro-pixels. In some implementations, periphery circuits and/or repeaters may be included in each slice, each subarray, or each macro-pixel. In some implementations, periphery circuits and/or repeaters may be included in some but not all slices, some but not all subarrays, or some but not all macro-pixels. For example, repeaters may only be included in regions that may be far from the periphery of the 2-D array, such as regions close to the center of the 2-D array.

Figure 20A:
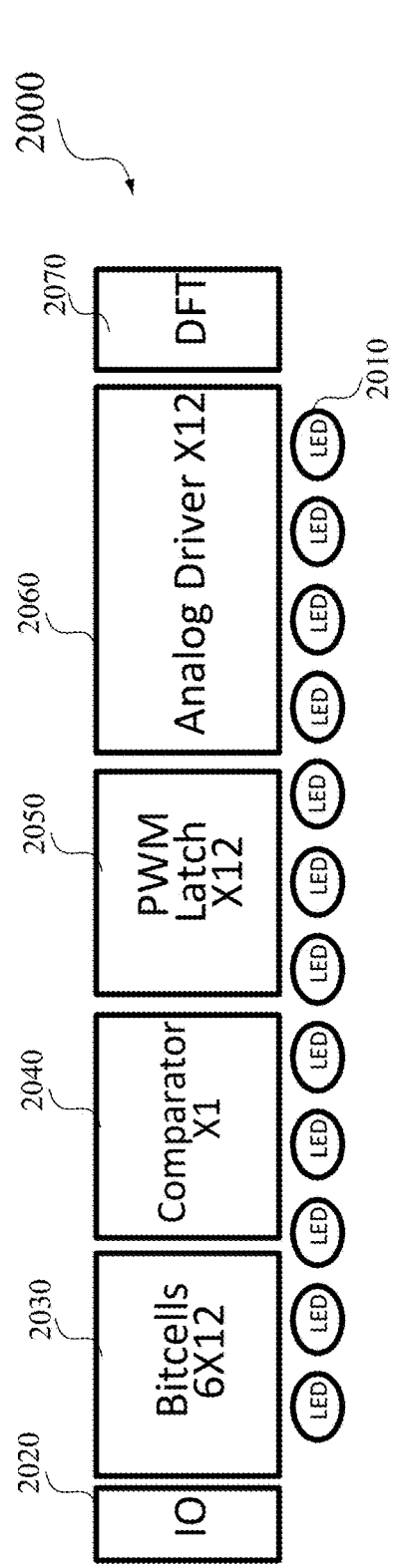
FIG. 20A illustrates another example of a macro-pixel in a display panel according to certain embodiments.

FIG. 20A illustrates another example of a macro-pixel 2000 in a display panel according to certain embodiments. In the illustrated example, macro-pixel 2000 may include 12 micro-LEDs 2010 and circuits for driving the 12 micro-LEDs 2010. The circuits for driving the 12 micro-LEDs 2010 may include an I/O circuit 2020, 6 bitcells 2030 for each micro-LED 2010, a shared comparator 2040, a PWM latch circuit 2050 for each micro-LED 2010, an analog driver circuit 2060 for each micro-LED 2010, and a DFT circuit 2070. As described above, micro-LEDs 2010 and the circuits for driving micro-LEDs 2010 may be fabricated on different wafers and then bonded together through, for example, die-to-wafer or wafer-to-wafer bonding. In some embodiments, at least a portion of the circuits for driving micro-LEDs 2010 may be implemented using TFTs.

Bitcells 2030 in macro-pixel 2000 may include standard SRAM cells, such as 6T SRAM cells described above, and thus may be arranged into an array of SRAM cells as in other SRAM memory devices to optimize the floor plan and layout. Comparator 2040 may be similar to comparator 1940 described above, and may be shared by all pixels in macro-pixel 2000 through time-division multiplexing. For example, comparator 2040 may compare the counter value with each read-out control word one at a time. PWM latch circuit 2050 may be similar to PWM latch circuits 1106, 1330, and 1950 described above. Analog driver circuits 2060 may be similar to LED driver circuit 1108 or analog driver circuits 1340 or 1960 described above. DFT circuit 2070 may be similar to DFT circuit 1970 and may be used to measure, for example, current-voltage (I-V) characteristics of devices and components in the circuits, such as the digital logic, SRAM, analog devices, PWM latch circuits 2050, or other circuit components.

Figure 20B:
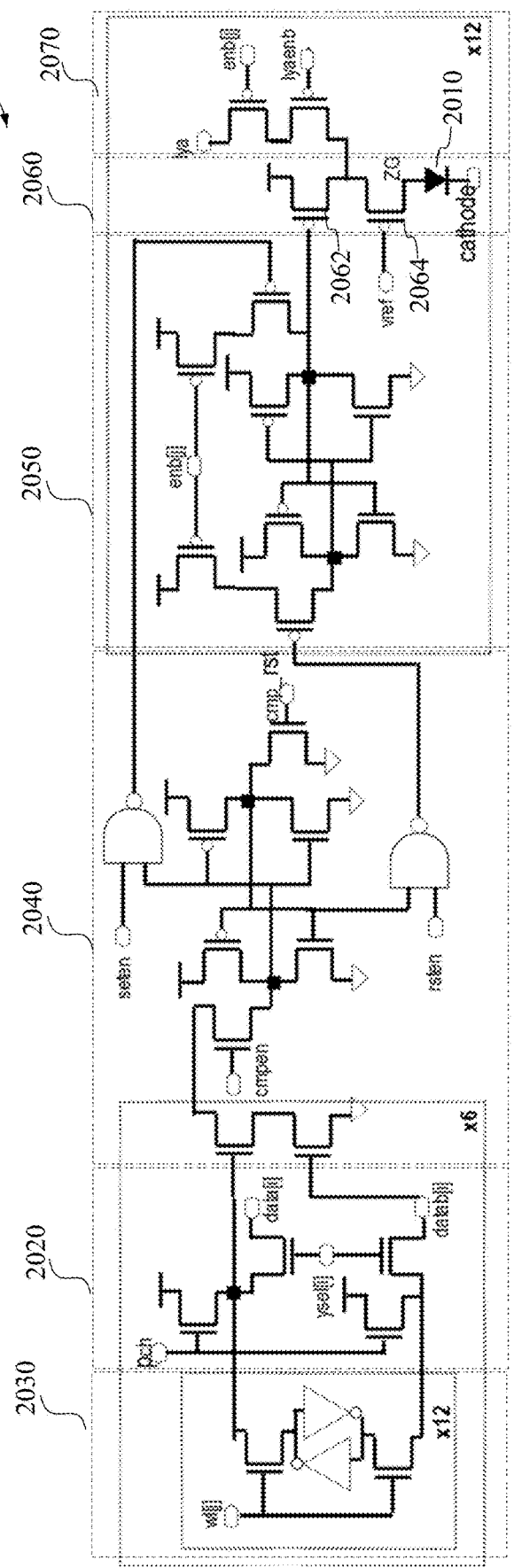
FIG. 20B includes a simplified schematic illustrating circuits of the example of macro-pixel shown in FIG. 20A according to certain embodiments.

FIG. 20B includes a simplified schematic illustrating circuits of the example of macro-pixel 2000 shown in FIG. 20A according to certain embodiments. In the illustrated example, bitcells 2030 may include 6×12 bitcells arranged into 6 rows and 12 column. Each of the 6 rows include 12 bitcells driven by the same bit lines and is connected to comparator 2040 by an I/O circuit 2020. Each of the 12 column includes 6 bitcells for storing a control word for a pixel. The 6 bitcells in each column are connected to a same word line and may be selected together. A detailed schematic of bitcells 2030 and I/O circuits 2020 is shown in FIG. 21 below.

Figure 21:
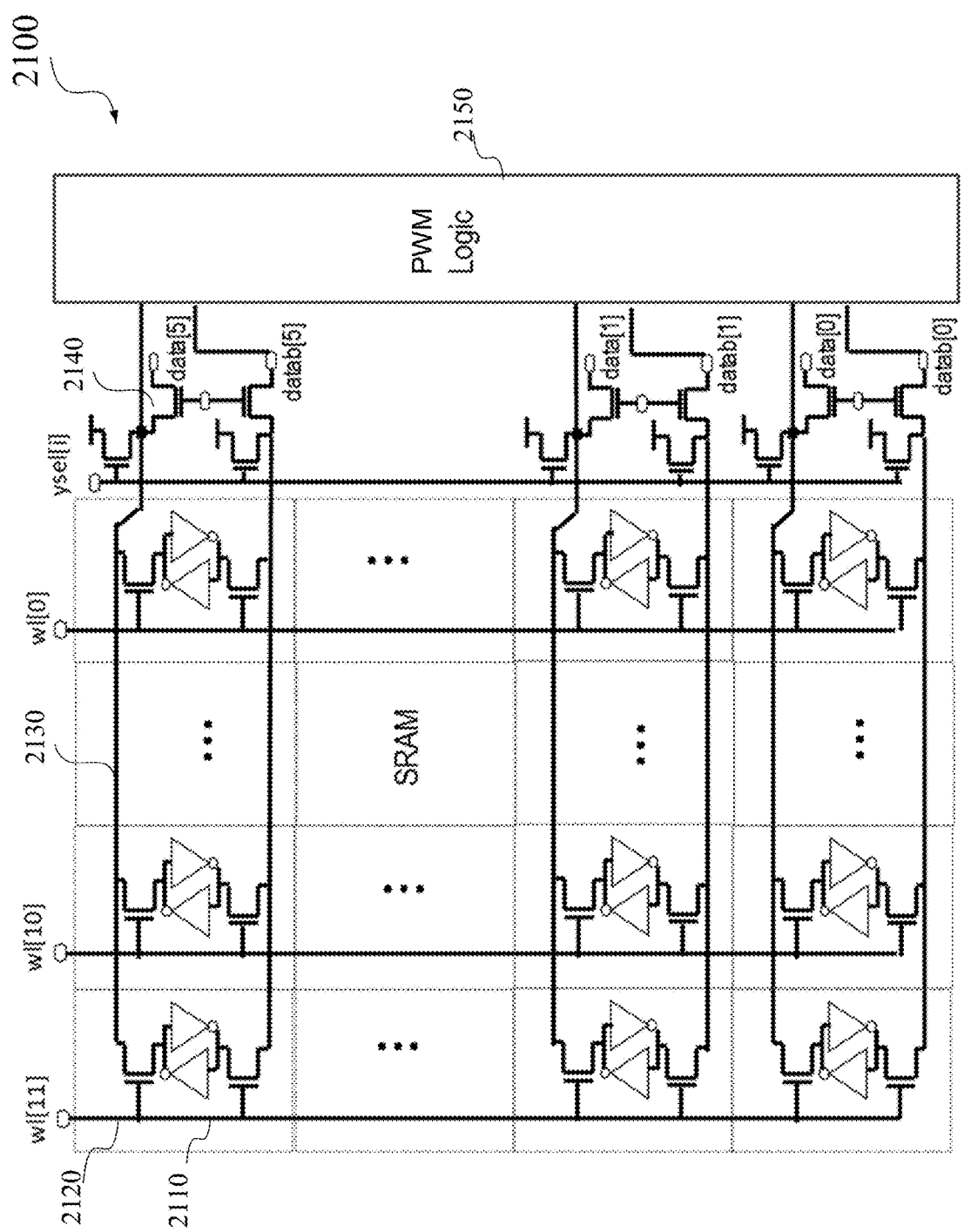
FIG. 21 illustrates a simplified schematic of a 2-D array of SRAM bitcells coupled to PWM logic through bit lines and input/output circuits in an example of a macro-pixel according to certain embodiments.

FIG. 21 illustrates a simplified schematic of a 2-D array of SRAM bitcells coupled to PWM logic through bit lines and I/O circuits in an example of a macro-pixel 2100 according to certain embodiments. Macro-pixel 2100 may be an example of macro-pixel 2000. In the illustrated example, macro-pixel 2100 may include 12 pixels, where each pixel may have a bit depth of 6. The 6×12 bitcells 2110 for the 12 pixels in macro-pixel 2100 may be arranged into a contiguous SRAM block that includes a contiguous 2-D array of SRAM cells and I/O circuits 2140 for reading the 2-D array of SRAM cells. Each bitcell 2110 may be a standard foundry SRAM cell that includes 6 transistors, a word line, and two bit lines as shown in FIGS. 12A and 21. There is no need to use an additional interconnect (e.g., interconnect 1212 shown in FIG. 12) to the internal storage node of the SRAM cell.

The SRAM block that includes the contiguous 2-D array of SRAM cells in macro-pixel 2100 may include 12 columns and 6 rows, where the 72 bitcells may be connected by 12 word lines 2120 (W[0], W[1], . . . and W[11]) and 12 bit lines 2130 (including inverse bit lines). The 6 bitcells in each column may be used to store the control word for a pixel and may be connected to a same word line 2120. The bit lines of 12 bitcells in each row may be connected together and may be connected to PWM logic 2150 through a respective I/O circuit 2140. When a word line 2120 (e.g., W[i]) is activated, the bitcells in the corresponding column may be read out, and the stored data bits may be sent through I/O circuits 2140 to PWM logic 2150 for generating the PWM signals to drive the micro-LED of the pixel. I/O circuits 2140 may be an example of I/O circuits 2020. PWM logic 2150 may include a shared comparator (e.g., comparator 2040), and PWM latches (e.g., PWM latch circuits 2050) for each pixel. The 12 control words stored in the 12 columns for 12 pixels may be read out sequentially to generate the corresponding PWM signals for controlling the corresponding micro-LEDs.

Referring back to FIG. 20B, a large portion of the comparator 2040 may be shared by the 12 pixels through, for example, time-division multiplexing. Comparator 2040 may be used to compare the stored control word for a pixel with a counter value from a counter in the periphery circuits as described above. The outputs of comparator 2040 for each pixel may be latched by the corresponding PWM latch circuit 2050 for the pixel, where the outputs of the corresponding PWM latch circuit 2050 may be the PWM signals for controlling the corresponding analog driver circuit 2060 of the pixel.

Analog driver circuit 2060 for each pixel may include an LED drive transistor 2064 controlled by a reference signal to control the level of the drive current supplied to the micro-LED 2010 of the pixel. LED drive transistor 2064 may be a thick gate-oxide transistor. The constant reference signal provided by a circuit outside of the macro-pixel to the gate of LED drive transistor 2064 may apply a constant $V_{GS}$ to LED drive transistor 2064 that may operate in the saturation region. Therefore, LED drive transistor 2064 may have an IDS at a constant level to function as a current mirror. Since a constant drive current (rather than a constant drive voltage) is supplied to micro-LED 2010, the variation in the contact resistance of micro-LED 2010 may not cause variation in the luminance of micro-LED 2010. A second LED drive transistor 2062 may be controlled by the PWM signals generated by the corresponding PWM latch circuit 2050 to turn on and off, such that the approximately constant drive current may be supplied to micro-LED 2010 during portions of a PWM frame that correspond to the PWM signals. Second LED drive transistor 2062 may be a thin gate-oxide transistor.

In the example illustrated in FIG. 20B, each pixel may include a DFFT circuit 2070. DFT circuit 2070 may be connected to analog driver circuit 2060 to measure, for example, the voltage at an internal node and/or the pulse width modulated current signal. In various embodiments, DFT circuit 2070 may also be connected to other nodes in analog driver circuit 2060, PWM latch circuit 2050, comparator 2040, or other circuits of the macro-pixel.

Figure 22:
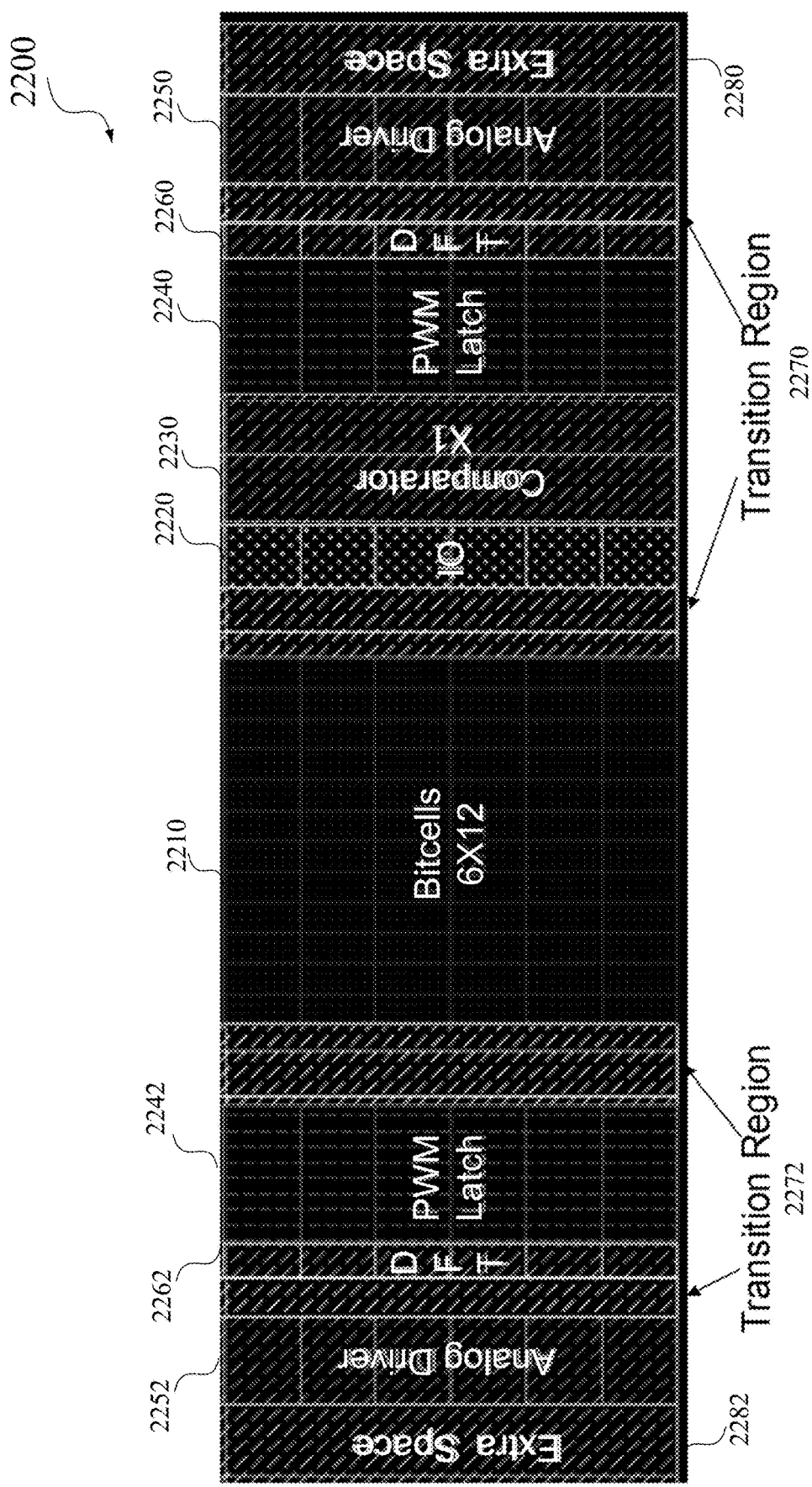
FIG. 22 illustrates an example of a floor plan of the example of macro-pixel according to certain embodiments.

FIG. 22 illustrates an example of a floor plan 2200 of the example of macro-pixel 2000 according to certain embodiments. A region 2210 in floor plan 2200 may be used for the 6×12 bitcells 2030 that are arranged into 6 rows and 12 columns, where the 6 bitcells 2030 in each column may be used to store the control word for a pixel. Six I/O circuits 2020 may be placed in a column in a region 2220 of floor plan 2200, where each I/O circuit 2020 may be aligned with a row of bitcells 2030 for sending a data bit of a control word to comparator 2040. There may be a transition region 2270 between region 2210 for bitcells 2030 and region 2220 for I/O circuits 2020 to isolate the bitcells (SRAM) and the I/O circuits (digital circuits), because of the different types of circuits, design rules, and/or fabrication processes for bitcells 2030 and I/O circuits 2020. The minimum width of the transition regions between two different types of circuits may depend on, for example, the types of circuits, the desired performance (e.g., low noise), the operating conditions, and the manufacture capability, and the like.

Comparator 2040 may be placed in a region 2230 next to I/O circuits 2020. Six PWM latch circuits 2050 for six pixels may be placed in a region 2240 next to comparator 2040. DFT circuits 2070 for the same six pixels may be placed in a region 2260 next to region 2240. The other six PWM latch circuits 2050 for the other six pixels of macro-pixel 2000 may be placed in a region 2242 that is separated from region 2210 for bitcells 2030 by a transition region 2272. DFT circuits 2070 for the other six pixels may be placed in a region 2262 next to region 2242. Digital circuits including I/O circuits 2020, comparator 2040, PWM latch circuits 2050, and DFT circuit 2070 can be placed together in a contiguous region without transition regions or spacing between them.

Analog driver circuits 2060 may be placed in regions separated from the digital circuits, such as PWM latch circuits 2050 and DFT circuits 2070, by a transition region to separate the analog circuits and digital circuits. For example, analog driver circuits 2060 for six pixels may be placed in a region 2250, and analog driver circuits 2060 for the other six pixels may be placed in a region 2252. Region 2250 may be separated from region 2260 by a transition region 2270, while region 2252 may be separated from region 2262 by a transition region 2272.

Because the transition regions in floor plan 2200 may be minimized and comparator 2040 may be shared among pixels in the macro-pixel, the size of the macro-pixel may be smaller than the total size of 12 micro-LEDs on the micro-LED die. Therefore, there may be some extra space 2280 and 2282 in floor plan 2200 for each macro-pixel. As described above, the extra space in multiple macro-pixels may be used to place, for example, wider traces, larger analog circuits and devices (e.g., transistors), repeaters, buffers, NAND gates (e.g., for addressing), clocking circuits, circuits for turning off certain macro-pixels, or other periphery circuits.

Figure 23A:
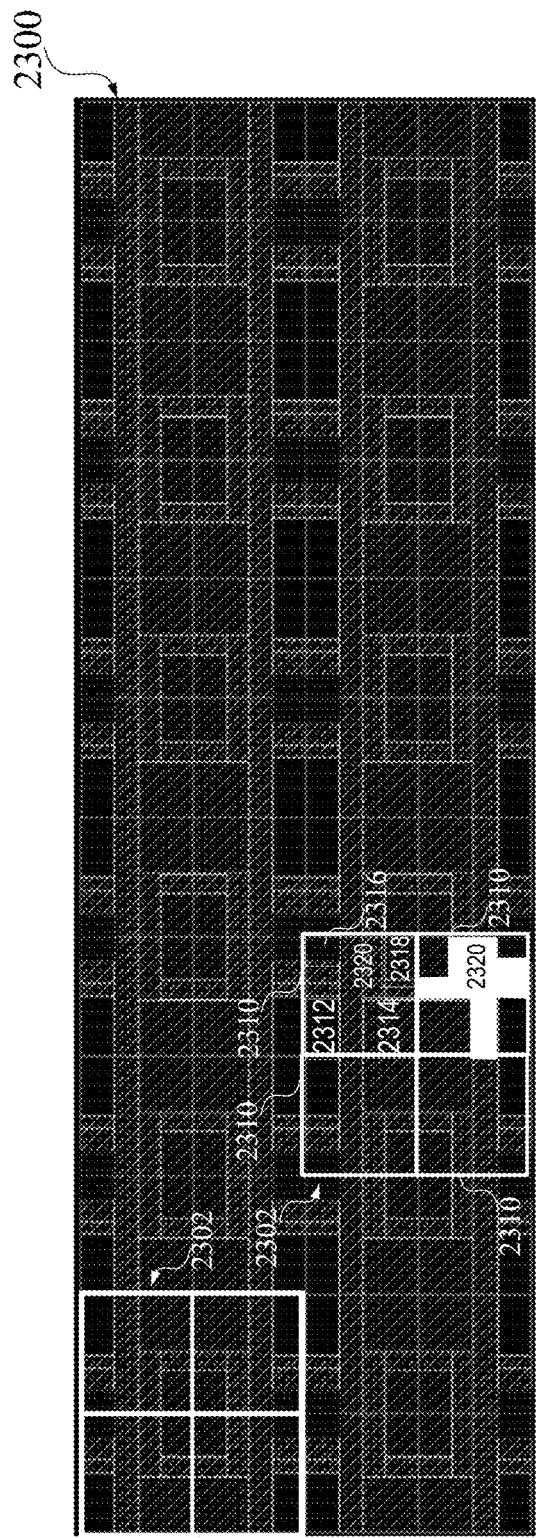
FIG. 23A illustrates an example of a portion of a floor plan of a display panel including an array of unit pixels.

FIG. 23A illustrates an example of a portion of a floor plan 2300 of a display panel including an array of unit pixels. Each unit pixel may be placed in a region 2310 that include multiple sub-regions, such as a sub-region 2312 for placing 4 bitcells, a sub-region 2314 for a comparator, a sub-region 2316 for a PWM latch circuit, a sub-region 2318 for an analog driver circuit. In the illustrated example, 4 unit-pixels may form a tile 2302, where the bitcells of the 4 adjacent unit pixels may be placed together and surrounded by transition regions 2320. Similarly, the comparators of 4 adjacent unit pixels may be placed together and surrounded by transition regions 2320, the PWM latch circuits of 4 adjacent unit pixels may be placed together and surrounded by transition regions 2320, and the analog driver circuits of 4 adjacent unit pixels may be placed together and surrounded by transition regions 2320. Tiles 2302 may be repeated to form a 2-D array of unit pixels. The portion of the floor plan shown in FIG. 23 may include 12 tiles 2302 that include 48 unit pixels.

As shown in FIG. 23A, a large portion (e.g., about 30% to about 50%) of the region 2310 for each unit pixel may be used as transition regions 2320. Thus, there may not be space for fitting more bitcells in region 2310 for each unit pixel. In the example illustrated in FIG. 23A, each unit pixel may only include 4 bitcells. Therefore, the display panel may need to use other techniques to increase the perceived bit depth to 6 or more bits, such as the power-law transformation and/or temporal dithering techniques described above, which may cause a very high power consumption. In addition, region 2310 for each unit pixel may not have space for I/O circuits, DFT circuits, repeaters, buffers, or other periphery circuits.

Figure 23B:
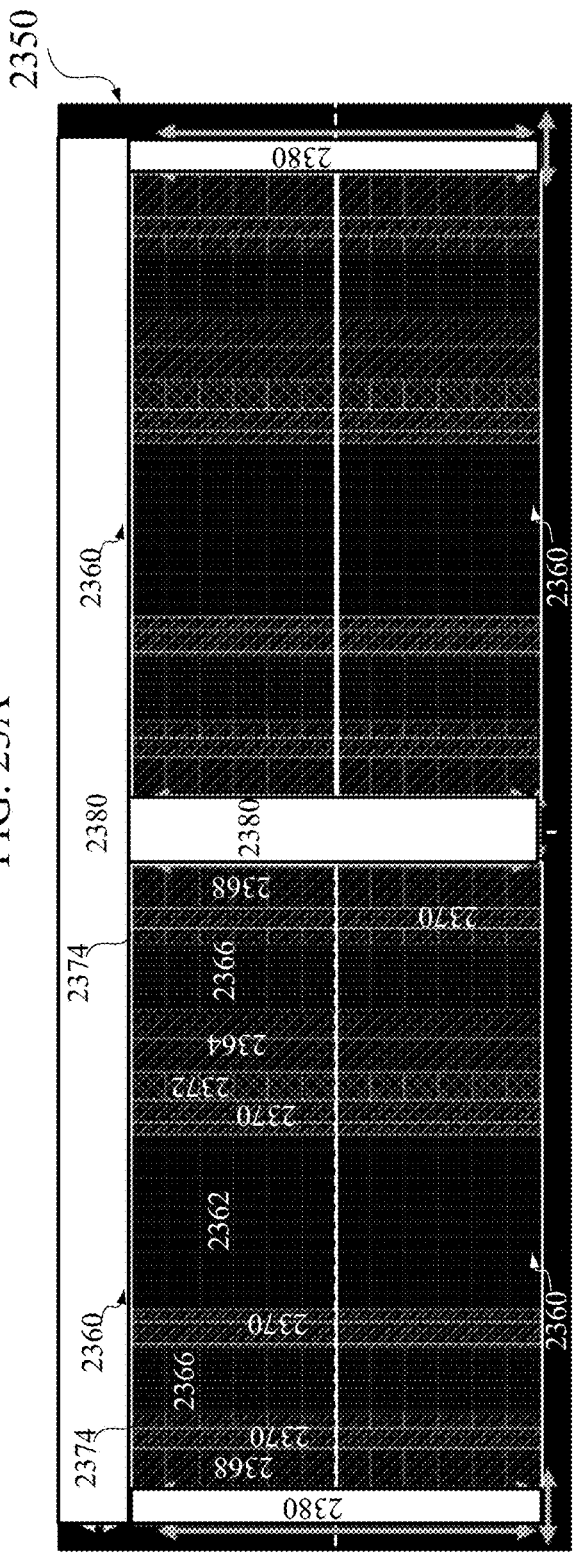
FIG. 23B illustrates an example of a portion of a floor plan of a display panel including an array of macro-pixels according to certain embodiments.

FIG. 23B illustrates an example of a portion of a floor plan 2350 of a display panel including an array of macro-pixels according to certain embodiments. The total area of floor plan 2350 may be the same as the total area of floor plan 2300, and may also be the same as the total area of 48 micro-LEDs in an array of micro-LEDs. The portion of the floor plan 2350 of the display panel may include 4 regions 2360, where each region 2360 may be used to place one macro-pixel that includes 12 pixels. The four regions 2360 shown in FIG. 23B may be used to place the drive circuits for 12×4 pixels. Each macro-pixel may have a floor plan as shown in FIG. 22, and may include a sub-region 2362 for placing 6×12 bitcells, a sub-region 2372 for placing I/O circuits, a sub-region 2364 for placing a comparator, sub-regions 2366 for placing PWM latch circuits, sub-regions 2374 for placing DFT circuits, and sub-regions 2368 for placing analog driver circuits. Each region 2360 may also include some transition regions 2370, which may only occupy a small portion (e.g., less than about 20%, 15%, or 10%) of region 2360 as shown in FIG. 23B.

Compared with floor plan 2300 shown inn FIG. 23A, floor plan 2350 may fit more bitcells (e.g., 6 bitcells) for each pixel, include additional circuits (e.g., DFT circuits), and use a smaller area. There may also be some extra space 2380 that can be used to place other circuits, such as local control circuits, buffers, repeaters, and the like. The higher area efficiency of the macro-pixel may enable more design flexibility, such as the use of standard bitcells and design rules, thereby increasing manufacture portability and enables the selection of manufacture partners based on other considerations.

Figure 24A:
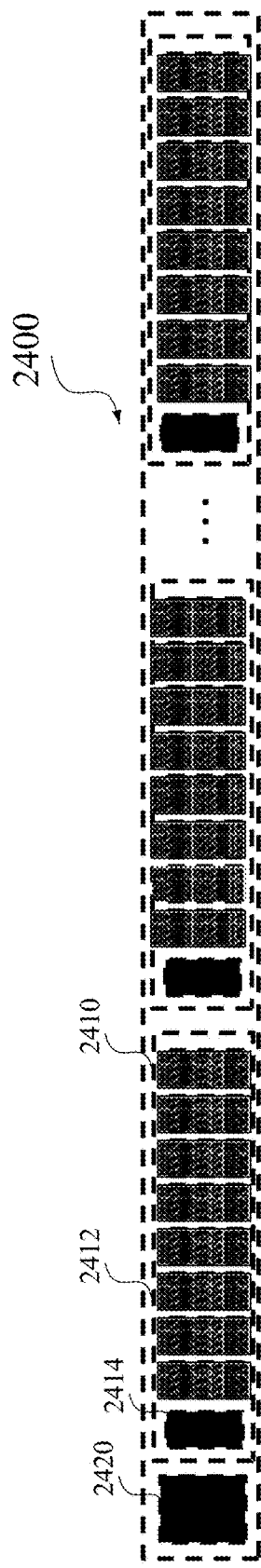
FIG. 24A illustrates a simplified block diagram of an example of a slice of a display panel including an array of macro-pixels according to certain embodiments.

FIG. 24A illustrates a simplified block diagram of an example of a slice 2400 of a display panel including an array of macro-pixels according to certain embodiments. In the example shown in FIG. 24A, slice 2400 may include a plurality of sub-arrays 2410 that may be arranged in a linear array. Each sub-array 2410 may include a plurality of macro-pixels 2412 arranged in an array. In the example shown in FIG. 24A, each sub-array 2410 may include 8 macro-pixels 2412. As described above, each macro-pixel 2412 may include multiple pixels, such as 8, 10, 12, 16, or 18 pixels. In the example shown in FIG. 24A, each macro-pixel may include 12 pixels. Therefore, each sub-array 2410 may include driving circuits for 96 micro-LEDs, including, for example, 6×12×8=576 bitcells.

In addition, each sub-array 2410 may include a local repeater and periphery logic 2414, which may include, for example, one or more repeaters (e.g., inverters to boost signal level and regulate waveform), buffers, circuits for sub-array addressing (e.g., a decoder to select a sub-array), clocking circuits, local control circuits (e.g., for turning off or gating the clock to a sub-array), and/or other circuits for supporting data movement. Furthermore, each slice may include additional slice-level periphery circuit 2420, which may include, for example, counter circuits for generating a counter value to generate the PWM signals, a power-law look-up table, column drivers, row drivers, circuits for selecting a slice or turning off a slice, and the like.

Figure 24B:
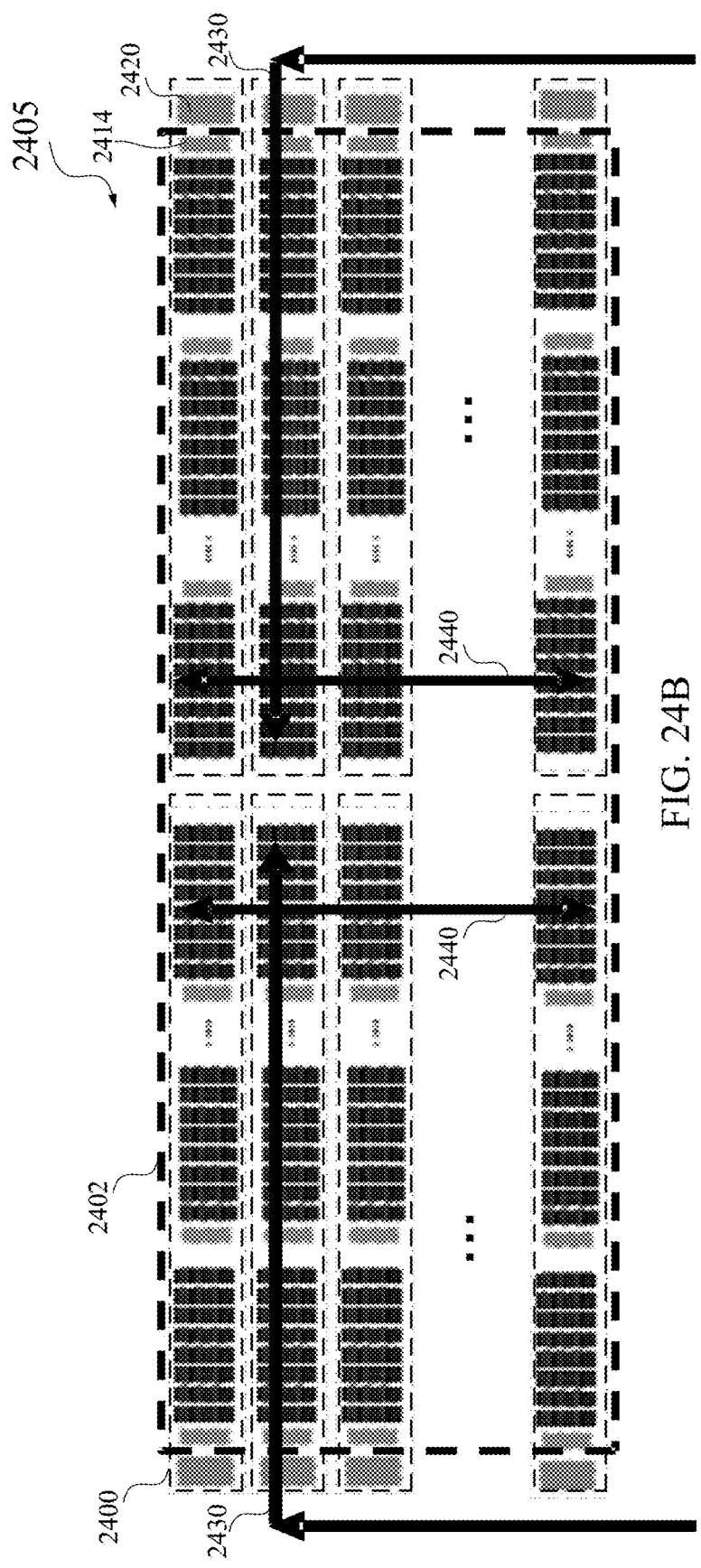
FIG. 24B illustrates a simplified block diagram of an example of a display backplane including a 2-D array of macro-pixels arranged in a hierarchical structure according to certain embodiments.

FIG. 24B illustrates a simplified block diagram of an example of a display backplane 2405 including a 2-D array of macro-pixels arranged in a hierarchical structure according to certain embodiments. In the illustrated example, display backplane 2405 may include a 2-D array of slices 2400. As described above with respect to FIG. 24A, each slice 2400 may include multiple sub-arrays, such as tens of (e.g., about 50 or 60) sub-arrays. Each sub-array may include multiple macro-pixels, such as 8 or more macro-pixels. Each macro-pixels may include multiple pixels, such as 8, 10, 12, 14, 16, 18, or 20 pixels. Each sub-array may include local repeater and/or other periphery circuits. Each slice may also include additional periphery circuits. The multiple hierarchical levels and local periphery circuits within display backplane 2405 may enable the efficient and electrically-robust movement of data in the SRAM and the PWM logic.

In the example shown in FIG. 24B, the sub-arrays, including peripheral logic circuits of the sub-arrays (e.g., local repeaters) that drive signals for sequencing and feeding data to the macro-pixels, may be within a display area 2402 of the display panel. The periphery logic circuits and the repeaters within display area 2402 may help to solve some challenges associated with the unit-pixel array architecture described above. For example, as described above, signals broadcasted over the large (e.g., millimeter scale) pixel array may suffer from large attenuation or time delay due to large wire resistance and capacitance, which may affect the timing and noise margins and cause errors, reliability, or other performance issues. These challenges may be at least partially solved by making space for repeaters within the pixel array. Each slice, each sub-array, and/or each macro-pixel may include some local periphery circuits and/or repeaters to enable the efficient and electrically robust movement of data in the SRAM and PWM logic. The local repeaters and/or other periphery circuits within display area 2402 may, for example, boost the signals on the long bit lines and/or word lines and regulate the waveforms of the signals on the bit lines and/or word lines such that the signals may have high amplitudes and short rise/fall times. As such, the signal level and the timing (e.g., rising/falling edges) of the signals from the periphery circuits may be replicated or recovered at the macro-pixels, thereby improving the timing and noise margins, such as the write time margin.

In addition, the local periphery circuits at various hierarchical levels may include power-saving features to control the pixel array at various granularities, such as at the macro-pixel level, at the sub-array level, or at the slice level. In AR/VR display systems, some displayed images can have a low fill factor, for example, to have fully transparent regions for augmented reality display or to display images only in regions where user's eyes are gazing, without significantly affecting the user experience. In each 12×8-pixels region, over 4,000 bytes of local SRAM access and over 6,000 comparison operations per frame may otherwise be performed, which may consume a large amount of power without affecting the display quality. Therefore, for images having a low fill factor, only a portion of a display panel may need to have a high-quality image, and thus only the PWM signals for that portion of the display panel may be computed. In addition, image data and PWM signals may not be needed for the regions outside of the gazing regions of the user's eyes. Therefore, in some implementations, certain regions of the display panel may be turned off or may be kept at a low illumination intensity, for example, by gating the clock for the regions, thereby reducing the total power consumption of the display panel. In the macro-pixel architecture disclosed herein, clocking gating may be performed at the slice, sub-array, or macro-pixel level, such that pixels outside of regions of interest can be clock-gated for low-power low-fill-factor workloads, thereby reducing the power consumption of the display panel.

The additional slice-level periphery circuits 2420 for each slice may be outside of display area 2402, and may include, for example, counter circuits and a power-law look-up table. Data load and update paths 2430 may be within each slice 2400, from slice-level periphery circuits 2420 outside of display area 2402 to the sub-arrays and macro-pixels in the center region of the display area 2402. Power distribution paths 2440 may be orthogonal to the data load and update paths 2430 and may cross different slices.

Figure 25:
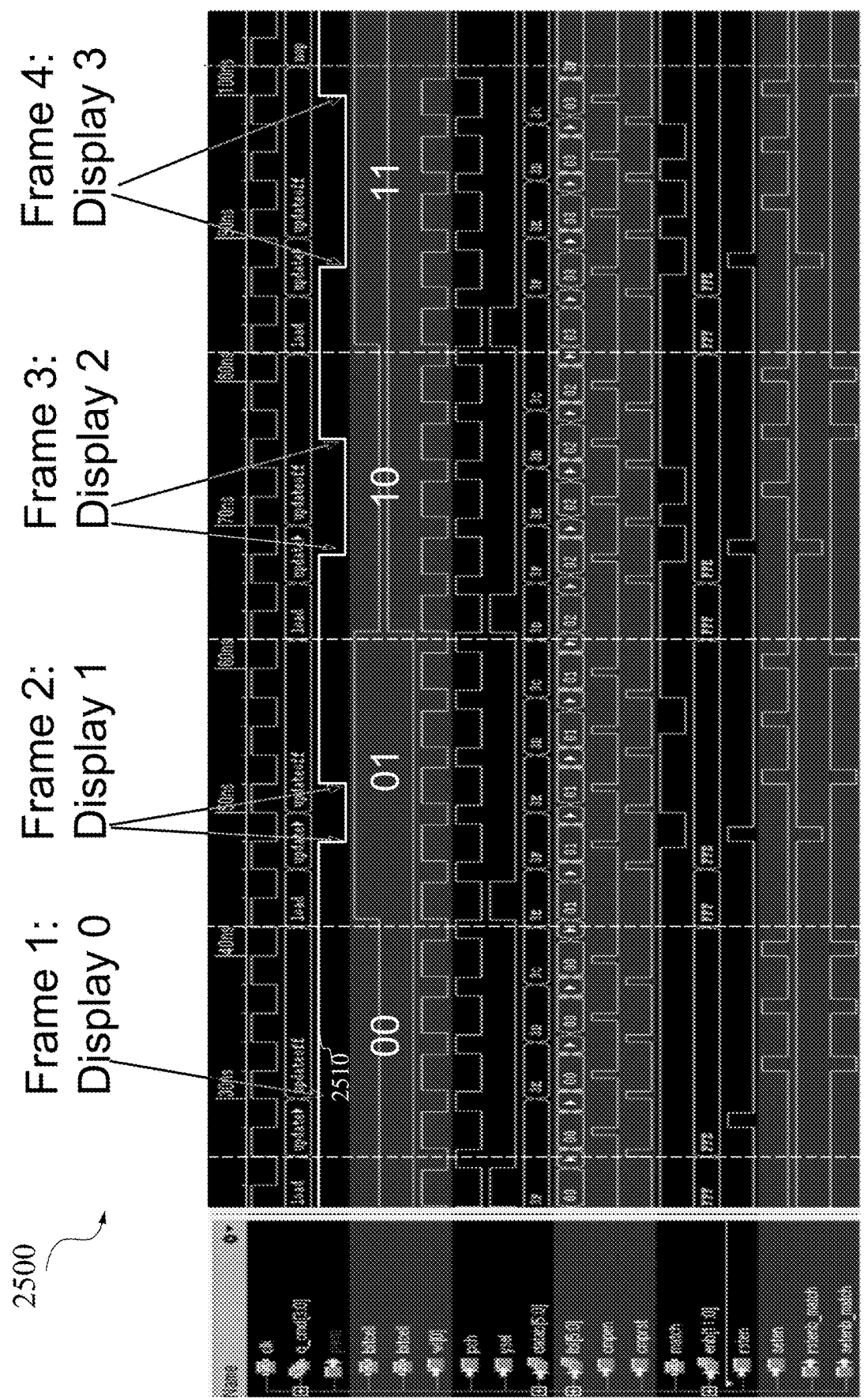
FIG. 25 illustrates an example of the Verilog simulation result of an operation of a macro-pixel in a display panel according to certain embodiments.

FIG. 25 includes a chart 2500 illustrating an example of the Verilog simulation result of an operation of a macro-pixel in a display panel according to certain embodiments. In the simulation, the macro-pixel may be driven by, for example, 32 digital and 3 analog inputs/outputs. These signals may be sequenced to load data into the macro-pixel, and initiate comparison and PWM update operations. Chart 2500 shows the simulated output PWM signal 2510 in four frames for a pixel, where the stored values in the bitcells are 00, 01, 10, and 11, respectively, for frames 1-4.

Figure 26:
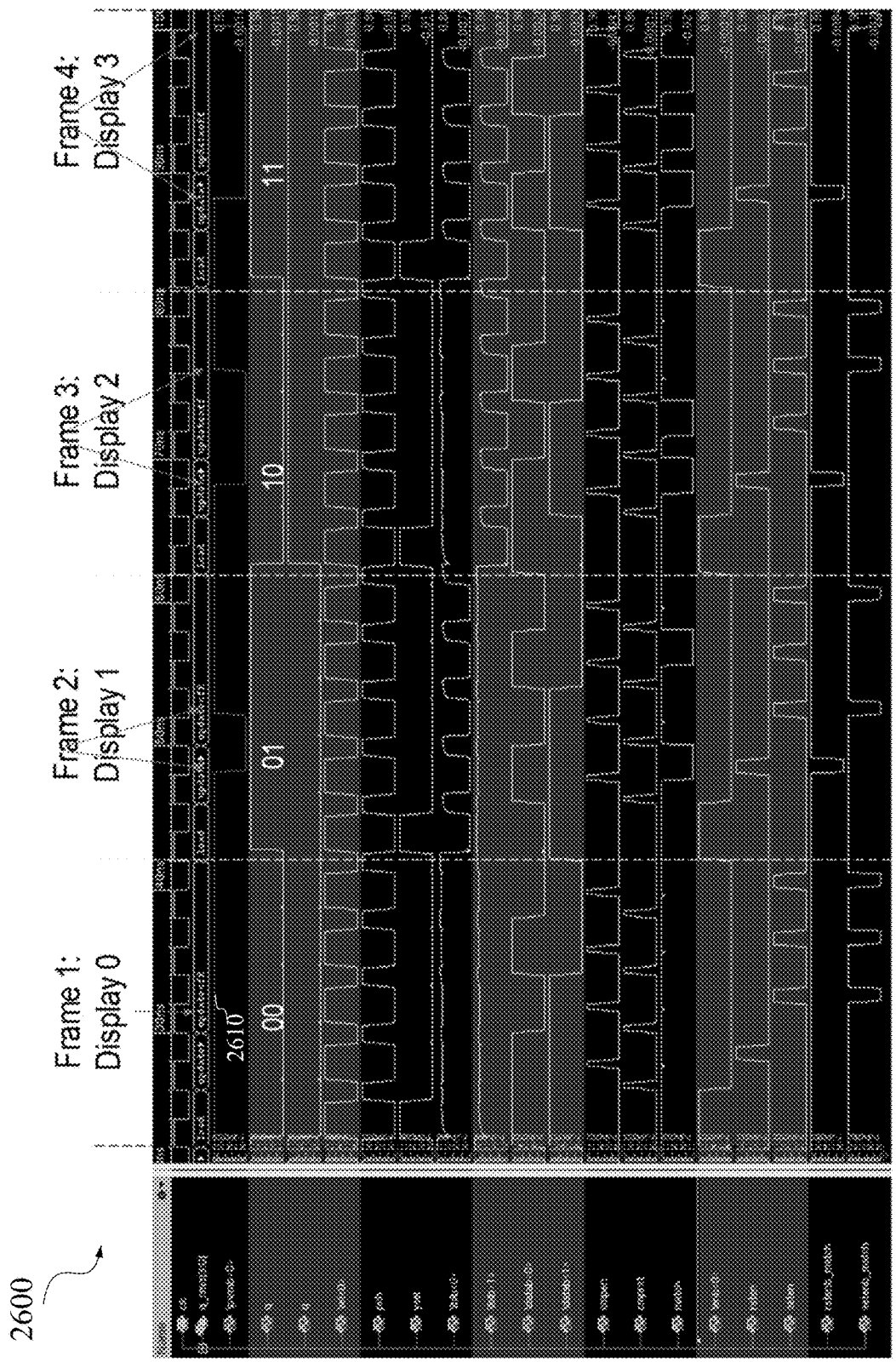
FIG. 26 illustrates an example of the Spice simulation result of an operation of a macro-pixel in a display panel according to certain embodiments.

FIG. 26 includes a chart 2600 illustrating an example of the Spice simulation result of an operation of a macro-pixel in a display panel according to certain embodiments. In the simulation, the macro-pixel may be driven by, for example, 32 digital and 3 analog inputs/outputs. These signals may be sequenced to load data into the macro-pixel, and initiate comparison and PWM update operations. Chart 2600 shows the simulated output PWM signal 2610 in four frames for a pixel, where the stored values in the bitcells are 00, 01, 10, and 11, respectively, for frames 1-4.

Figure 27:
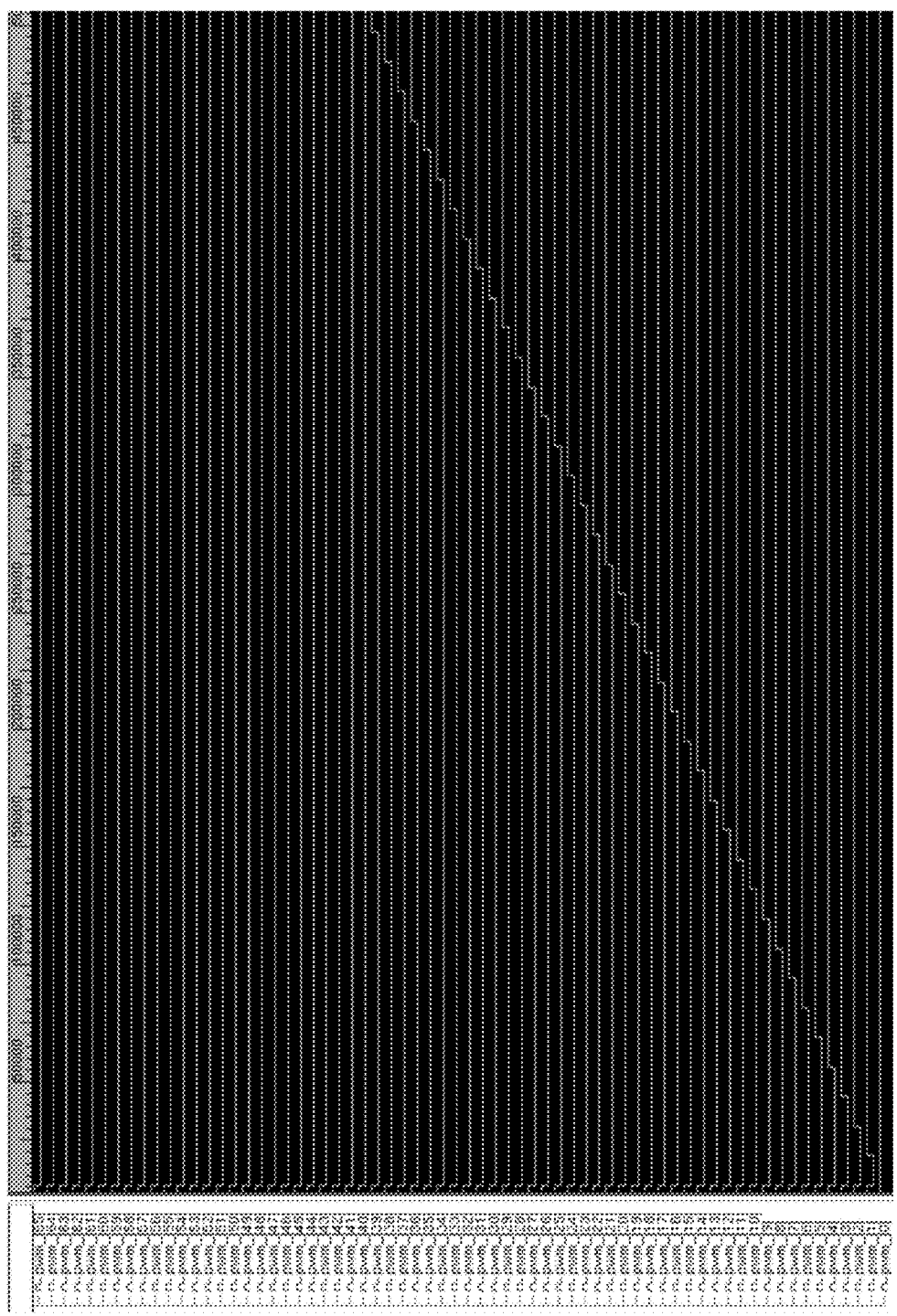
FIG. 27 illustrates simulated output pulse width modulated signals of a macro-pixel for different display values according to certain embodiments.

FIG. 27 includes a chart 2700 illustrating simulated output PWM signals of a macro-pixel for different display values according to certain embodiments. In the illustrated example, the display value (control word) stored in the bitcells may increase from 0 to 127, and the pulse width of the simulated output PWM signal may approximately linearly increase with the increase of the display value.

Figure 28:
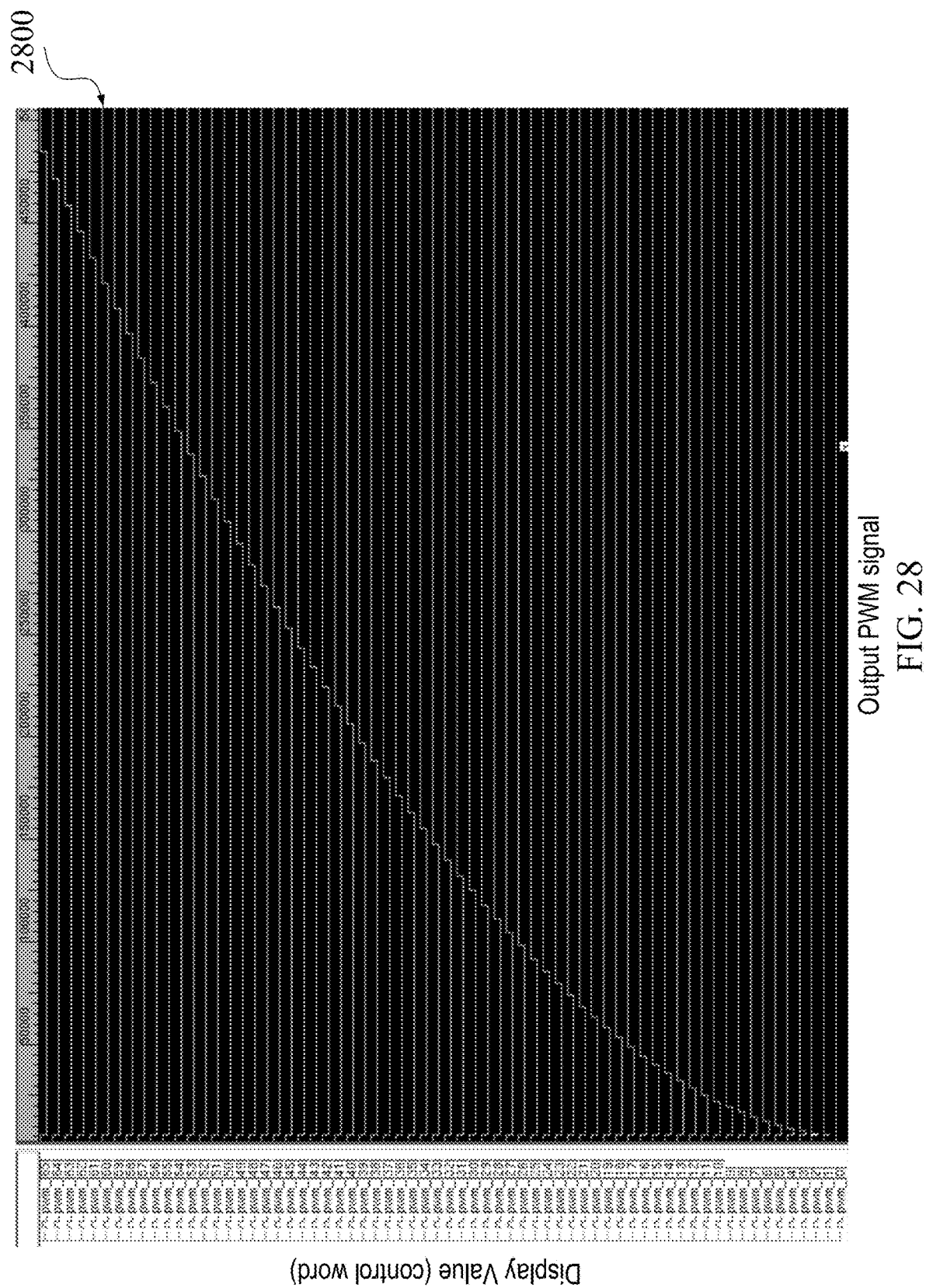
FIG. 28 illustrates simulated output PWM signals of a macro-pixel for different display values with power-law transformation according to certain embodiments.

FIG. 28 includes a chart 2800 illustrating simulated output PWM signals of a macro-pixel for different display values with power-law transformation according to certain embodiments. In the illustrated example, the display value (control word) stored in the bitcells may increase from 0 to 127. The pulse width of the simulated output PWM signal may nonlinearly increase with the increase of the display value according to the power law (with a certain gamma value) described above, such that the luminance of the micro-LED driven by the PWM signal may increase non-linearly with the increase of the display value.

Figure 29:
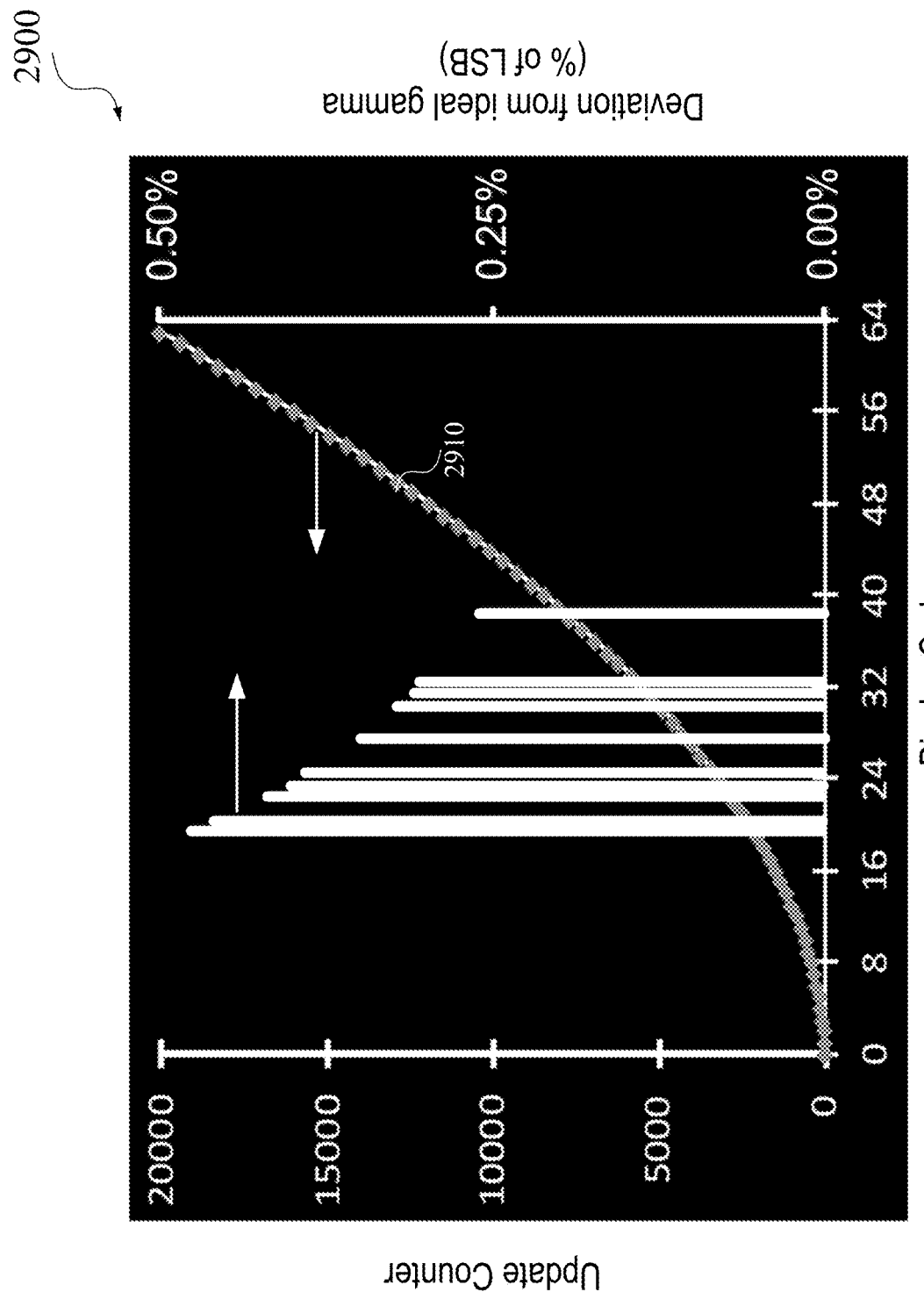
FIG. 29 illustrates an example of the simulation result of a macro-pixel in rolling update mode and with power-law (gamma) updates according to certain embodiments.

FIG. 29 illustrates an example of the simulation result of a macro-pixel in rolling update mode and with power-law (gamma) updates according to certain embodiments. FIG. 29 includes a mapping curve 2910 showing 6-bit display codes and the corresponding ideal discretized update counter values (or clock cycles) (which may include some small discretization or quantization errors) for PWM to achieve a gamma correction in an example of an operating condition. In the illustrated example, the gamma value for the gamma correction may be 1.9, the clock frequency may be about 25 MHz, the horizontal synchronization (HSYNC) period may be about 8 µs, and each row may be updated in about 800 µs (the on-time). For other operating conditions, the corresponding mapping curve 2910 may be different.

As described above, in the macro-pixel architecture disclosed herein, each macro-pixel may drive multiple micro-LEDs simultaneously, but may only update the PWM signal for one pixel at a time due to the sharing of the comparator among the pixels in the macro-pixel through time-division multiplexing. The update time may depend on, for example, the gamma value, clock frequency, and horizontal synchronization (HSYNC) frequency. Due to the time-division multiplexing of the comparator, the update time for each pixel in a macro-pixel may be slightly different, depending on the location of the pixel. As such, there might be some periodical artifacts (e.g., due to the periodical arrangement of the pixels and the macro-pixels) that may be perceivable by human eyes.

The simulation results show that the macro-pixel architecture disclosed herein is also robust in the rolling update mode and is compatible with the power-law transformations (e.g., gamma correction). For many display configurations, the macro-pixel architecture may only cause a deviation from the ideal discretized gamma correction (e.g., due to the update time mismatch between pixels) by less than 0.5% of an LSB for some display codes. FIG. 29 shows the 6-bit display codes and the deviation of the corresponding appropriate update counter values from the update counter values shown by mapping curve 2910 for a gamma value (e.g., 1.9) in the operating condition. In some embodiments, to compensate for the perturbation to the ideal discretized gamma correction caused by the macro-pixel architecture, the actual mapping curve and the corresponding gamma look-up table may be modified slightly (e.g., by less than 0.5% of an LSB) for some or all display codes to enable conflict free updates such that any deviation of the brightness of the micro-LEDs from the desired brightness may not be spatially periodic and may be minimized.

Figure 30:
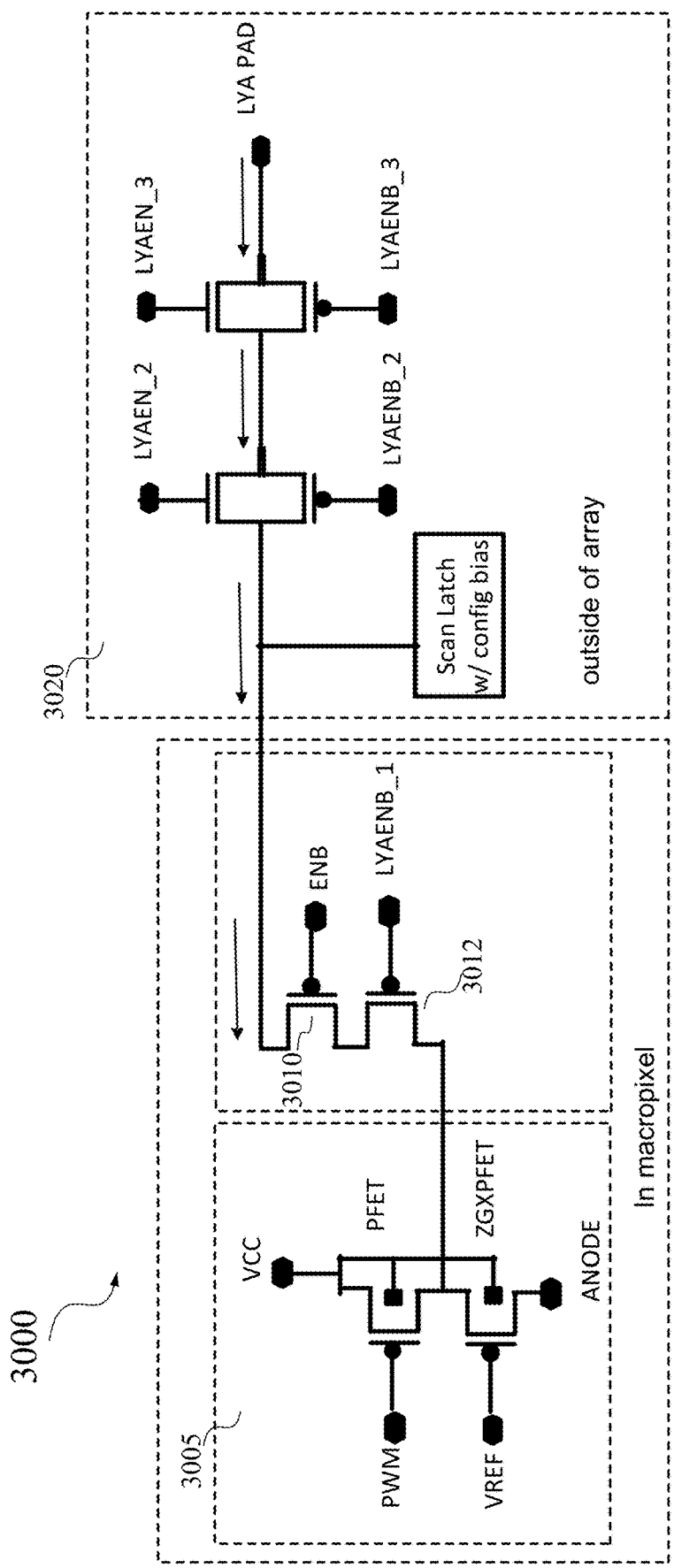
FIG. 30 includes a simplified schematic of an example of a design-for-test (DFT) circuit in a macro-pixel-based display backplane according to certain embodiments.

FIG. 30 includes a simplified schematic of an example of a DFT circuit 3000 in a macro-pixel-based display backplane according to certain embodiments. DFT circuit 3000 may include on-die low yield analysis circuits that may be used to curve-trace individual transistors within the macro-pixel and read out results in an automated fashion. FIG. 30 shows that the macro-cell includes two DFT transistors 3010 and 3012 connected to an analog driver 3005 for each respective pixel in the macro-pixel. FIG. 30 also shows DFT circuits 3020 outside of the array of macro-pixels for controlling DFT transistors 3010 and 3012. DFT circuit 3000 may also include in-pixel DFT circuits connected to other devices (not shown in FIG. 30) in the macro-pixel, such as the bitcells, the comparator, and the PWM latch circuits.

DFT circuit 3000 may be used to measure the current-voltage (I-V) characteristics of internal devices during the design debug and/or process development phases to determine the root causes of failures or errors in the design or the manufacturing processes. DFT circuit 3000 may also be used for manufacturing test during volume production to screen defect devices by electrically controlling and observing internal signals in the logic, SRAM, and analog circuits.

As described above, the drive current of the analog LED drive transistors in the unit pixel structure may vary significantly (e.g., due to random dopant fluctuation) and may result in a brightness difference of about 3 times or higher. Because of the extra space available in the macro-pixel structure, the size of the analog LED drive transistors may be increased to reduce the variation of the analog LED drive transistors (e.g., the driving current) caused by the random dopant fluctuation. For example, the channel length L of LED drive transistor 2064 may be increased to increase the size of LED drive transistor 2064 (to be larger than the minimum specified dimensions by the foundry, such as greater than about 400 nm) such that the variation of the drive current (Ids) of LED drive transistor 2064 caused by random dopant fluctuation may be much smaller due to the averaging of the random dopant fluctuation in a larger area. Therefore, the variation in the brightness of the micro-LEDs may be reduced as well. In addition, increasing the channel length of LED drive transistor 2064 may also favorably bias LED drive transistor 2064 at a more stable bias region for low current levels (e.g., a few hundred nanoamperes, such as about 250 nA). In some embodiments, the variation in the drive currents of the LED drive transistors may be measured, for example, using the DFT circuits described above, and may then be compensated for based on a calibration factor determined using the measured variation.

Figure 31:
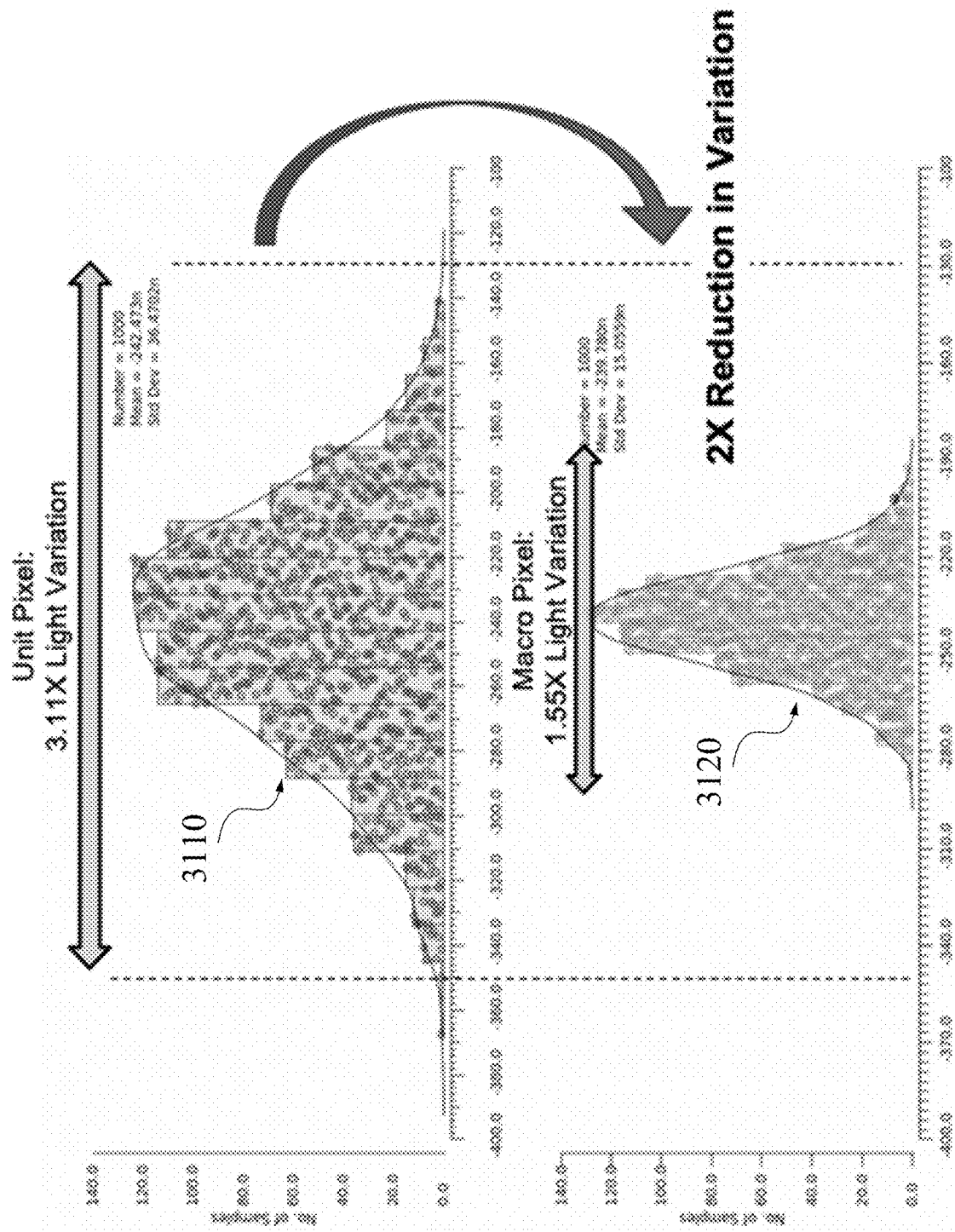
FIG. 31 illustrates the improvement in the drive current uniformity and the LED brightness uniformity by increasing the size of the LED drive transistor according to certain embodiments.

FIG. 31 illustrates the improvement in the drive current uniformity and the LED brightness uniformity by increasing the size of the LED drive transistor according to certain embodiments. In FIG. 31, a chart 3110 shows an example of the distribution of the analog drive current of an LED drive transistor in a unit-pixel-based display panel due to the variation of the LED drive transistor (e.g., caused by random dopant fluctuation). Chart 3110 may be the same as chart 1800 described above. As illustrated, the target drive current may be about 240 nA. However, the drive current may vary with a standard deviation $\delta$ of about 36 nA. Based on the expected typical light outputs for drive currents within $\pm 3\delta$ of the mean drive current according to the micro-LED output characteristics (e.g., a light-current-voltage (L-I-V) curve), the drive current variation shown in chart 3110 may result in a brightness difference of about 3.11 times.

A chart 3120 in FIG. 31 shows an example of the distribution of the analog drive current of an LED drive transistor (e.g., LED drive transistor 2064) with an increased channel length in a macro-pixel-based display panel according to certain embodiments. Chart 3120 shows that, with the increased size (e.g., channel length), the distribution of the analog drive current of the LED drive transistor may have a mean value about 240 nA and a standard deviation $\delta$ less than about 20 nA, such as about 15 nA. Based on the expected typical light outputs for drive currents within $\pm 3\delta$ of the mean drive current according to the micro-LED output characteristics (e.g., the L-I-V curve), the drive current variation shown in chart 3120 may result in a brightness difference of about 1.55 times, which may be a half of the variation shown in chart 3110. Thus, using larger LED drive transistors may significantly improve the uniformity of the drive currents and thus the uniformity of the brightness of the micro-LEDs.

Figure 32:
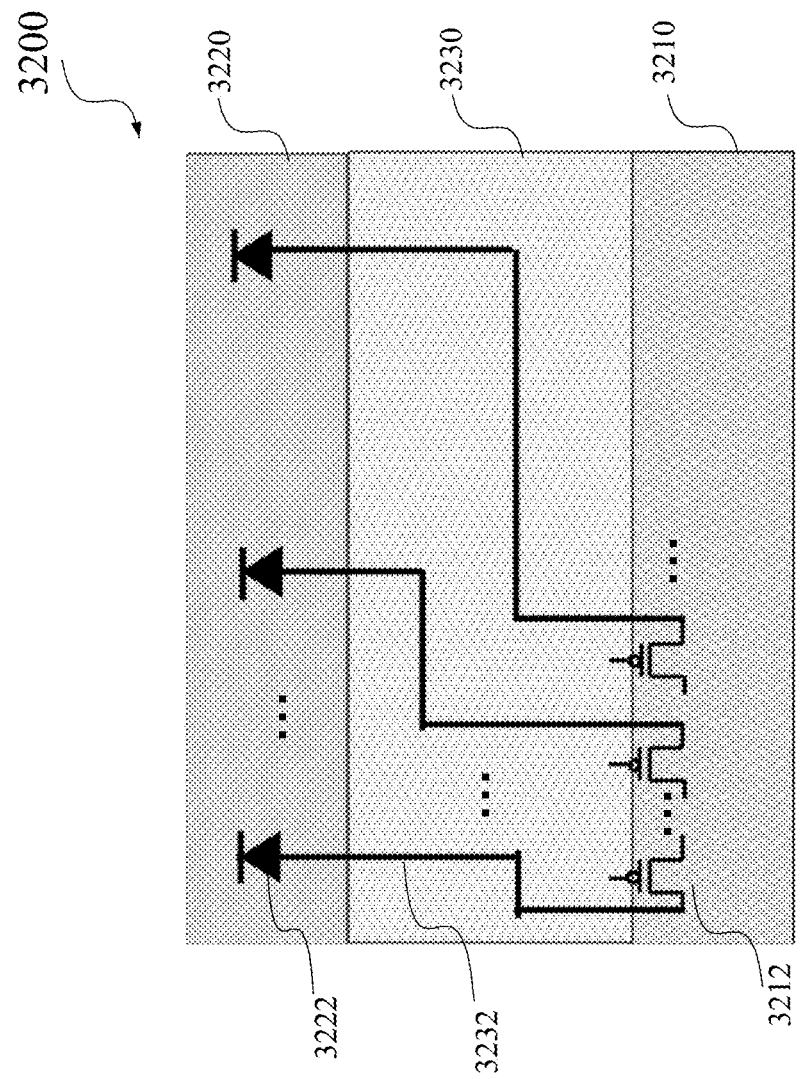
FIG. 32 illustrates a simplified cross-sectional view of a device including a display backplane die bonded to a micro-LED die through an interconnect layer according to certain embodiments.

FIG. 32 illustrates a simplified cross-sectional view of a device including a display backplane die 3210 bonded to a micro-LED die 3220 through an interconnect layer 3230 according to certain embodiments. Display backplane die 3210 may include an embodiment of display backplane 2405 described above. FIG. 32 shows thick gate-oxide LED drive transistors 3212 (e.g., LED drive transistors 2064) of a macro-pixel. Thick gate-oxide LED drive transistors 3212 of the macro-pixel are arranged in a same region of the macro-pixel as described above with respect to, for example, FIGS. 22 and 23B, to reduce the transition regions between the analog circuits and the digital logic or the SRAM cells. Similarly, other circuits (not shown in FIG. 32) of the macro-pixel may be clustered based on the types of the circuits as described above. Micro-LED die 3320 may include a two-dimensional array of micro-LEDs 3222 that are uniformly spaced with a pitch of, for example, 2 μm or 1.8 μm. The uniformly spaced micro-LEDs 3222 and the corresponding thick gate-oxide LED drive transistors 3212 may be connected together by interconnect layer 3230, which may include re-distribution routing interconnects 3232. Re-distribution routing interconnects 3232 may include, for example, metal traces in one or more metal layers and vias between the one or more metal layers.

The macro-pixel architectures and the display backplanes based on the macro-pixel architectures described herein may allow 6 or more bitcells (e.g., 6, 7, 8 or 9 bitcells) to be used for each 2-μm or 1.8-μm pixel for better display quality with lower temporal dithering power overhead; reduce the variation of micro-LED drive current for more uniform brightness; improve design margins for SRAM and other circuits and reduce digital VDD (e.g., by 300 mV or more); include test and debug features for the pixels; allow clock gating at the slice level, sub-array level, or macro-pixel lever to reduce power for displaying low fill-factor AR images; and eliminate stringent process design rules to improve foundry portability.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 33:
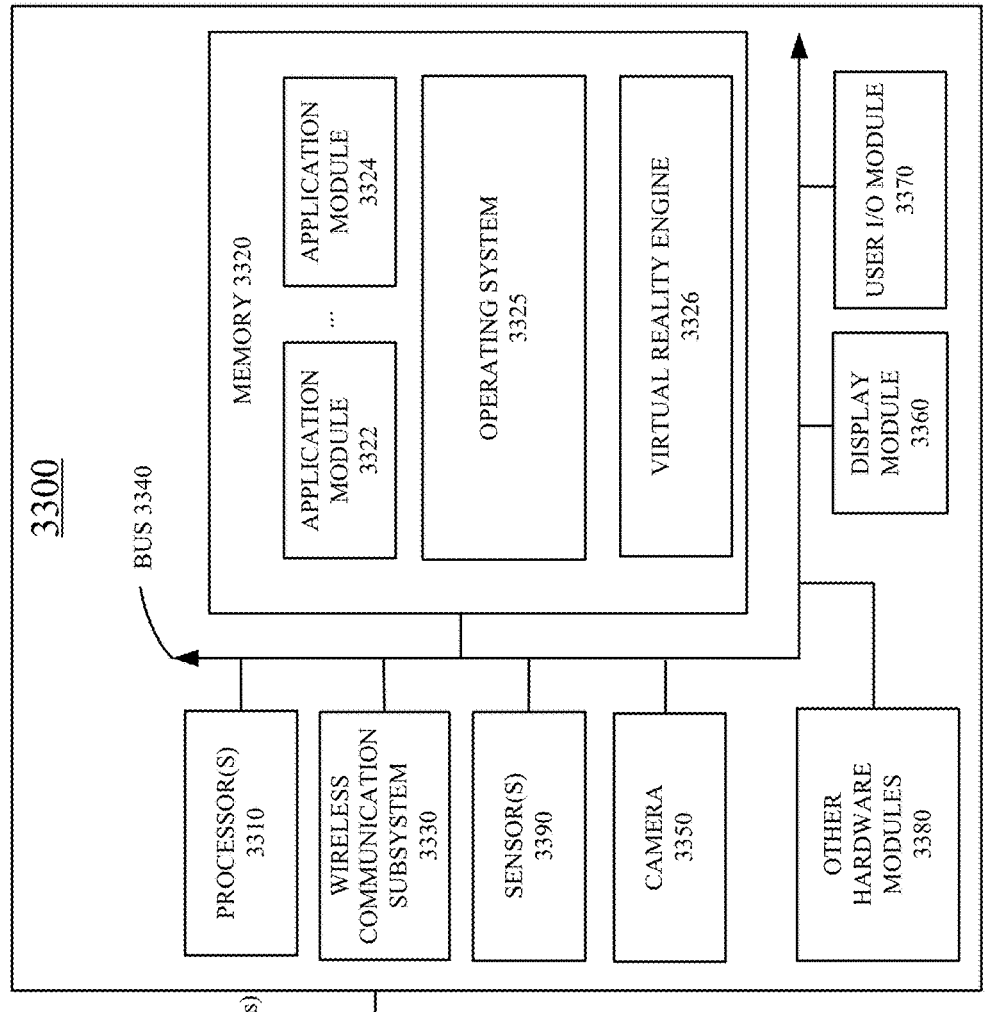
FIG. 33 is a simplified block diagram of an electronic system of an example of a near-eye display according to certain embodiments.

FIG. 33 is a simplified block diagram of an example electronic system 3300 of an example near-eye display (e.g., HMD device) for implementing some of the examples disclosed herein. Electronic system 3300 may be used as the electronic system of an HMD device or other near-eye displays described above. In this example, electronic system 3300 may include one or more processor(s) 3310 and a memory 3320. Processor(s) 3310 may be configured to execute instructions for performing operations at a number of components, and can be, for example, a general-purpose processor or microprocessor suitable for implementation within a portable electronic device. Processor(s) 3310 may be communicatively coupled with a plurality of components within electronic system 3300. To realize this communicative coupling, processor(s) 3310 may communicate with the other illustrated components across a bus 3340. Bus 3340 may be any subsystem adapted to transfer data within electronic system 3300. Bus 3340 may include a plurality of computer buses and additional circuitry to transfer data.

Memory 3320 may be coupled to processor(s) 3310. In some embodiments, memory 3320 may offer both short-term and long-term storage and may be divided into several units. Memory 3320 may be volatile, such as static random access memory (SRAM) and/or dynamic random access memory (DRAM) and/or non-volatile, such as read-only memory (ROM), flash memory, and the like. Furthermore, memory 3320 may include removable storage devices, such as secure digital (SD) cards. Memory 3320 may provide storage of computer-readable instructions, data structures, program modules, and other data for electronic system 3300. In some embodiments, memory 3320 may be distributed into different hardware modules. A set of instructions and/or code might be stored on memory 3320. The instructions might take the form of executable code that may be executable by electronic system 3300, and/or might take the form of source and/or installable code, which, upon compilation and/or installation on electronic system 3300 (e.g., using any of a variety of generally available compilers, installation programs, compression/decompression utilities, etc.), may take the form of executable code.

In some embodiments, memory 3320 may store a plurality of application modules 3322 through 3324, which may include any number of applications. Examples of applications may include gaming applications, conferencing applications, video playback applications, or other suitable applications. The applications may include a depth sensing function or eye tracking function. Application modules 3322-3324 may include particular instructions to be executed by processor(s) 3310. In some embodiments, certain applications or parts of application modules 3322-3324 may be executable by other hardware modules 3380. In certain embodiments, memory 3320 may additionally include secure memory, which may include additional security controls to prevent copying or other unauthorized access to secure information.

In some embodiments, memory 3320 may include an operating system 3325 loaded therein. Operating system 3325 may be operable to initiate the execution of the instructions provided by application modules 3322-3324 and/or manage other hardware modules 3380 as well as interfaces with a wireless communication subsystem 3330 which may include one or more wireless transceivers. Operating system 3325 may be adapted to perform other operations across the components of electronic system 3300 including threading, resource management, data storage control and other similar functionality.

Wireless communication subsystem 3330 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 3300 may include one or more antennas 3334 for wireless communication as part of wireless communication subsystem 3330 or as a separate component coupled to any portion of the system. Depending on desired functionality, wireless communication subsystem 3330 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 3330 may permit data to be exchanged with a network, other computer systems, and/or any other devices described herein. Wireless communication subsystem 3330 may include a means for transmitting or receiving data, such as identifiers of HMD devices, position data, a geographic map, a heat map, photos, or videos, using antenna(s) 3334 and wireless link(s) 3332. Wireless communication subsystem 3330, processor(s) 3310, and memory 3320 may together comprise at least a part of one or more of a means for performing some functions disclosed herein.

Embodiments of electronic system 3300 may also include one or more sensors 3390. Sensor(s) 3390 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 3390 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 3300 may include a display module 3360. Display module 3360 may be a near-eye display, and may graphically present information, such as images, videos, and various instructions, from electronic system 3300 to a user. Such information may be derived from one or more application modules 3322-3324, virtual reality engine 3326, one or more other hardware modules 3380, a combination thereof, or any other suitable means for resolving graphical content for the user (e.g., by operating system 3325). Display module 3360 may use LCD technology, LED technology (including, for example, OLED, ILED, µ-LED, AMO-LED, TOLED, etc.), light emitting polymer display (LPD) technology, or some other display technology.

Electronic system 3300 may include a user input/output module 3370. User input/output module 3370 may allow a user to send action requests to electronic system 3300. An action request may be a request to perform a particular action. For example, an action request may be to start or end an application or to perform a particular action within the application. User input/output module 3370 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 3300. In some embodiments, user input/output module 3370 may provide haptic feedback to the user in accordance with instructions received from electronic system 3300. For example, the haptic feedback may be provided when an action request is received or has been performed.

Electronic system 3300 may include a camera 3350 that may be used to take photos or videos of a user, for example, for tracking the user's eye position. Camera 3350 may also be used to take photos or videos of the environment, for example, for VR, AR, or MR applications. Camera 3350 may include, for example, a complementary metal-oxide-semiconductor (CMOS) image sensor with a few millions or tens of millions of pixels. In some implementations, camera 3350 may include two or more cameras that may be used to capture 3-D images.

In some embodiments, electronic system 3300 may include a plurality of other hardware modules 3380. Each of other hardware modules 3380 may be a physical module within electronic system 3300. While each of other hardware modules 3380 may be permanently configured as a structure, some of other hardware modules 3380 may be temporarily configured to perform specific functions or temporarily activated. Examples of other hardware modules 3380 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 3380 may be implemented in software.

In some embodiments, memory 3320 of electronic system 3300 may also store a virtual reality engine 3326. Virtual reality engine 3326 may execute applications within electronic system 3300 and receive position information, acceleration information, velocity information, predicted future positions, or any combination thereof of the HMD device from the various sensors. In some embodiments, the information received by virtual reality engine 3326 may be used for producing a signal (e.g., display instructions) to display module 3360. For example, if the received information indicates that the user has looked to the left, virtual reality engine 3326 may generate content for the HMD device that mirrors the user's movement in a virtual environment. Additionally, virtual reality engine 3326 may perform an action within an application in response to an action request received from user input/output module 3370 and provide feedback to the user. The provided feedback may be visual, audible, or haptic feedback. In some implementations, processor(s) 3310 may include one or more GPUs that may execute virtual reality engine 3326.

In various implementations, the above-described hardware and modules may be implemented on a single device or on multiple devices that can communicate with one another using wired or wireless connections. For example, in some implementations, some components or modules, such as GPUs, virtual reality engine 3326, and applications (e.g., tracking application), may be implemented on a console separate from the head-mounted display device. In some implementations, one console may be connected to or support more than one HMD.

In alternative configurations, different and/or additional components may be included in electronic system 3300. Similarly, functionality of one or more of the components can be distributed among the components in a manner different from the manner described above. For example, in some embodiments, electronic system 3300 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A display device comprising:
   a first die including a two-dimensional (2-D) array of micro-light emitting diodes (micro-LEDs) in a display area; and
   a second die vertically bonded with the first die, the second die including a micro-LED driver backplane that includes a 2-D array of sub-arrays, wherein each sub-array of the 2-D array of sub-arrays comprises:
   drive circuits configured to generate pulse-width modulated (PWM) drive signals to drive a set of micro-LEDs of the 2-D array of micro-LEDs; and
   a local periphery circuit for controlling the drive circuits of the sub-array, the local periphery circuit within the display area and including at least one of a buffer, a repeater, a clock gating circuit for gating an input clock signal to the sub-array, or a sub-array decoder for selecting the sub-array,
   wherein the micro-LED driver backplane includes a periphery circuit outside of the 2-D array of sub-arrays, and
   wherein the repeater is configured to replicate a control signal generated by the periphery circuit and for controlling the drive circuits of the sub-array.

2. The display device of claim 1, wherein each sub-array of the 2-D array of sub-arrays comprises an array of macro-pixels, each macro-pixel of the array of macro-pixels comprising a contiguous 2-D array of bitcells storing display data bits for driving a subset of micro-LEDs of the set of micro-LEDs.

3. The display device of claim 2, wherein:
   each bitcell of the contiguous 2-D array of bitcells includes a six-transistor (6T) static random access memory (SRAM) cell that includes a world line, two bit lines, and two internal state storage nodes for storing a respective display data bit of the display data bits; and
   each bitcell of the contiguous 2-D array of bitcells is configured to read the respective display data bit of the display data bits from the bitcell through the two bit lines.

4. The display device of claim 2, wherein each macro-pixel of the array of macro-pixels further comprises:
   a respective current driver for each micro-LED in the subset of micro-LEDs, the respective current driver configured to provide a drive current to the micro-LED;
   a comparator for the subset of micro-LEDs, the comparator configured to compare, for each micro-LED in the subset of micro-LEDs, the display data bits for driving the micro-LED with a counter value; and
   a respective PWM latch for each micro-LED in the subset of micro-LEDs, the respective PWM latch configured to generate, based on an output for the micro-LED generated by the comparator, a PWM control signal for modulating the drive current of the respective current driver for the micro-LED to generate a respective PWM drive signal of the PWM drive signals.

5. The display device of claim 4, wherein the respective current drivers for two or more micro-LEDs in the subset of micro-LEDs are arranged contiguously in a region of the macro-pixel, the region separated from regions of the macro-pixel for other circuits by a transition region.

6. The display device of claim 5, wherein the respective current drivers for the subset of micro-LEDs are connected to the subset of micro-LEDs in the 2-D array of micro-LEDs by an interconnect layer that includes re-distribution routing interconnects.

7. The display device of claim 4, wherein the respective PWM latches for two or more micro-LEDs in the subset of micro-LEDs are arranged contiguously in a region of the macro-pixel.

8. The display device of claim 4, wherein the comparator is configured to:
read and compare the display data bits for driving a first micro-LED of the subset of micro-LEDs in a first time window; and
read and compare the display data bits for driving a second micro-LED of the subset of micro-LEDs in a second time window.

9. The display device of claim 2, wherein each macro-pixel of the array of macro-pixels further comprises a respective design-for-test (DFT) circuit for each micro-LED in the subset of micro-LEDs.

10. The display device of claim 2, wherein each macro-pixel of the array of macro-pixels further comprises a respective input/output circuit configured to read display data bits stored in each row or column of the contiguous 2-D array of bitcells.

11. The display device of claim 2, wherein the contiguous 2-D array of bitcells includes at least 6 bitcells for each micro-LED of the subset of micro-LEDs.

12. The display device of claim 2, wherein the subset of micro-LEDs includes 8 or more micro-LEDs.

13. The display device of claim 1, wherein a plurality of sub-arrays in the 2-D array of sub-arrays is included in a slice of the micro-LED driver backplane, the slice comprising a slice periphery circuit for controlling the plurality of sub-arrays.

14. The display device of claim 13, wherein the slice periphery circuit comprises at least one of a counter or a look-up table for gamma correction.

15. The display device of claim 1, wherein the periphery circuit includes at least one of a counter or a look-up table for gamma correction, the look-up table storing display data codes and corresponding counter values.

16. The display device of claim 15, wherein the corresponding counter value for at least one display data code in the look-up table is different from an ideal counter value determined for the at least one display data code based on a gamma value.

17. The display device of claim 1, wherein the periphery circuit is configurable to send a control signal to the clock gating circuit for gating the input clock signal to the sub-array to disable the drive circuits configured to generate the PWM drive signals.

18. The display device of claim 1, wherein a pitch of the 2-D array of micro-LEDs is equal to or less than 2 μm.

19. The display device of claim 1, wherein the local periphery circuit includes the clock gating circuit for gating the input clock signal to the sub-array or the sub-array decoder for selecting the sub-array.

20. A micro-light emitting diode (micro-LED) display backplane comprising a plurality of macro-pixels, each macro-pixel of the plurality of macro-pixels comprising:
a contiguous two-dimensional (2-D) array of bitcells storing display data bits for driving a set of micro-LEDs of a 2-D array of micro-LEDs; and
drive circuits configured to generate, based on the display data bits stored in the contiguous 2-D array of bitcells, pulse-width modulated (PWM) drive signals for driving the set of micro-LEDs of the 2-D array of micro-LEDs,
wherein the drive circuits include a comparator for the set of micro-LEDs, the comparator configured to compare counter values with display data for different micro-LEDs of the set of micro-LEDs in different time windows.

21. The micro-LED display backplane of claim 20, wherein,
each bitcell of the contiguous 2-D array of bitcells includes a six-transistor (6T) static random access memory (SRAM) cell that includes a world line, two bit lines, and two internal state storage nodes for storing a respective display data bit of the display data bits; and
each bitcell of the contiguous 2-D array of bitcells is configured to read the respective display data bit of the display data bits from the bitcell through the two bit lines.

22. The micro-LED display backplane of claim 20, wherein:
each macro-pixel of the plurality of macro-pixels further comprises a respective current driver for each micro-LED in the set of micro-LEDs, the respective current driver configured to provide a drive current to the micro-LED; and
the drive circuits of each macro-pixel of the plurality of macro-pixels include:
the comparator configured to compare, for each micro-LED in the set of micro-LEDs, the display data bits for driving the micro-LED with a counter value; and
a respective PWM latch for each micro-LED in the set of micro-LEDs, the respective PWM latch configured to generate, based on an output for the micro-LED generated by the comparator, a PWM control signal for modulating the drive current of the respective current driver for the micro-LED to generate a respective PWM drive signal of the PWM drive signals.

23. The micro-LED display backplane of claim 22, wherein the respective current drivers for two or more micro-LEDs in the set of micro-LEDs are arranged contiguously in a region of the macro-pixel separated from regions of the macro-pixel for other circuits by a transition region.

24. The micro-LED display backplane of claim 22, wherein the respective current driver for each micro-LED in the set of micro-LEDs includes a thick gate-oxide transistor with a channel length greater than 400 nm.

25. The micro-LED display backplane of claim 22, wherein the drive currents of the respective current drivers of the plurality of macro-pixels are characterized by a standard deviation less than 20 nA.

26. The micro-LED display backplane of claim 22, wherein the respective PWM latches for two or more micro-LEDs in the set of micro-LEDs are arranged contiguously in a region of the macro-pixel.

27. The micro-LED display backplane of claim 22, wherein the comparator is configured to:
read and compare the display data bits for driving a first micro-LED of the set of micro-LEDs in a first time window; and
read and compare the display data bits for driving a second micro-LED of the set of micro-LEDs in a second time window.

28. The micro-LED display backplane of claim 20, wherein each macro-pixel of the plurality of macro-pixels further comprises a respective design-for-test (DFT) circuit for each micro-LED in the set of micro-LEDs.

29. The micro-LED display backplane of claim 20, wherein each macro-pixel of the plurality of macro-pixels further comprises a respective input/output circuit configured to read display data bits stored in each row or column of the contiguous 2-D array of bitcells.

30. The micro-LED display backplane of claim 20, wherein the contiguous 2-D array of bitcells includes at least 6 bitcells for each micro-LED of the set of micro-LEDs.

31. The micro-LED display backplane of claim 20, wherein the set of micro-LEDs includes 8 or more micro-LEDs.

32. The micro-LED display backplane of claim 20, wherein a pitch of the set of micro-LEDs is equal to or less than 2 µm.

33. The micro-LED display backplane of claim 20, wherein the plurality of macro-pixels is grouped into a plurality of sub-arrays, each sub-array of the plurality of sub-arrays including a set of macro-pixels and a local periphery circuit next to the set of macro-pixels.

34. The micro-LED display backplane of claim 33, wherein the local periphery circuit comprises at least one of a buffer, a repeater, a clock gating circuit for gating an input clock signal to the sub-array, or a sub-array decoder for selecting the sub-array.

35. The micro-LED display backplane of claim 34, wherein the repeater is configured to replicate a control signal for controlling the drive circuits of the set of macro-pixels in the sub-array.

36. The micro-LED display backplane of claim 33, wherein the plurality of sub-arrays is grouped into a plurality of slices, each slice of the plurality of slices including a set of sub-arrays and a slice periphery circuit next to the set of sub-arrays.

37. The micro-LED display backplane of claim 36, wherein the slice periphery circuit includes at least one of a counter or a look-up table for gamma correction, the look-up table storing display data codes and corresponding counter values.

38. The micro-LED display backplane of claim 37, wherein the corresponding counter value for at least one display data code in the look-up table is different from an ideal counter value determined for the at least one display data code based on a gamma value.

39. The micro-LED display backplane of claim 36, wherein the slice periphery circuit includes a calibration table for calibrating the drive circuits of the macro-pixels in the slice.

* * * * *